(12) United States Patent
Matsuno et al.

(10) Patent No.: US 11,387,142 B1
(45) Date of Patent: Jul. 12, 2022

(54) SEMICONDUCTOR DEVICE CONTAINING BIT LINES SEPARATED BY AIR GAPS AND METHODS FOR FORMING THE SAME

(71) Applicant: SANDISK TECHNOLOGIES LLC, Addison, TX (US)

(72) Inventors: Koichi Matsuno, Fremont, CA (US); Masaaki Higashitani, Cupertino, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/208,019

(22) Filed: Mar. 22, 2021

(51) Int. Cl.
*H01L 21/768* (2006.01)
*H01L 23/522* (2006.01)
*H01L 23/532* (2006.01)
*H01L 27/11556* (2017.01)
*H01L 27/11582* (2017.01)
(Continued)

(52) U.S. Cl.
CPC .... *H01L 21/7682* (2013.01); *H01L 21/76802* (2013.01); *H01L 21/76877* (2013.01); *H01L 23/5226* (2013.01); *H01L 23/5329* (2013.01); *H01L 27/11529* (2013.01); *H01L 27/11556* (2013.01); *H01L 27/11573* (2013.01); *H01L 27/11582* (2013.01)

(58) Field of Classification Search
CPC .......... H01L 21/7682; H01L 21/76802; H01L 21/76877; H01L 23/5226; H01L 23/5329; H01L 27/11529; H01L 27/11556; H01L 27/11573; H01L 27/11582
See application file for complete search history.

(56) References Cited

U.S. PATENT DOCUMENTS

| 9,515,085 B2 | 12/2016 | Rabkin et al. |
| 10,115,459 B1 | 10/2018 | Yamada et al. |
| 10,192,784 B1 | 1/2019 | Cui et al. |

(Continued)

FOREIGN PATENT DOCUMENTS

| KR | 10-2016-0004069 A | 1/2016 |
| WO | WO 2011-160001 A1 | 12/2011 |

OTHER PUBLICATIONS

Notification of Transmittal of the International Search Report and the Written Opinion of the International Searching Authority for International Patent Application No. PCT/US2021/035016, dated Dec. 16, 2021, 9 pages.

(Continued)

*Primary Examiner* — Karen Kusumakar
(74) *Attorney, Agent, or Firm* — The Marbury Law Group PLLC

(57) ABSTRACT

A semiconductor structure includes a semiconductor device, bit lines electrically connected to the semiconductor device, air gaps located between the bit lines, a capping-level material layer, a via-level dielectric material layer located between the bit lines and the capping-level material layer, and conductive via structures extending through the via-level dielectric material layer and contacting a top surface of a respective one of the bit lines. The capping-level material layer contains cavity-containing openings exposing the air gaps. The capping-level material layer contains protruding portions that extend into peripheral regions of the cavity-containing openings.

20 Claims, 48 Drawing Sheets

(51) Int. Cl.
   *H01L 27/11573*   (2017.01)
   *H01L 27/11529*   (2017.01)

(56) References Cited

U.S. PATENT DOCUMENTS

| | | |
|---|---|---|
| 10,381,366 B1 | 8/2019 | Takahashi et al. |
| 2016/0093635 A1* | 3/2016 | Rabkin ............ H01L 21/76802 |
| | | 257/314 |
| 2016/0204059 A1 | 7/2016 | Fukuo et al. |
| 2019/0067294 A1 | 2/2019 | Lee et al. |
| 2019/0259772 A1 | 8/2019 | Takahashi et al. |

OTHER PUBLICATIONS

Endoh, T. et al., "Novel Ultra High Density Memory with a Stacked-Surrounding Gate Transistor (S-SGT) Structured Cell," IEDM Proc., (2001), 33-36.
U.S. Appl. No. 16/722,824, filed Dec. 20, 2019, SanDisk Technologies, LLC.
U.S. Appl. No. 16/851,908, filed Apr. 17, 2020, SanDisk Technologies, LLC.
U.S. Appl. No. 16/984,700, filed Aug. 4, 2020, SanDiSk Technologies, LLC.

* cited by examiner

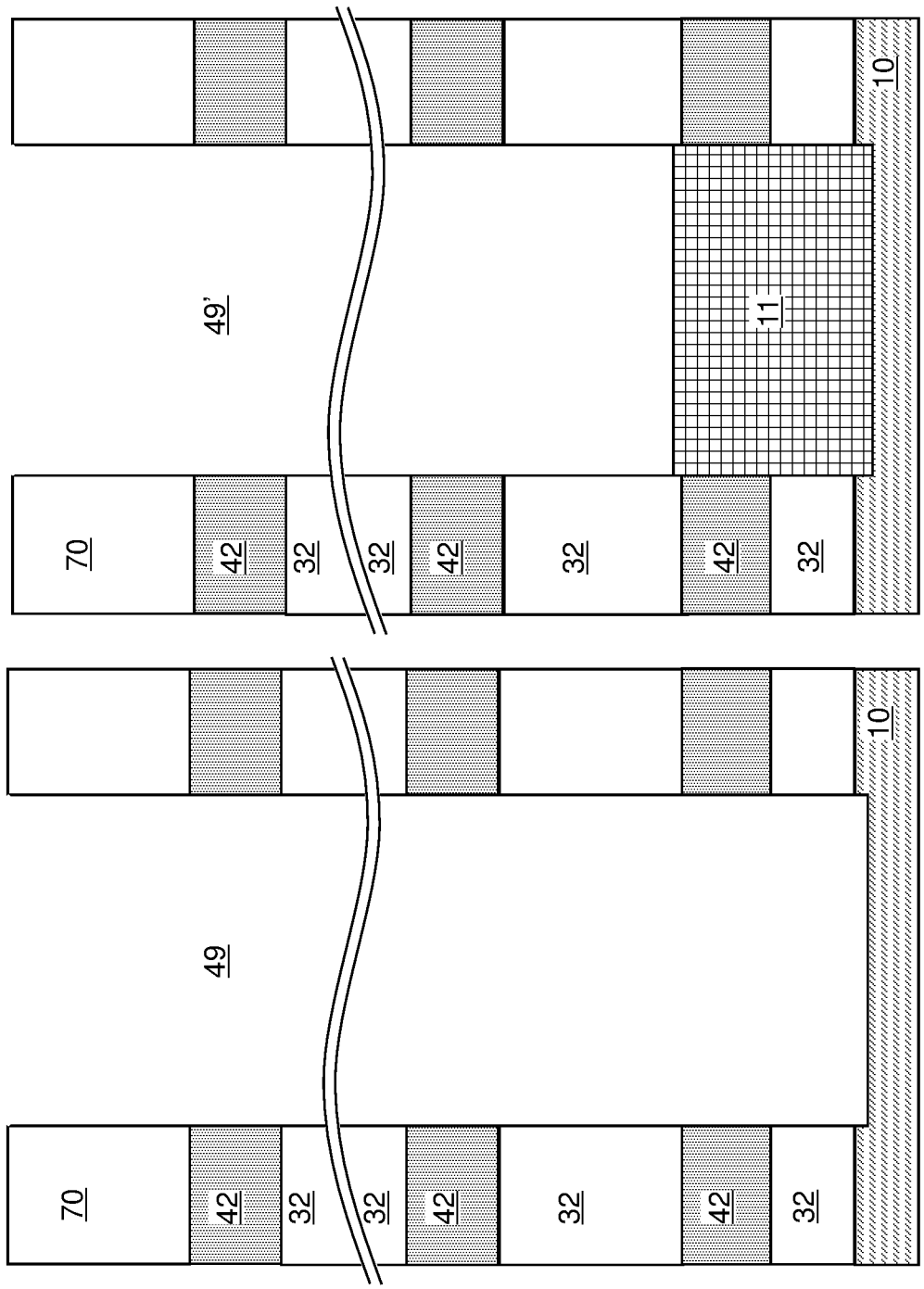

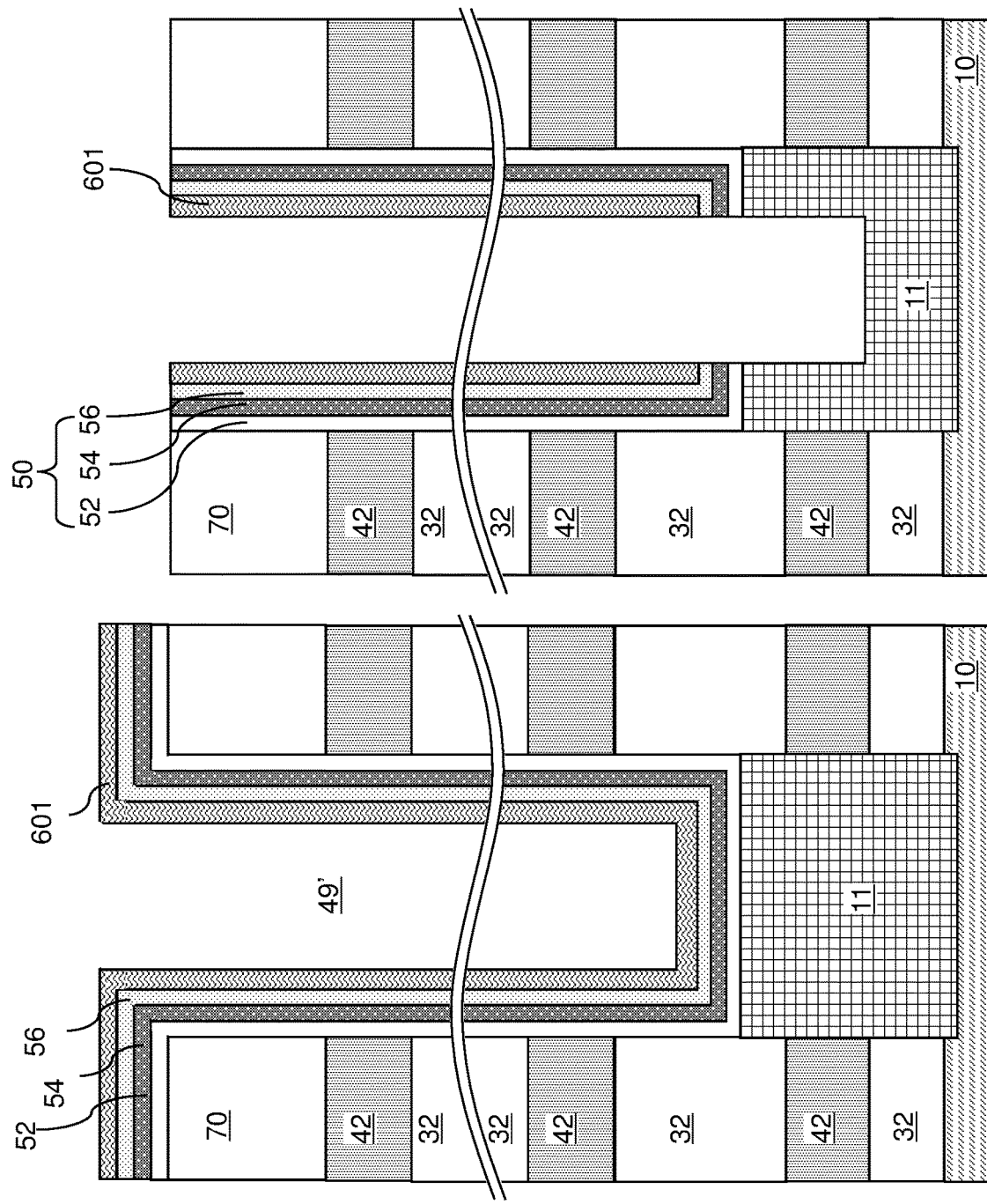

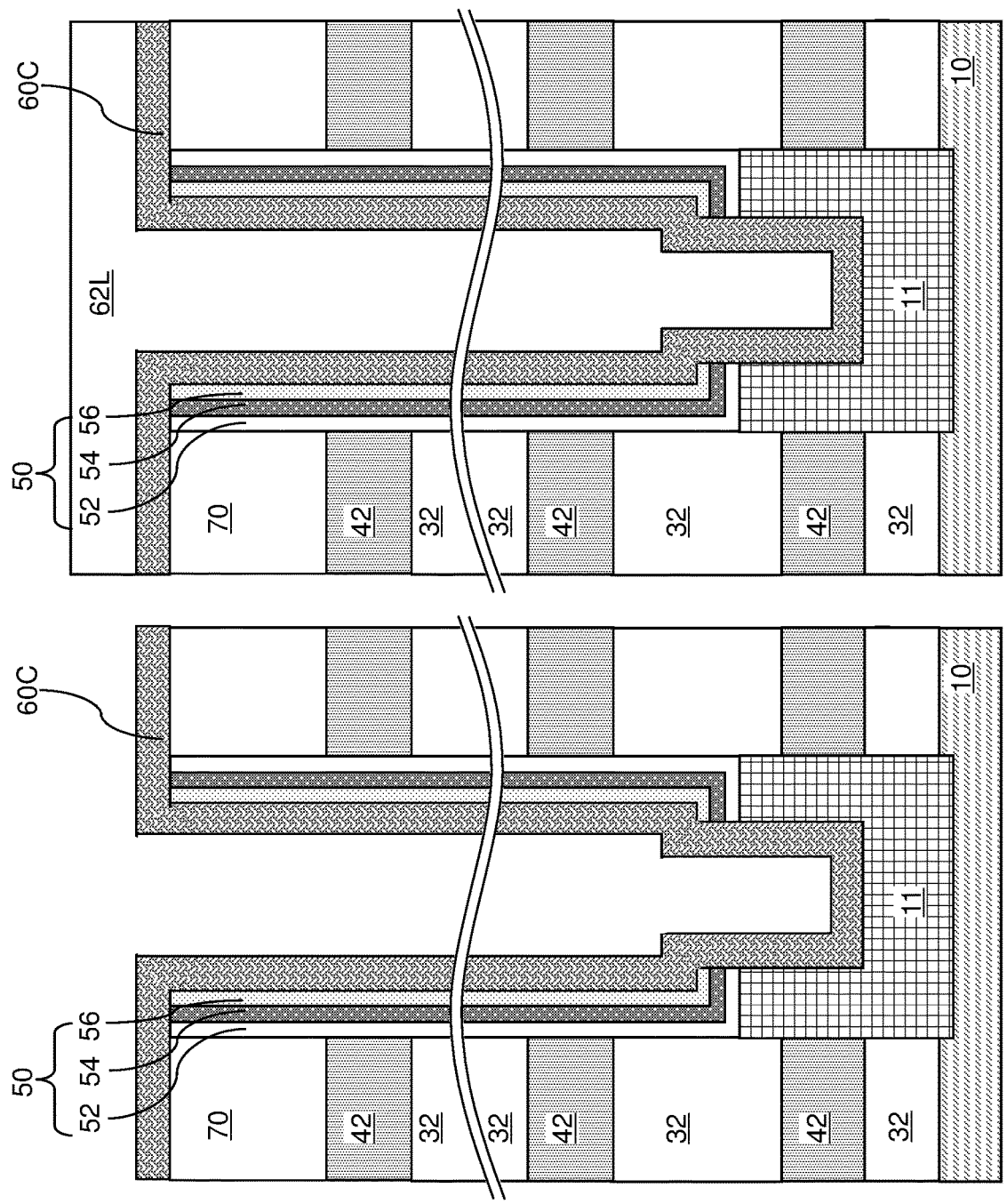

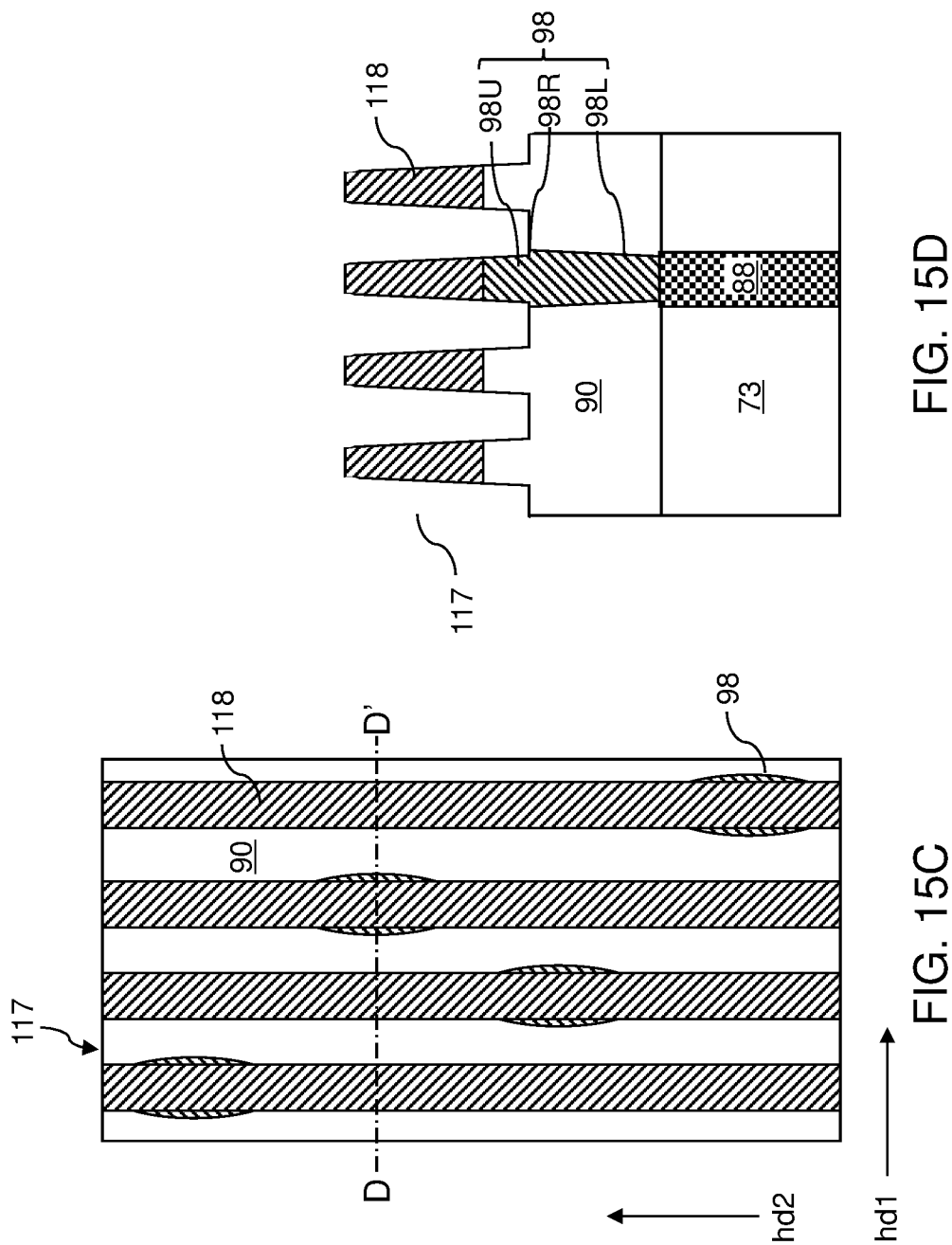

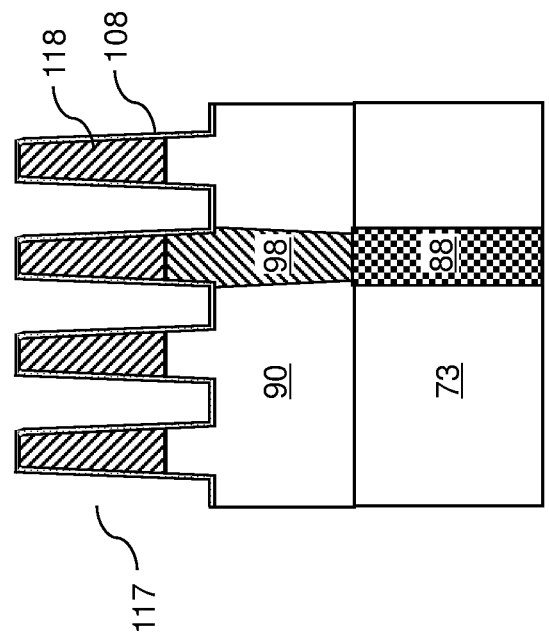
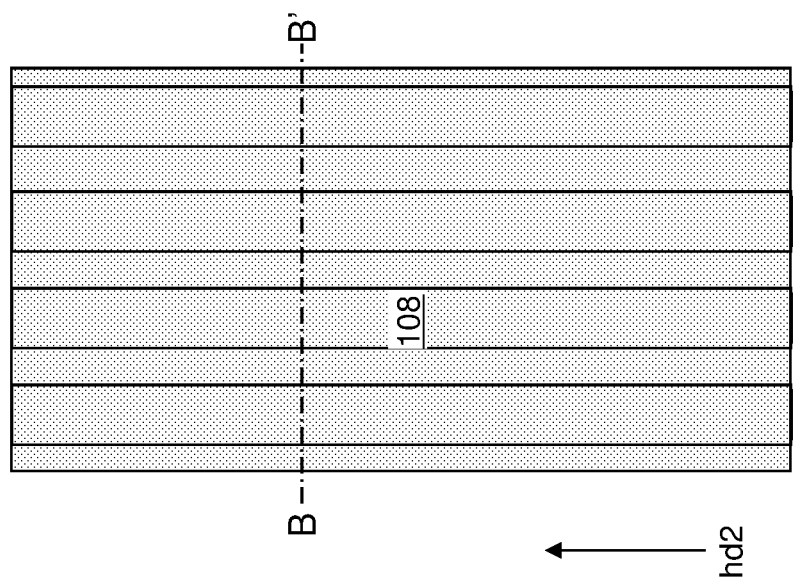
FIG. 16B
FIG. 16A

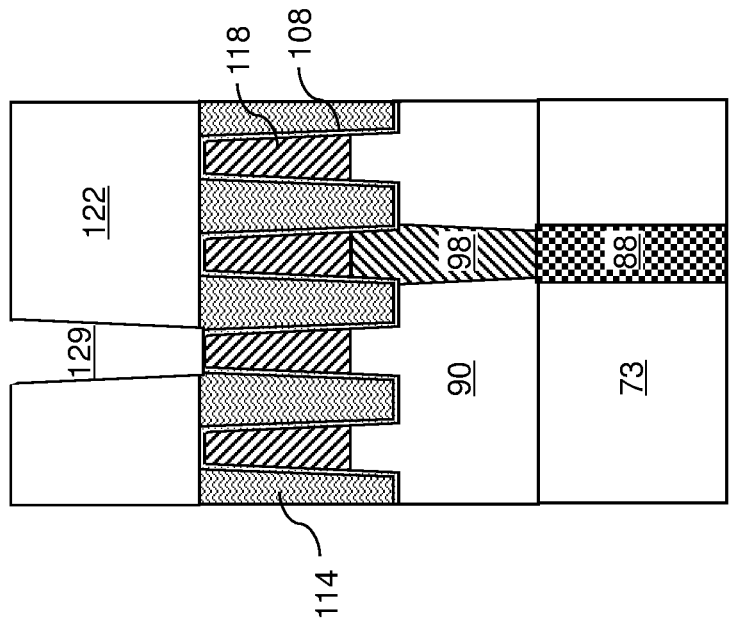
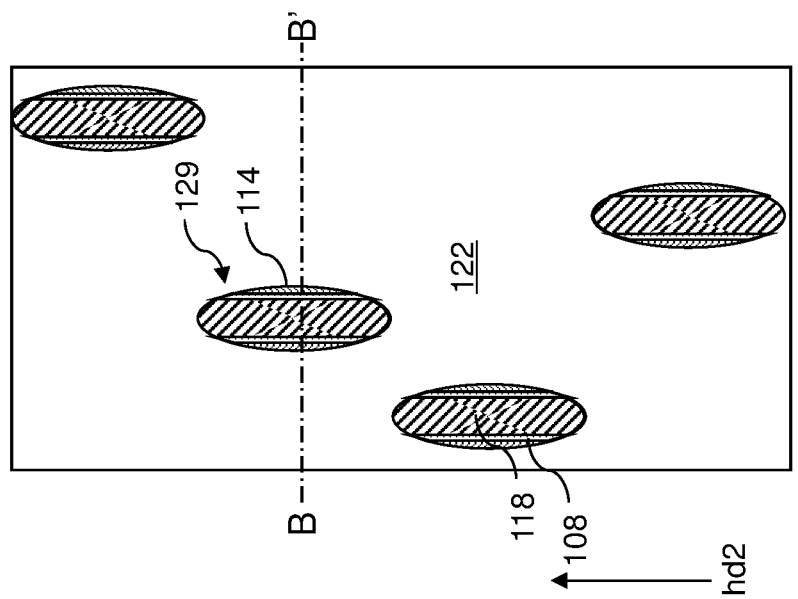
FIG. 18B
FIG. 18A

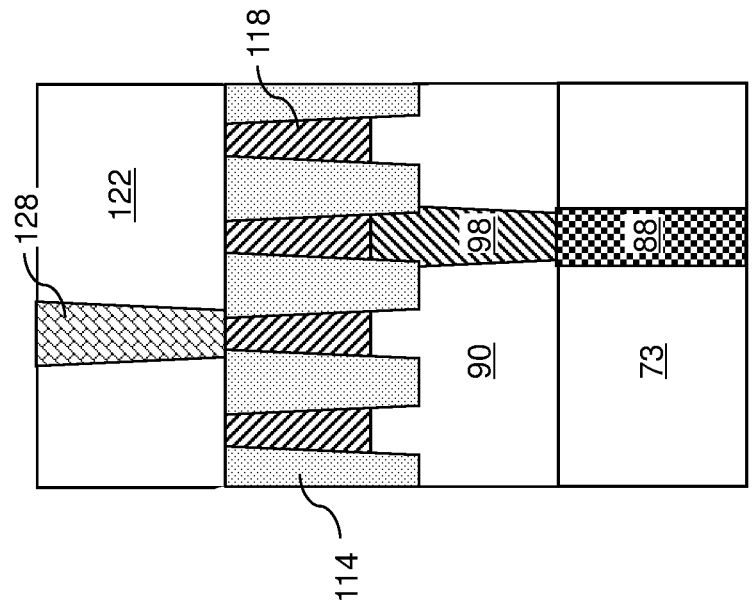
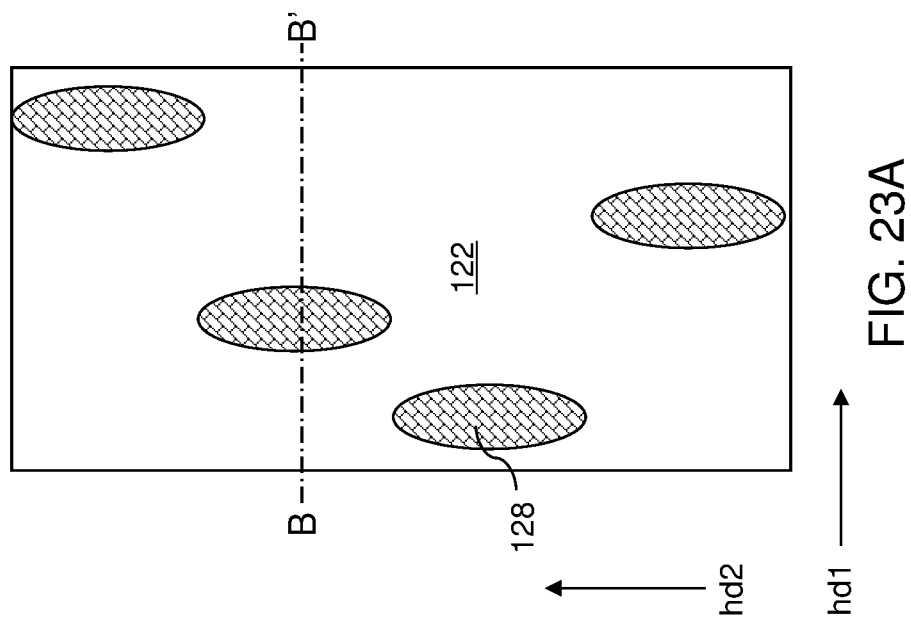
FIG. 23B
FIG. 23A

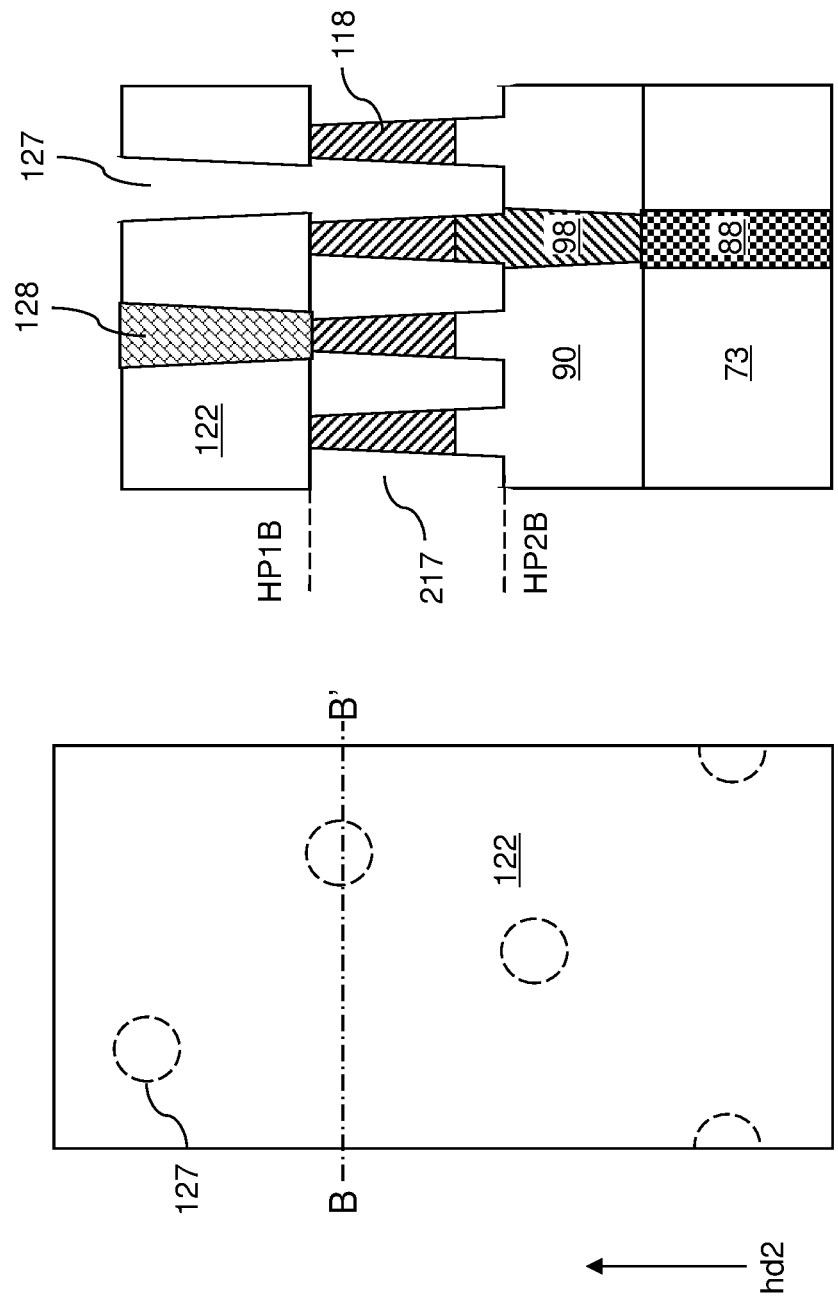

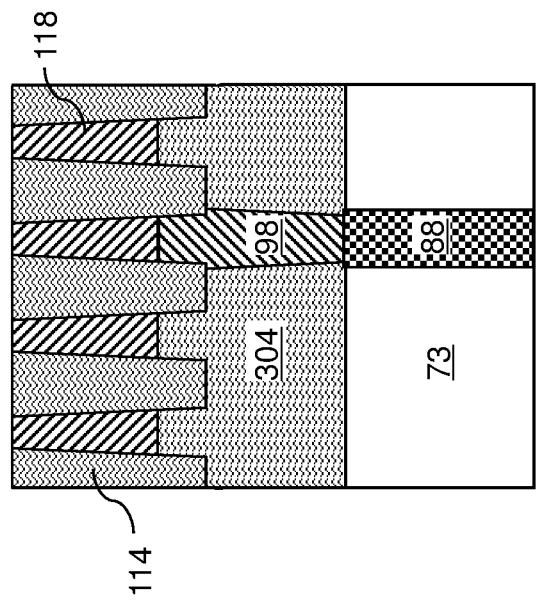
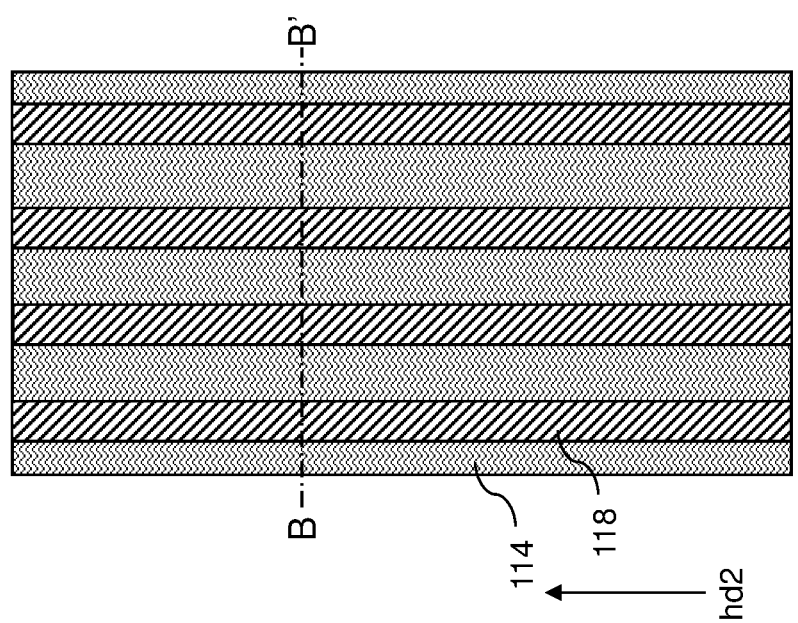
FIG. 29B
FIG. 29A

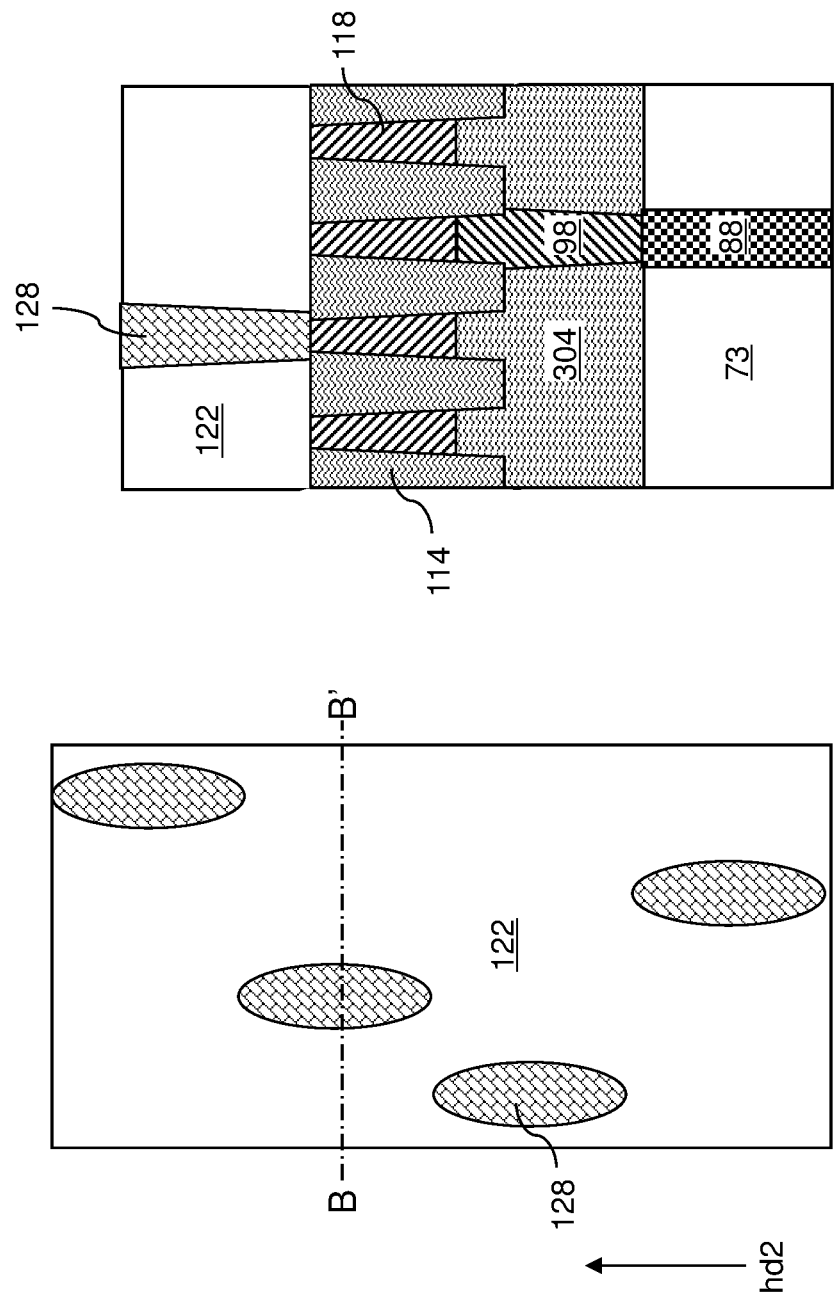

SEMICONDUCTOR DEVICE CONTAINING BIT LINES SEPARATED BY AIR GAPS AND METHODS FOR FORMING THE SAME

FIELD

The present disclosure relates generally to the field of semiconductor devices, and particularly to a semiconductor device containing bit lines separated by air gaps, and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure includes a semiconductor device, bit lines electrically connected to the semiconductor device, air gaps located between the bit lines, a capping-level material layer, a via-level dielectric material layer located between the bit lines and the capping-level material layer, and conductive via structures extending through the via-level dielectric material layer and contacting a top surface of a respective one of the bit lines. The capping-level material layer contains cavity-containing openings exposing the air gaps. The capping-level material layer contains protruding portions that extend into peripheral regions of the cavity-containing openings.

According to another aspect of the present disclosure, a method of forming a semiconductor structure comprises forming a semiconductor device over substrate, forming bit lines over the semiconductor device, forming a bit-line-level sacrificial fill layer between the bit lines, forming a via-level dielectric material layer over the bit lines and the bit-line-level sacrificial fill layer, forming conductive via structures through the via-level dielectric material layer directly on a top surface of a respective one of the bit lines, forming openings through the via-level dielectric material layer such that surfaces of the bit-line-level sacrificial fill layer are physically exposed underneath the openings, and removing the bit-line-level sacrificial fill layer by introducing an etchant through the openings that removes the sacrificial fill material to form air gaps between the bit lines.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIG. 15C is a top-down view of a region of the first configuration of the exemplary structure of FIG. 15A.

FIG. 15D is a vertical cross-sectional view of the first configuration of the exemplary structure along the vertical plane D-D' of FIG. 15C.

FIG. 16A is a top-down view of a region of the first configuration of the exemplary structure after formation of a dielectric liner according to an embodiment of the present disclosure.

FIG. 16B is a vertical cross-sectional view of the first configuration of the exemplary structure according to the vertical plane B-B' of FIG. 16A.

FIG. 18A is a top-down view of a region of the first configuration of the exemplary structure after formation of a via-level dielectric material layer and connection via cavities according to an embodiment of the present disclosure.

FIG. 18B is a vertical cross-sectional view of the first configuration of the exemplary structure according to the vertical plane B-B' of FIG. 18A.

FIG. 23A is a top-down view of a region of the second configuration of the exemplary structure after formation of a via-level dielectric material layer and conductive via structures according to an embodiment of the present disclosure.

FIG. 23B is a vertical cross-sectional view of the second configuration of the exemplary structure according to the vertical plane B-B' of FIG. 23A.

FIG. 25A is a top-down view of a region of the second configuration of the exemplary structure after formation of a capping-level dielectric layer according to an embodiment of the present disclosure.

FIG. 25B is a vertical cross-sectional view of the second configuration of the exemplary structure according to the vertical plane B-B' of FIG. 25A.

FIG. 29A is a top-down view of a region of the third configuration of the exemplary structure after formation of a bit-line-level sacrificial fill layer according to an embodiment of the present disclosure.

FIG. 29B is a vertical cross-sectional view of the third configuration of the exemplary structure according to the vertical plane B-B' of FIG. 29A.

FIG. 30A is a top-down view of a region of the third configuration of the exemplary structure after formation of a via-level dielectric material layer and conductive via structures according to an embodiment of the present disclosure.

FIG. 30B is a vertical cross-sectional view of the third configuration of the exemplary structure according to the vertical plane B-B' of FIG. 30A.

DETAILED DESCRIPTION

Figure 1:
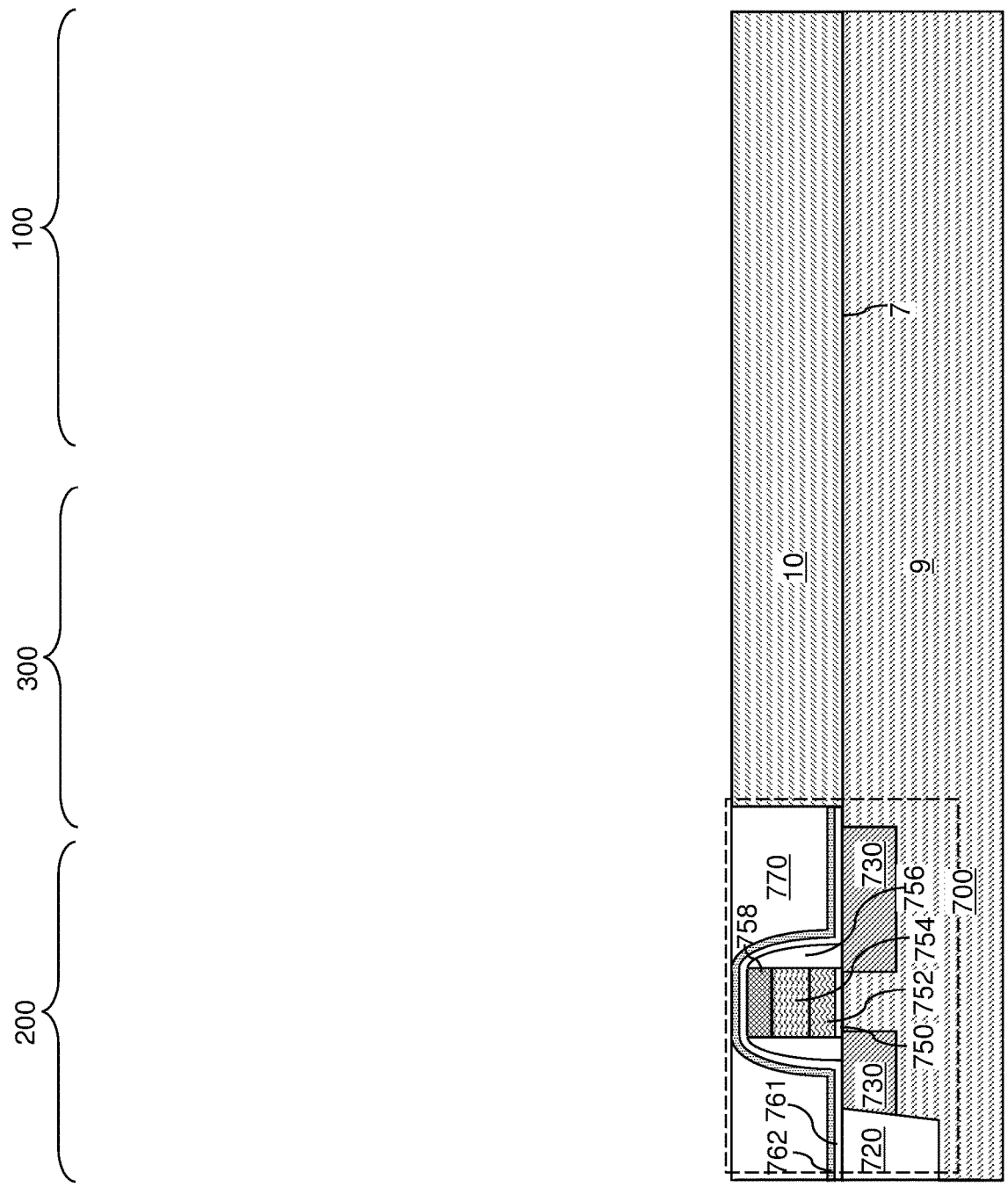
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed to a semiconductor device containing bit lines separated by air gaps, and methods for forming the same, the various aspects of which are described below. The embodiments of the disclosure can be employed to form various semiconductor devices, non-limiting examples of which include three-dimensional memory devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
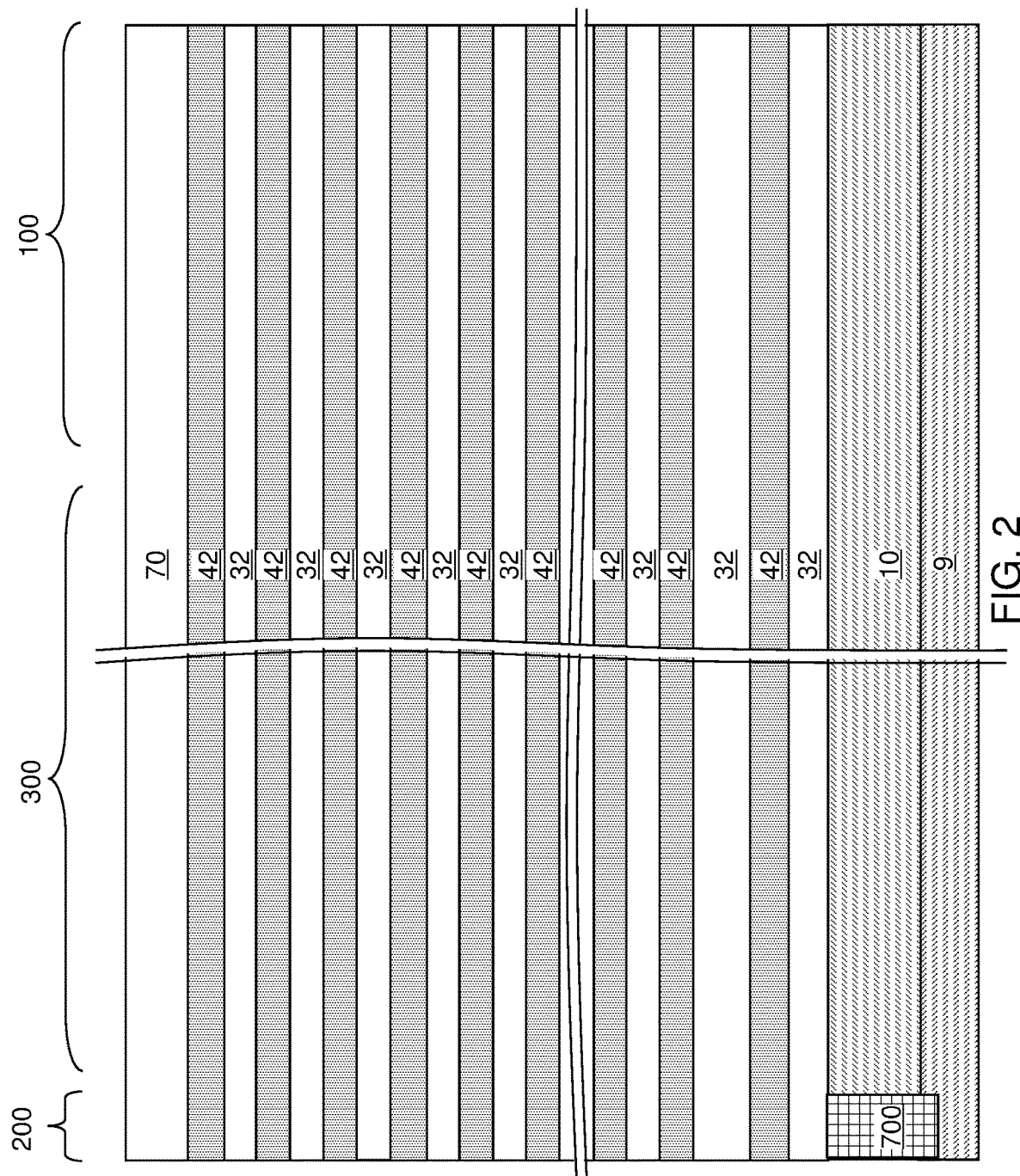
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
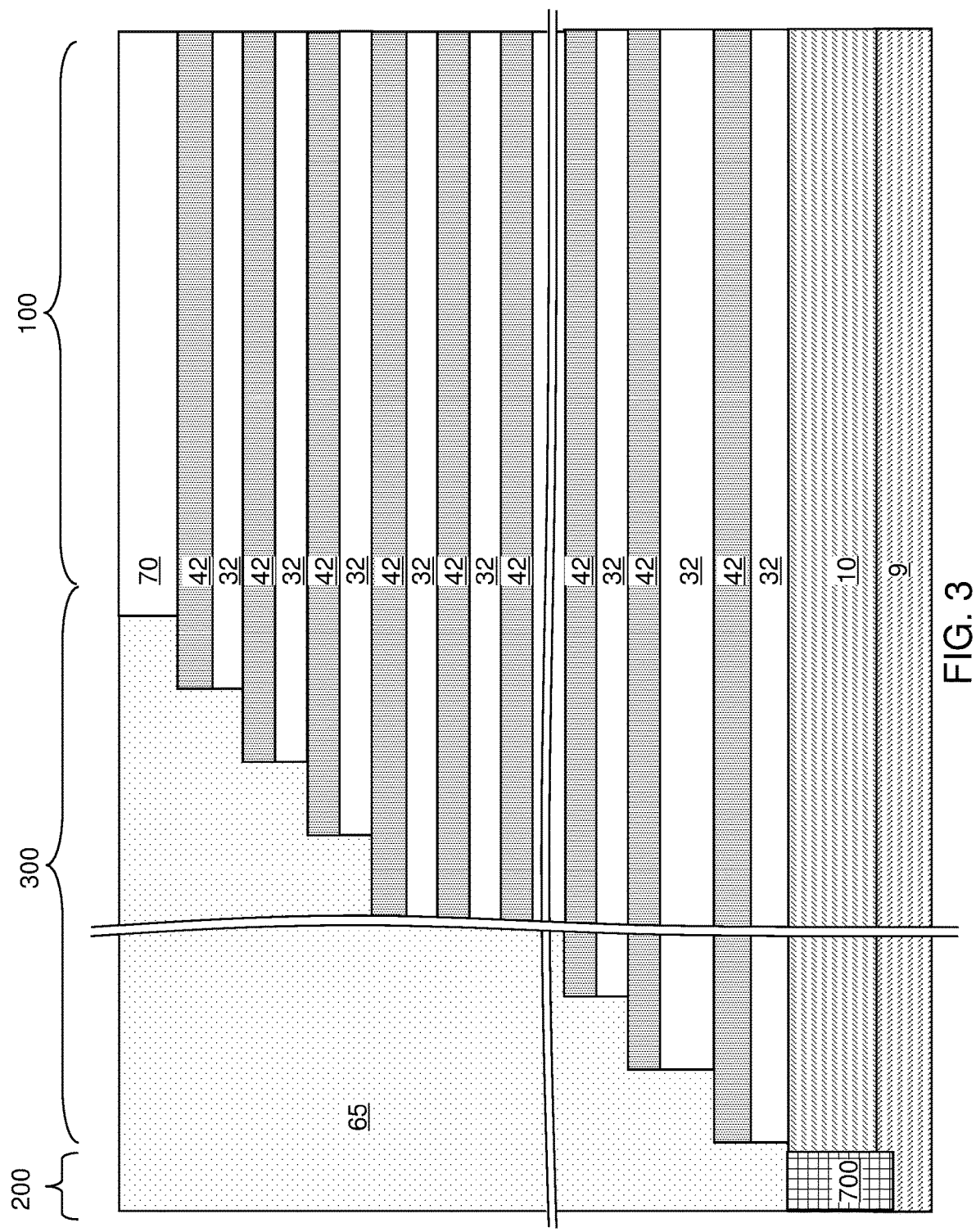
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
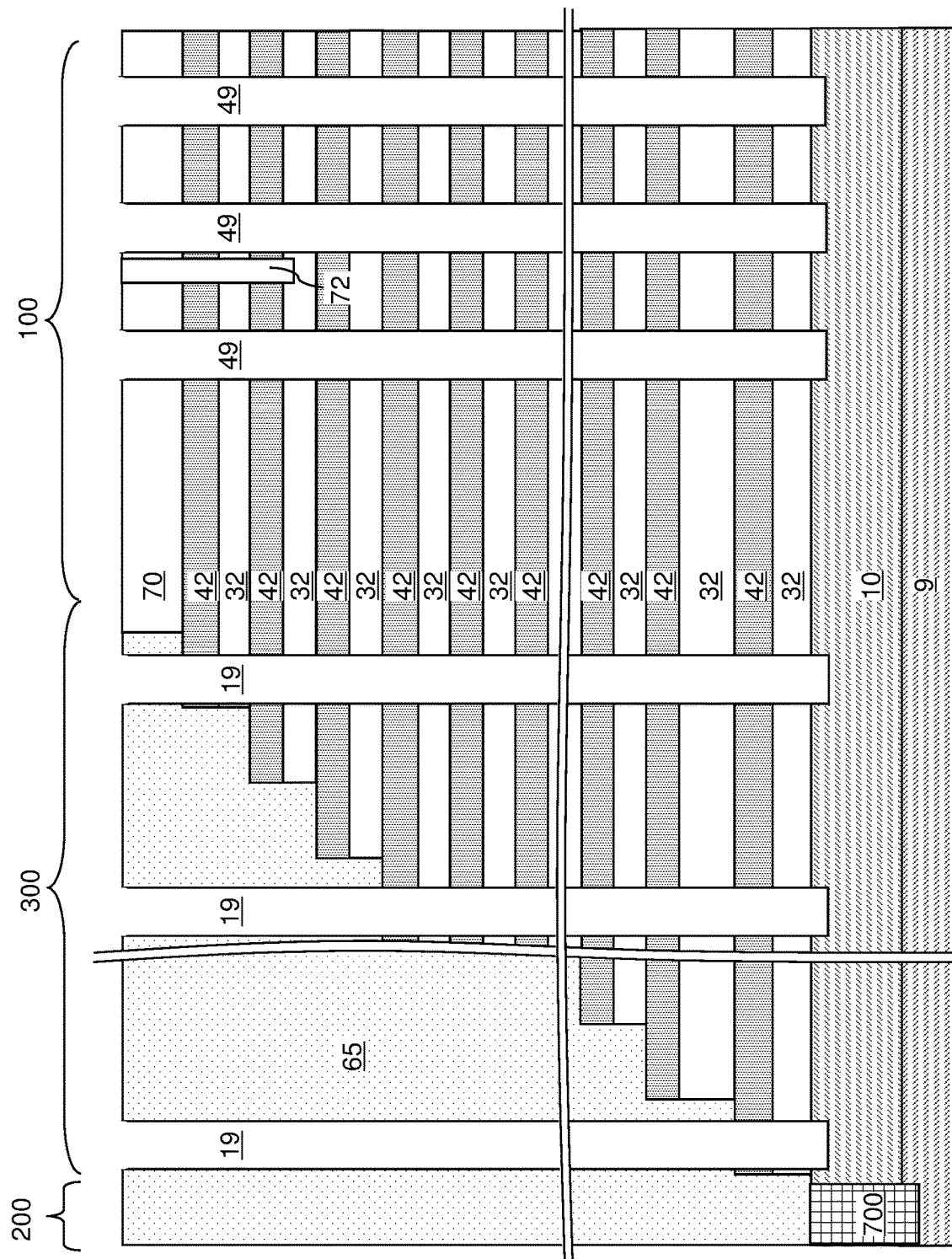
FIG. 4A is a schematic vertical cross-sectional view of the exemplary structure after formation of memory openings and support openings according to an embodiment of the present disclosure.
Figure 4B:
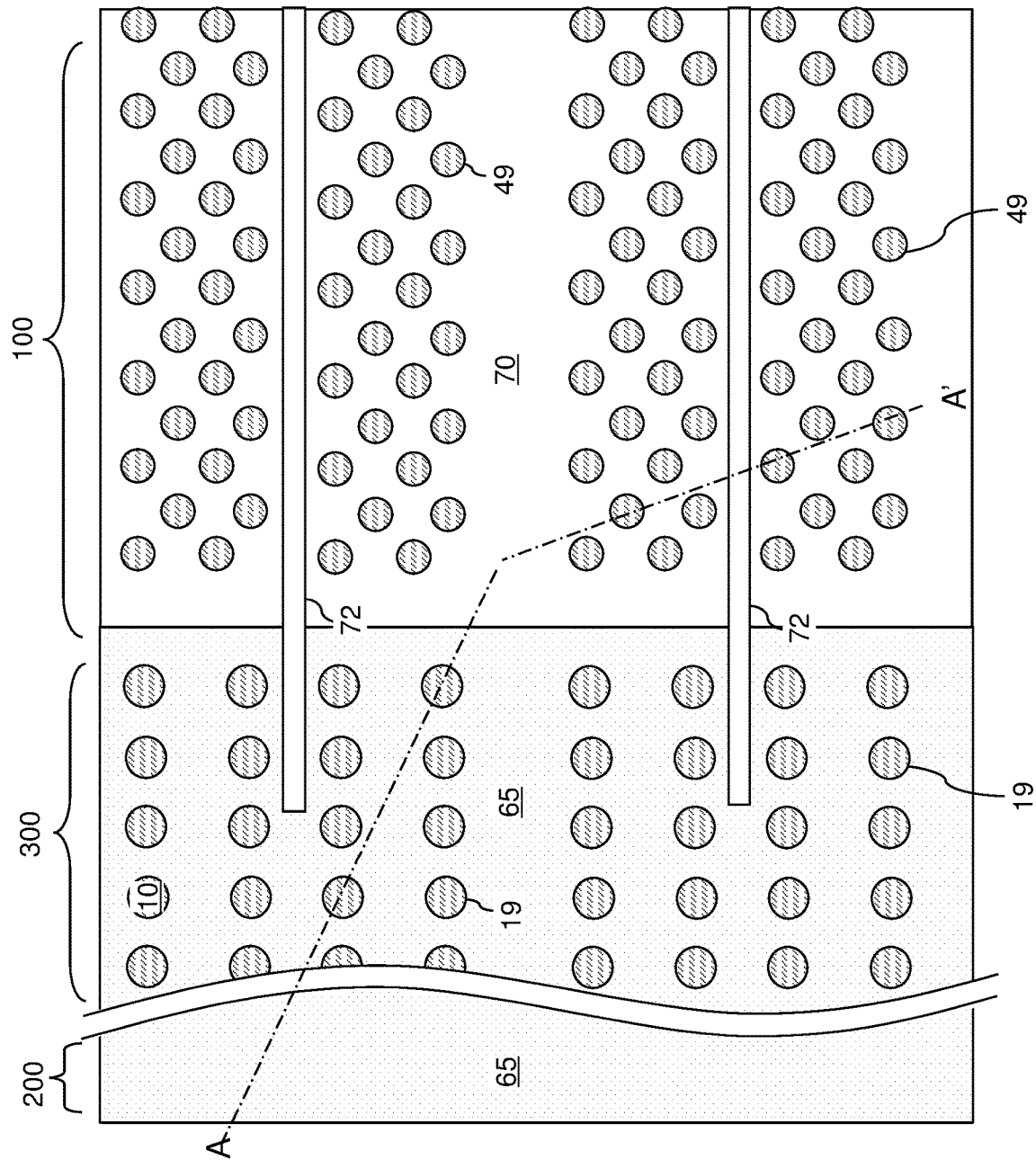
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a memory material layer 54, a dielectric material liner 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

In one embodiment, each vertical stack of memory elements comprises a vertical stack of charge storage material portions that retain electrical charges therein upon programming, or a vertical stack of ferroelectric memory elements that retains electrical polarization therein upon programming. In case the vertical stack of ferroelectric memory elements is used, the memory material layer 54 may comprise a continuous ferroelectric material layer or a plurality of discrete, vertically separated ferroelectric material portions. The ferroelectric material may comprise orthorhombic phase hafnium oxide doped with silicon, aluminum or zirconium for example.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

In one embodiment, the dielectric material liner 56 can include a gate dielectric material if the memory material layer 54 comprises a ferroelectric layer. In another embodiment, if the memory material layer 54 comprises a charge storage layer, then the dielectric material liner 56 may be a tunneling dielectric material including a dielectric material through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, the blocking dielectric layer 52 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material or a ferroelectric material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60C can be deposited directly on the semiconductor surface of the pedestal channel portion 11 or the semiconductor material layer 10 if the pedestal channel portion 11 is omitted, and directly on the dielectric material liner 56. The semiconductor channel layer 60C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60C includes amorphous silicon or polysilicon. The semiconductor channel layer 60C can have a doping of a first conductivity type, which is the same as the conductivity type of the semiconductor material layer 10 and the pedestal channel portions 11. The semiconductor channel layer 60C can be formed by a conformal deposition method such as low pressure chemical vapor deposition (LPCVD). The thickness of the semiconductor channel layer 60C can be in a range from 2 nm to 10 nm, although lesser and greater thicknesses can also be employed. The semiconductor channel layer 60C may partially fill the memory cavity 49' in each memory opening, or may fully fill the cavity in each memory opening.

Referring to FIG. 5F, in case the memory cavity 49' in each memory opening is not completely filled by the semiconductor channel layer 60C, a dielectric core layer 62C can be deposited in the memory cavity 49' to fill any remaining portion of the memory cavity 49' within each memory opening. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating.

Figure 5H:
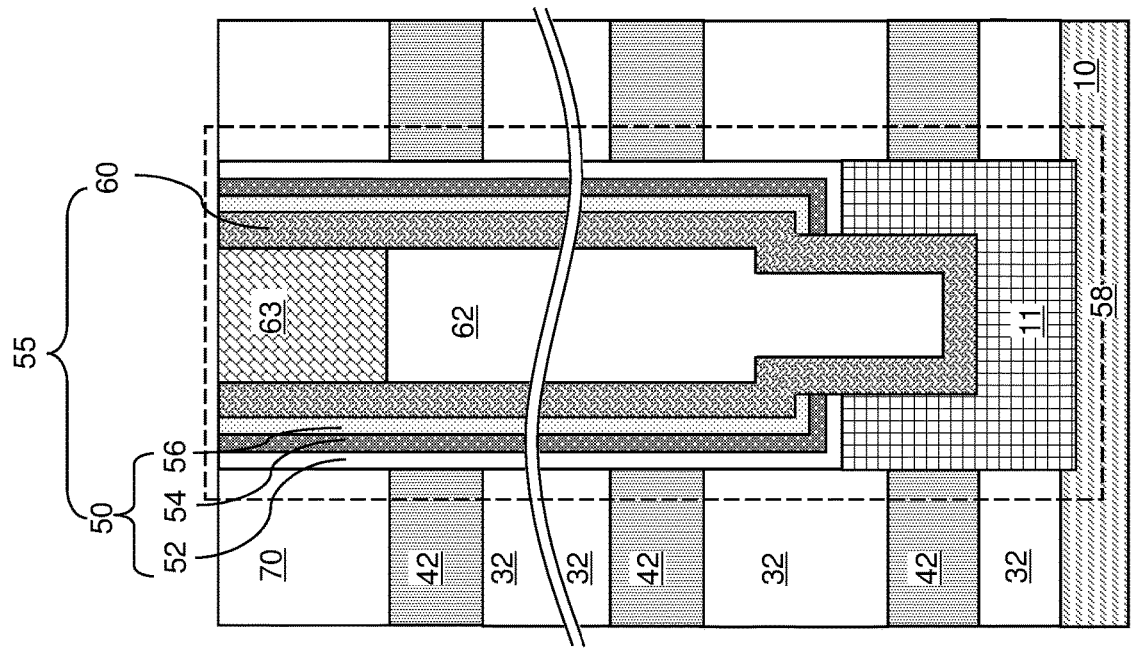
Figure 5G:
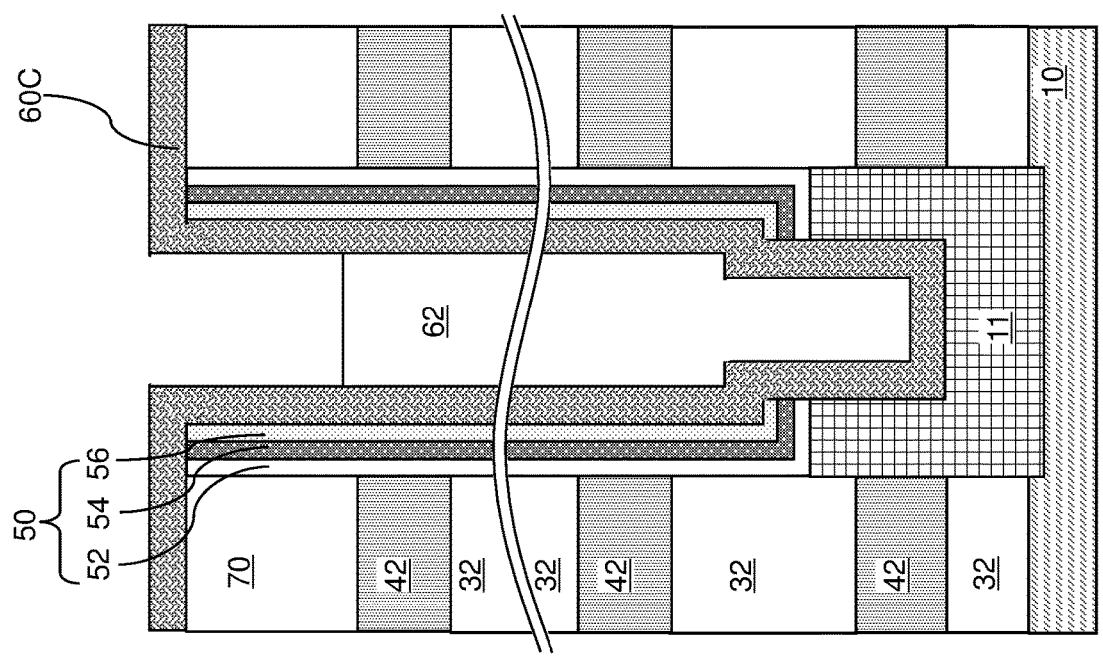

Referring to FIG. 5G, the horizontal portion of the dielectric core layer 62L can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60C can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60C (which has a doping of the first conductivity type) constitutes a vertical semiconductor channel 60.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a blocking dielectric layer may be subsequently formed after formation of backside recesses. Furthermore, if the ferroelectric memory material layer 54 is used, then the dielectric material liner 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
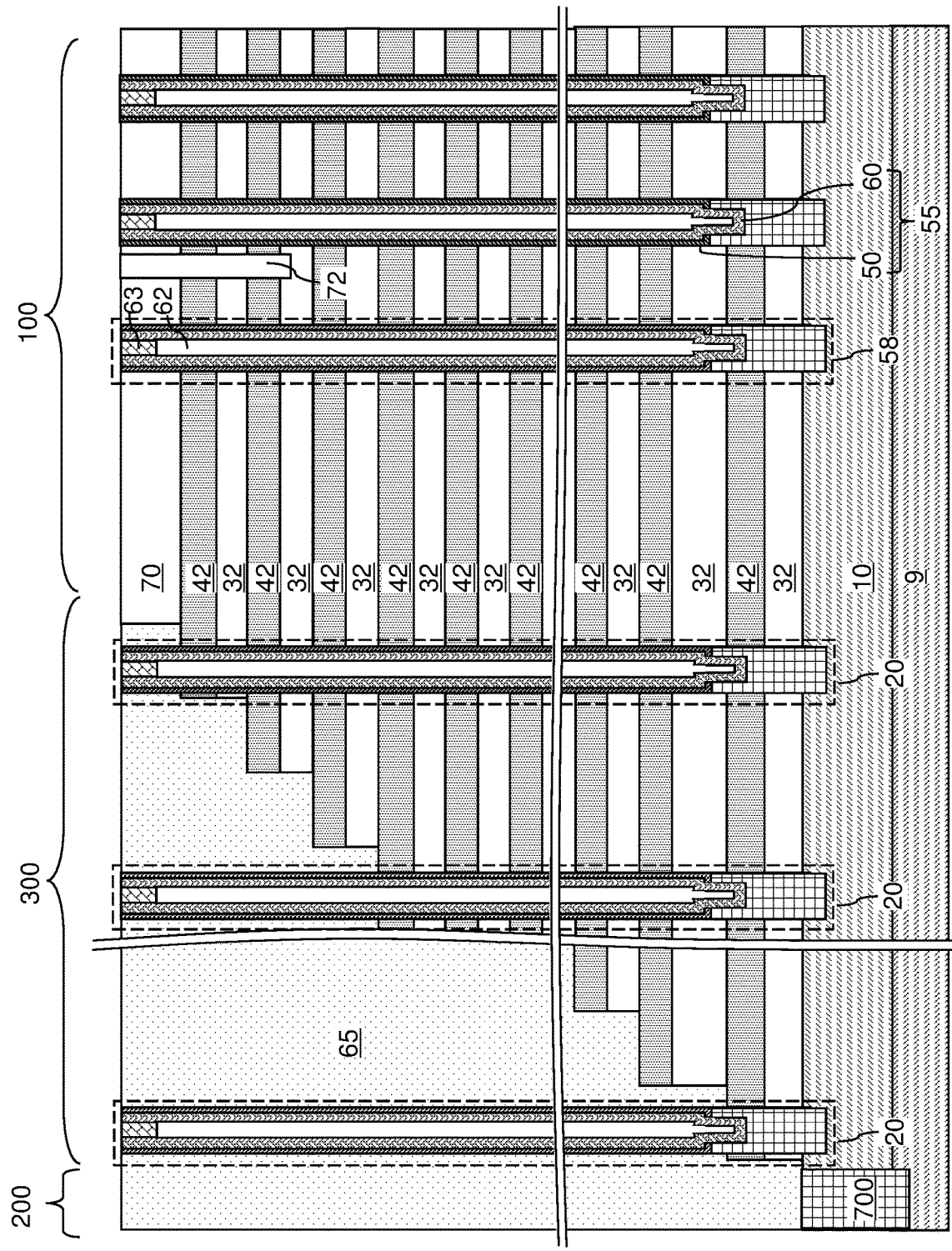
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60 and a vertical stack of charge storage regions or ferroelectric regions (comprising memory material layer 54) laterally surrounding the dielectric material liner 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
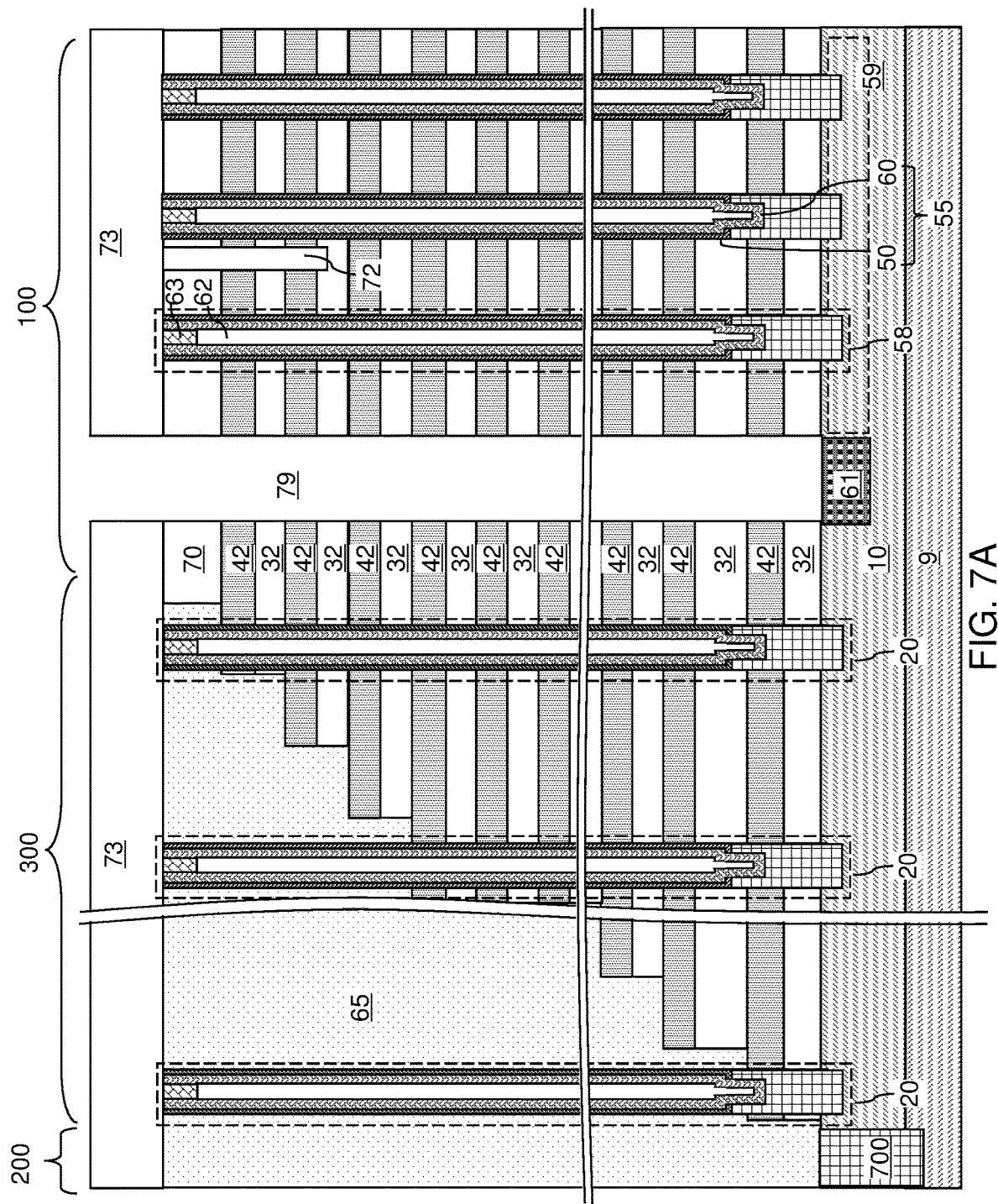
FIG. 7A is a schematic vertical cross-sectional view of the exemplary structure after formation of backside trenches according to an embodiment of the present disclosure.
Figure 7B:
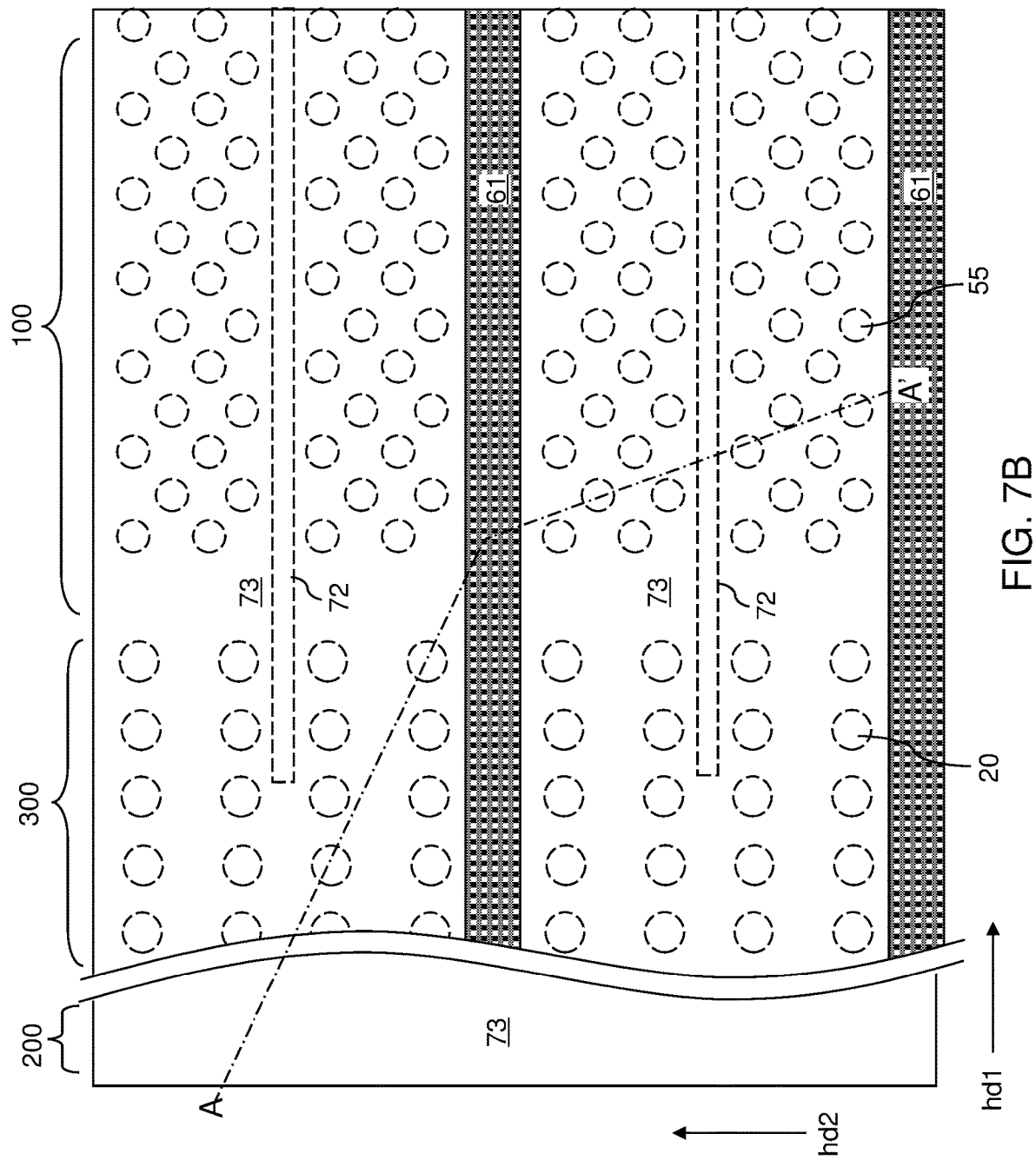
FIG. 7B is a partial see-through top-down view of the exemplary structure of FIG. 7A. The vertical plane A-A' is the plane of the schematic vertical cross-sectional view of FIG. 7A.
Figure 7C:
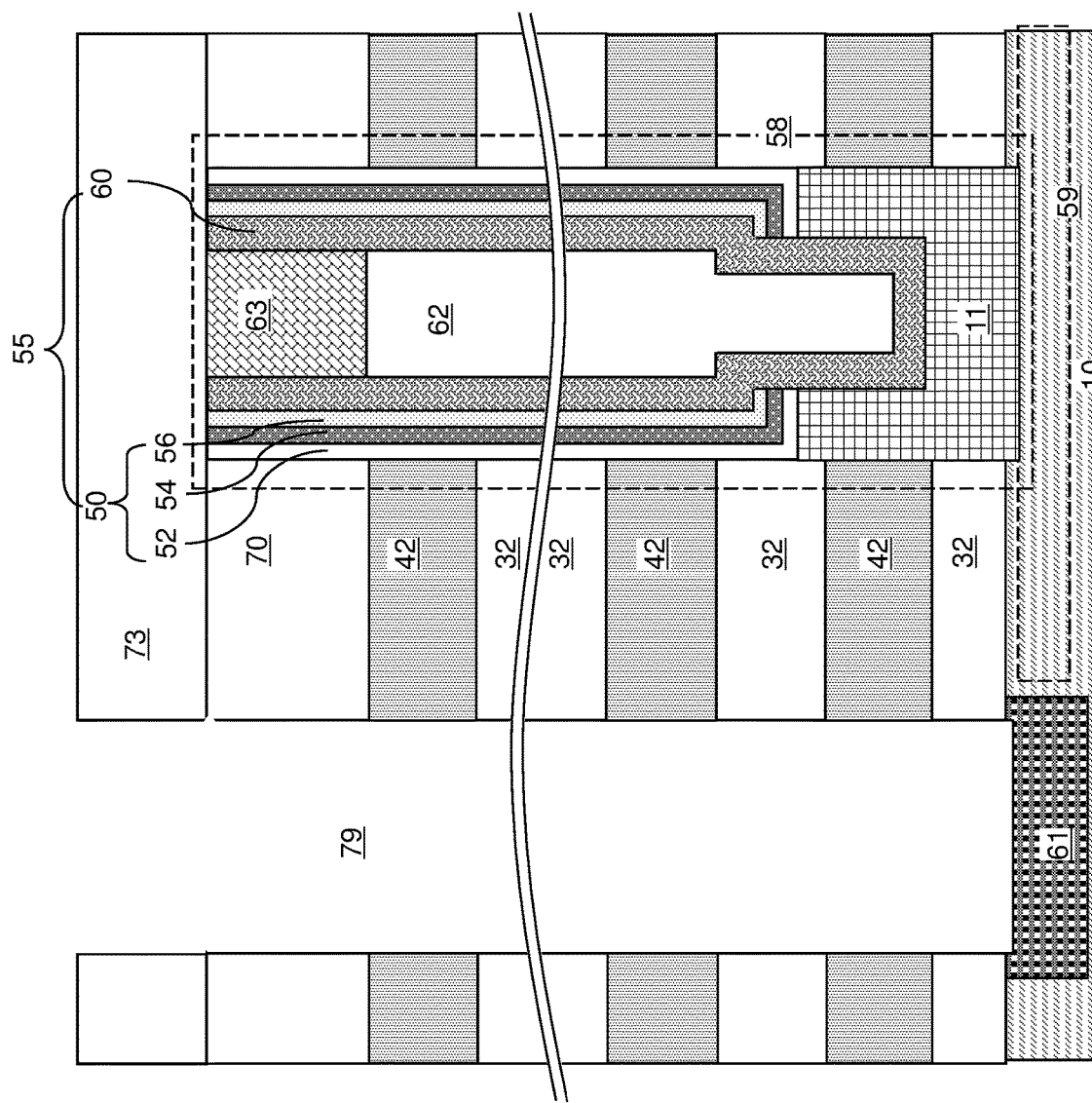
FIG. 7C is a magnified view of a region of the exemplary structure of FIG. 7A.

Referring to FIGS. 7A-7C, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42). The alternating stack (32, 42) as formed at the processing steps of FIG. 3 is divided into multiple alternating stacks (32, 42) that are laterally spaced apart along the second horizontal direction hd2 by the backside trenches 79. Layer stacks (32, 42, 70, 73) are formed, each of which includes a respective patterned portion of the contact-level dielectric layer 73 and a respective patterned portion of the alternating stack (32, 42) as formed at the processing steps of FIG. 3 and laterally spaced from each other by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 8A:
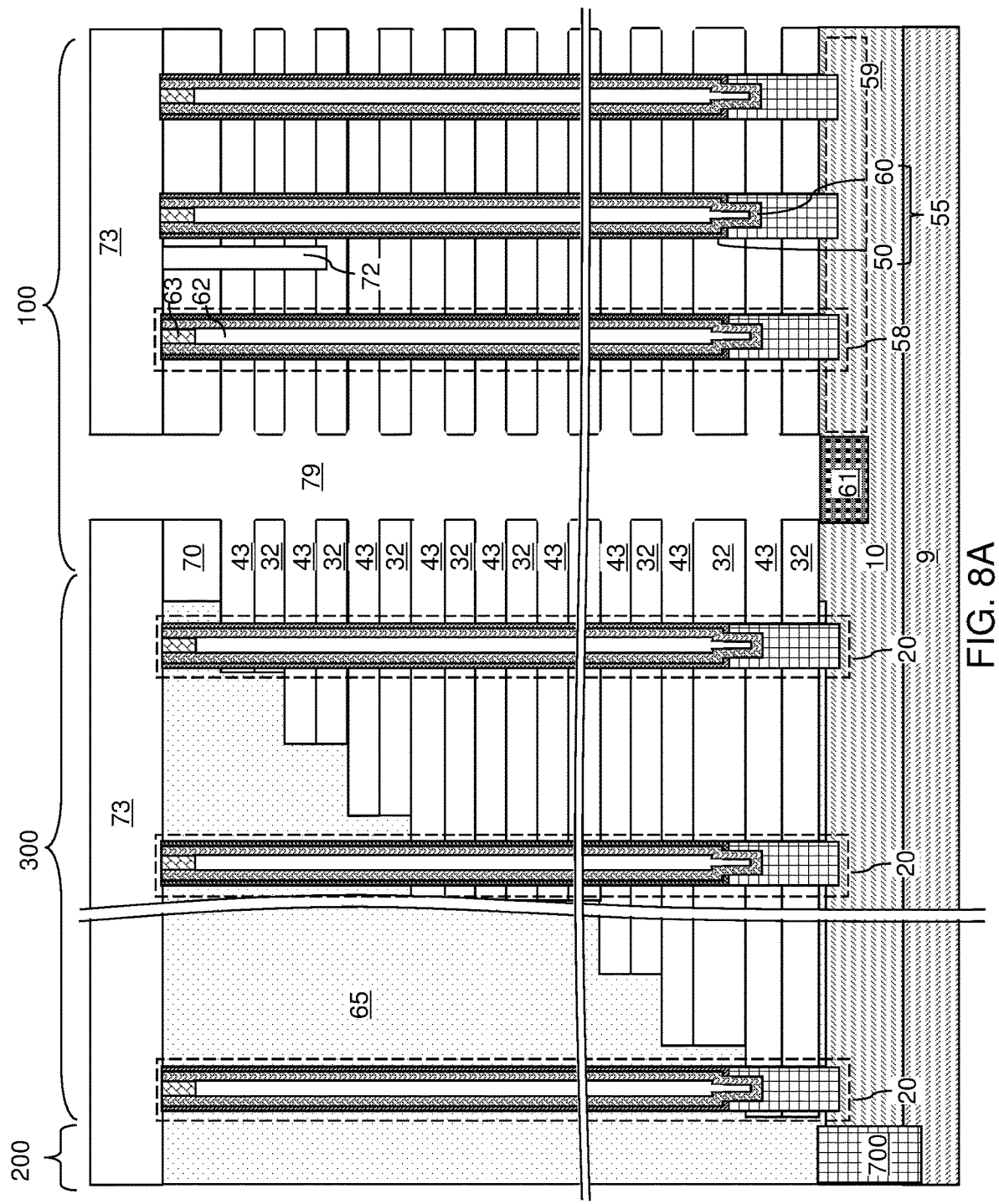
FIG. 8A is a schematic vertical cross-sectional view of the exemplary structure after formation of backside recesses according to an embodiment of the present disclosure.
Figure 8B:
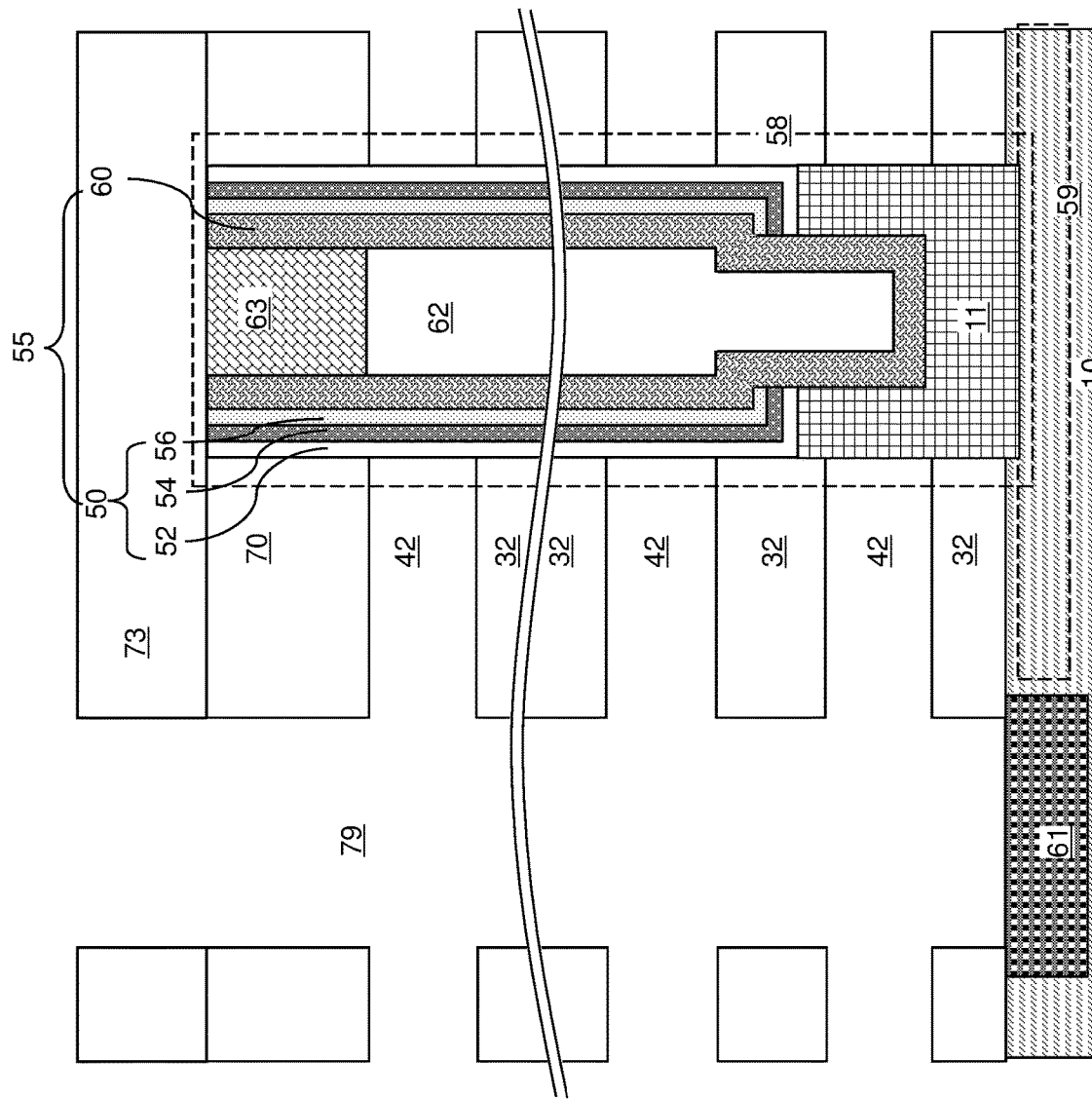
FIG. 8B is a magnified view of a region of the exemplary structure of FIG. 8A.

Referring to FIGS. 8A and 8B, an etchant that selectively etches the second material of the sacrificial material layers 42 with respect to the first material of the insulating layers 32 can be introduced into the backside cavities 79', for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Figure 9:
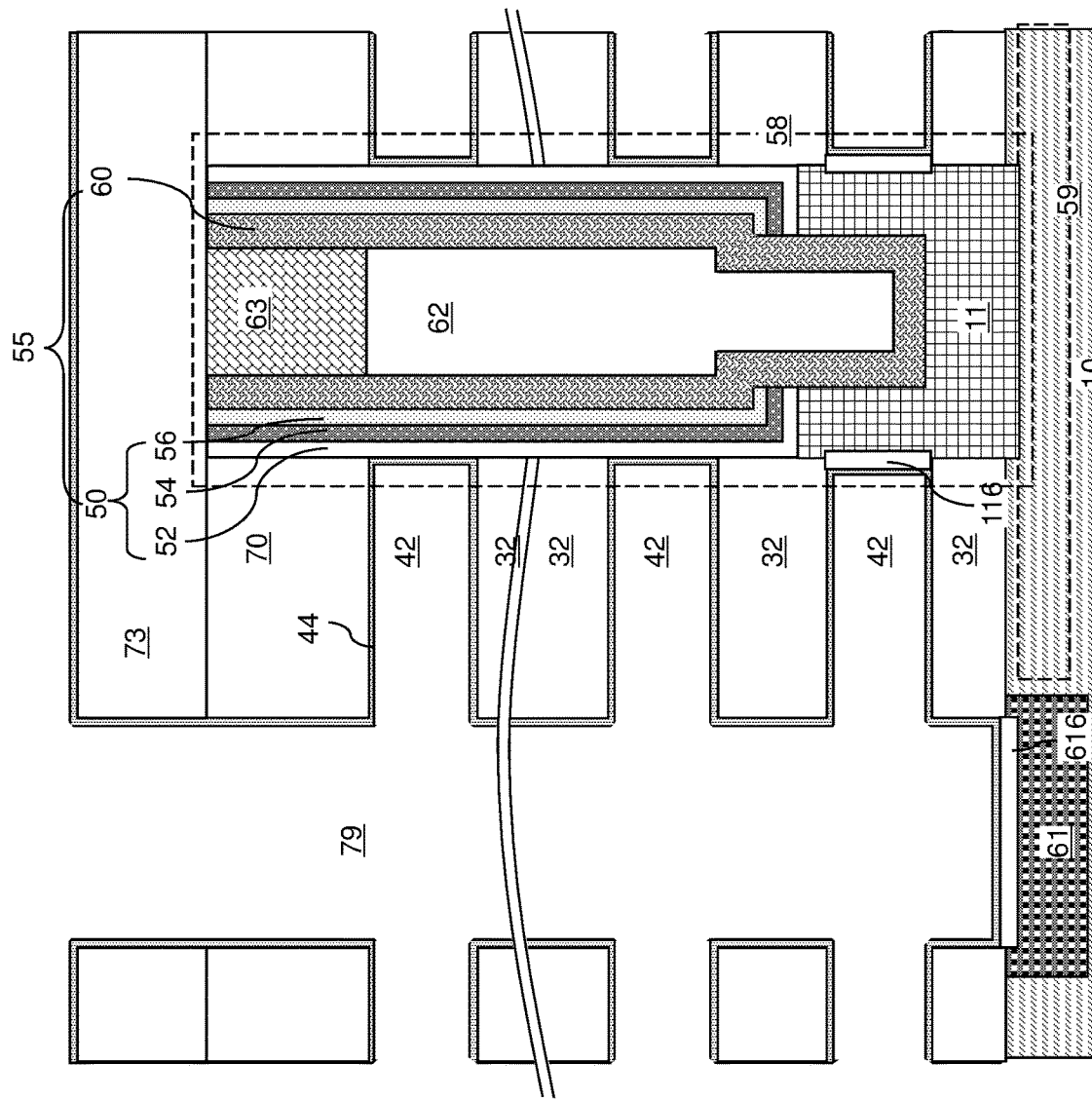
FIG. 9 is a schematic vertical cross-sectional view of a region of the exemplary structure after formation of tubular dielectric spacers and a backside blocking dielectric layer according to an embodiment of the present disclosure.

Referring to FIG. 9, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

A backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 10:
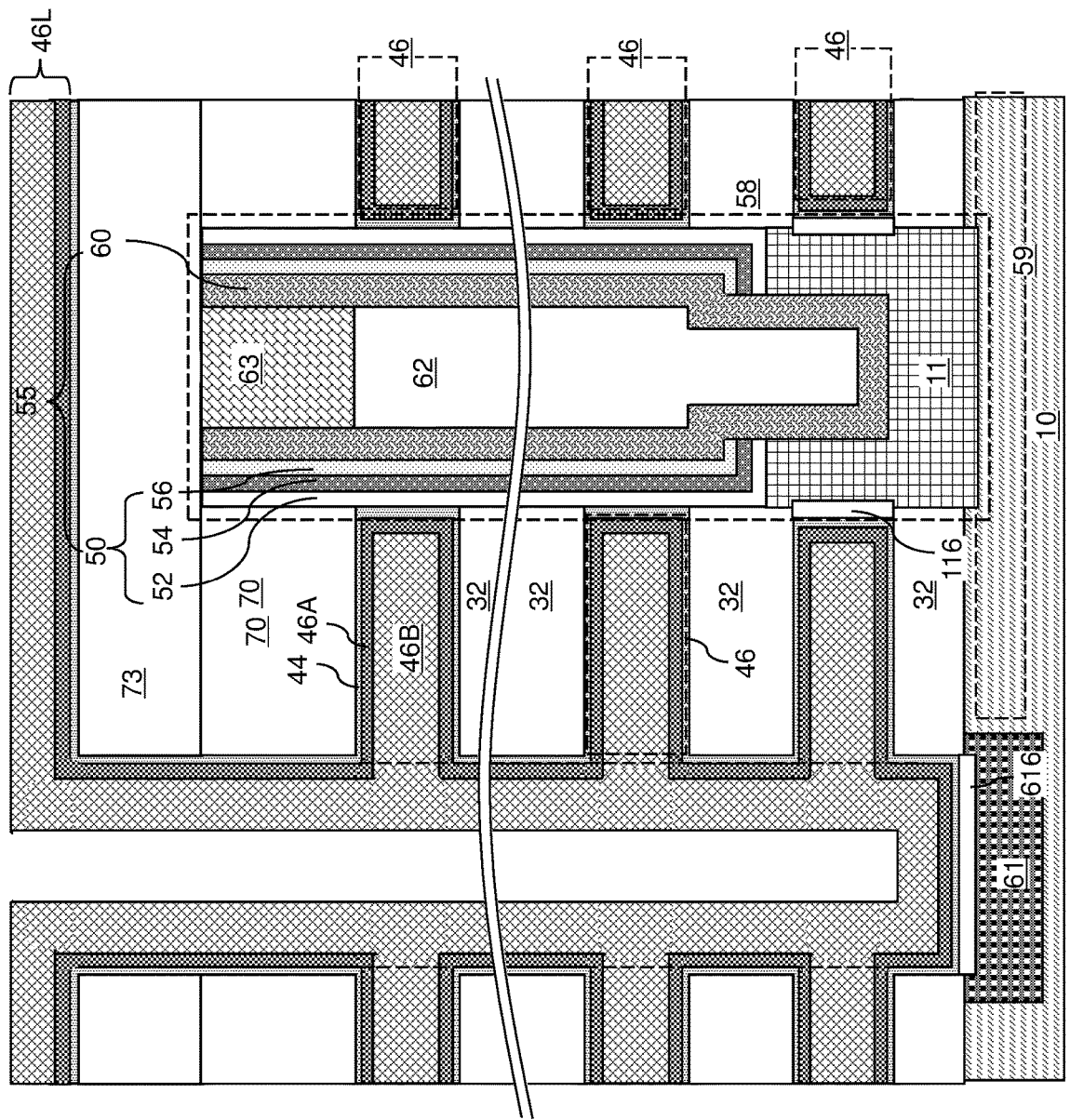
FIG. 10 is a schematic vertical cross-sectional view of a region of the exemplary structure after deposition of at least one electrically conductive material according to an embodiment of the present disclosure.

Referring to FIG. 10, at least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
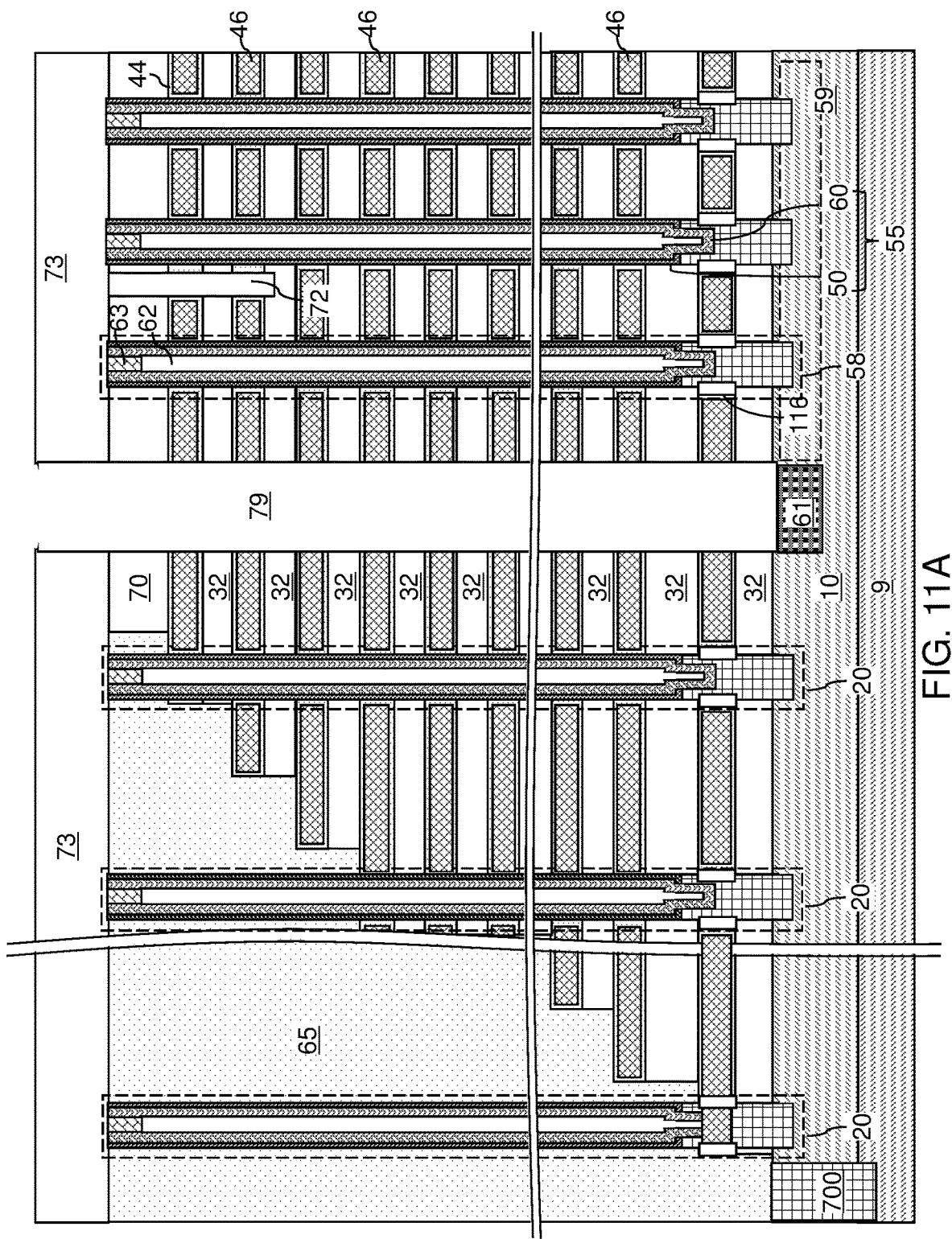
FIG. 11A is a schematic vertical cross-sectional view of the exemplary structure after removal of the at least one electrically conductive material from inside the backside trenches and from above a contact-level dielectric layer according to an embodiment of the present disclosure.
Figure 11B:
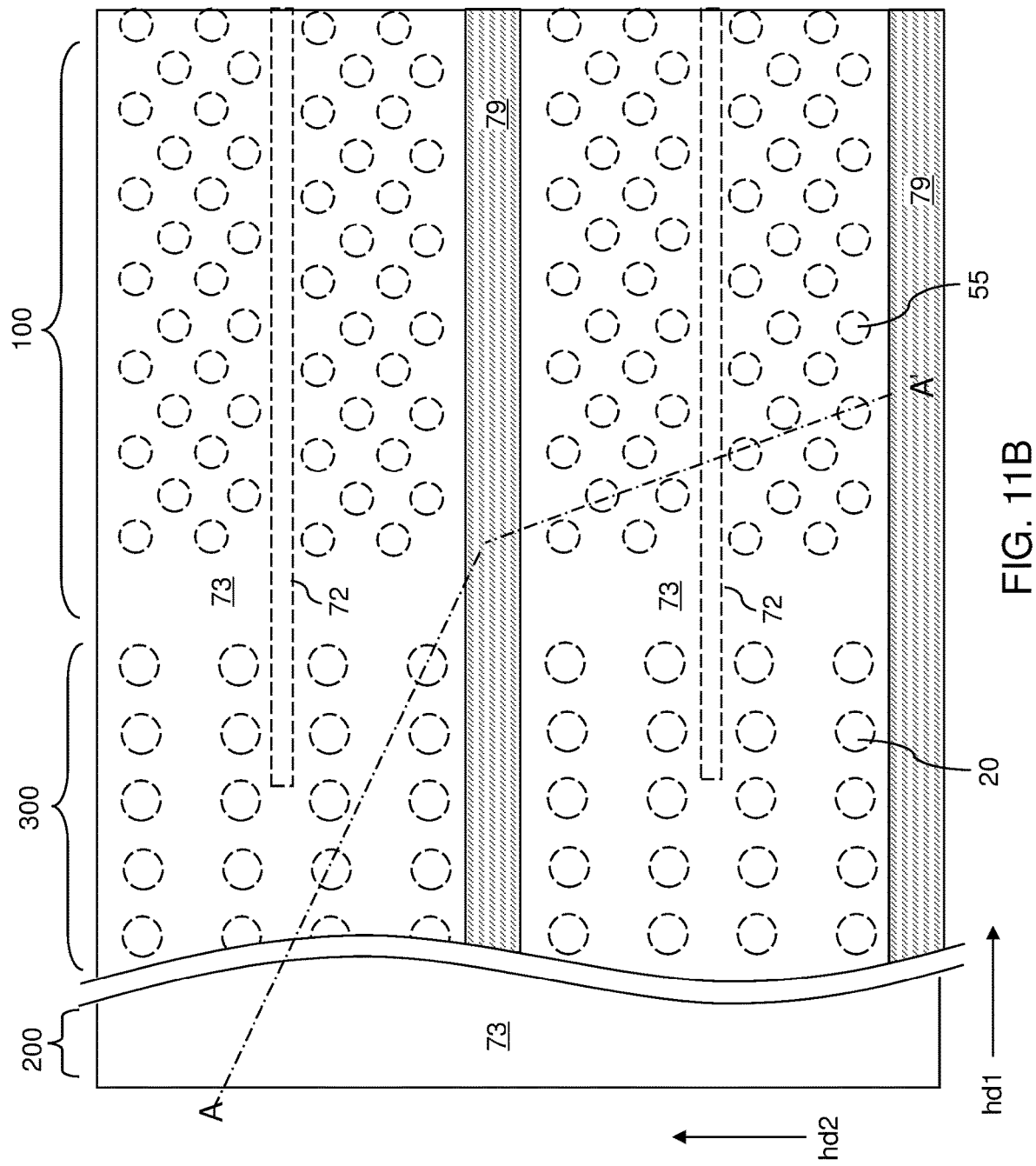
FIG. 11B is a partial see-through top-down view of the exemplary structure of FIG. 11A. The vertical plane A-A' is the plane of the schematic vertical cross-sectional view of FIG. 11A.
Figure 11C:
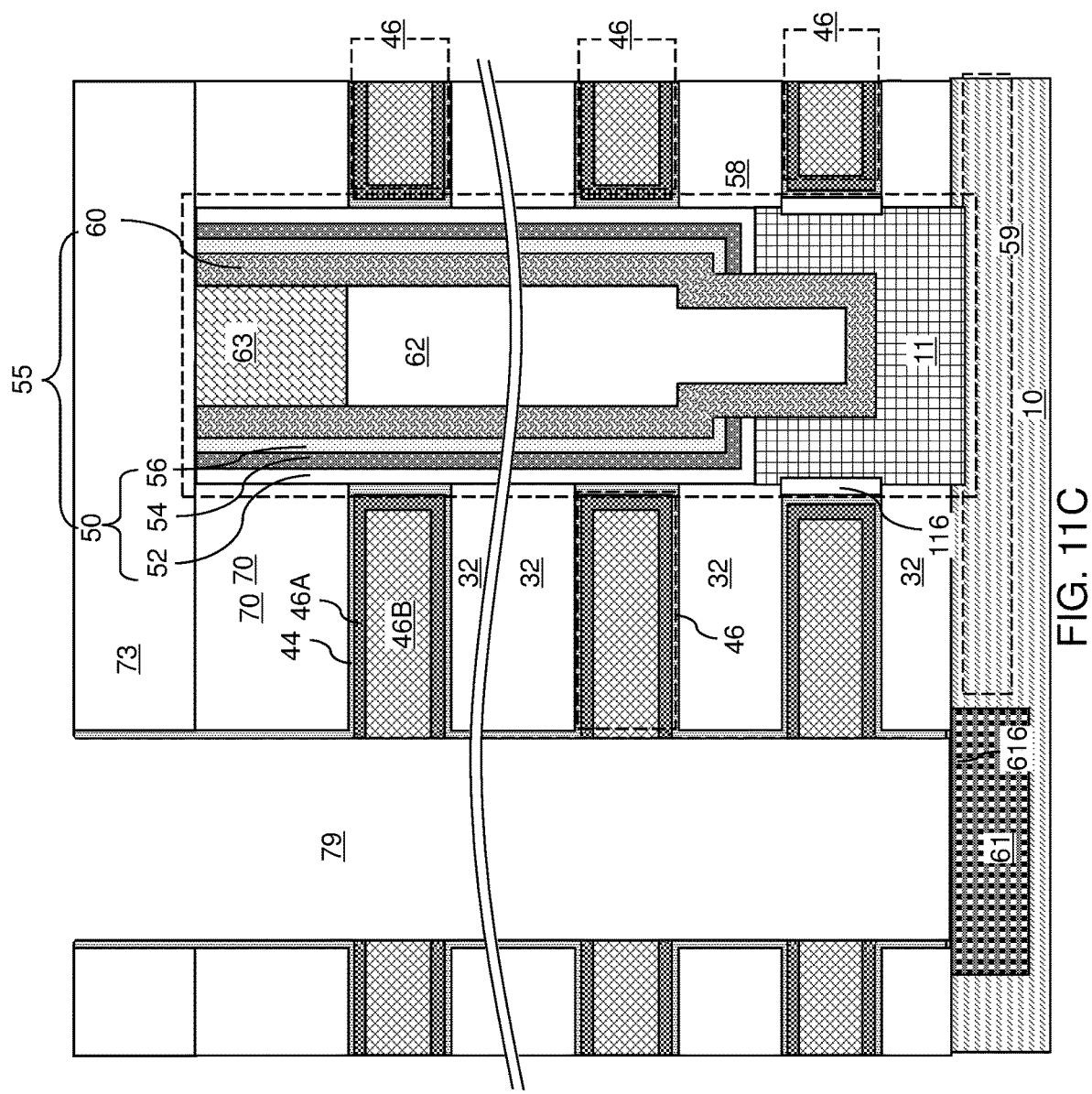
FIG. 11C is a magnified view of a region of the exemplary structure of FIG. 11A.

Referring to FIGS. 11A-11C, the deposited metallic material of the continuous electrically conductive material layer 46L is etched back from the sidewalls of each backside trench 79 and from above the contact-level dielectric layer 73 by performing an isotropic etch process that etches the at least one conductive material of the continuous electrically conductive material layer 46L. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79. Each backside cavity 79' continuous extends along the first horizontal direction hd1.

Figure 12:
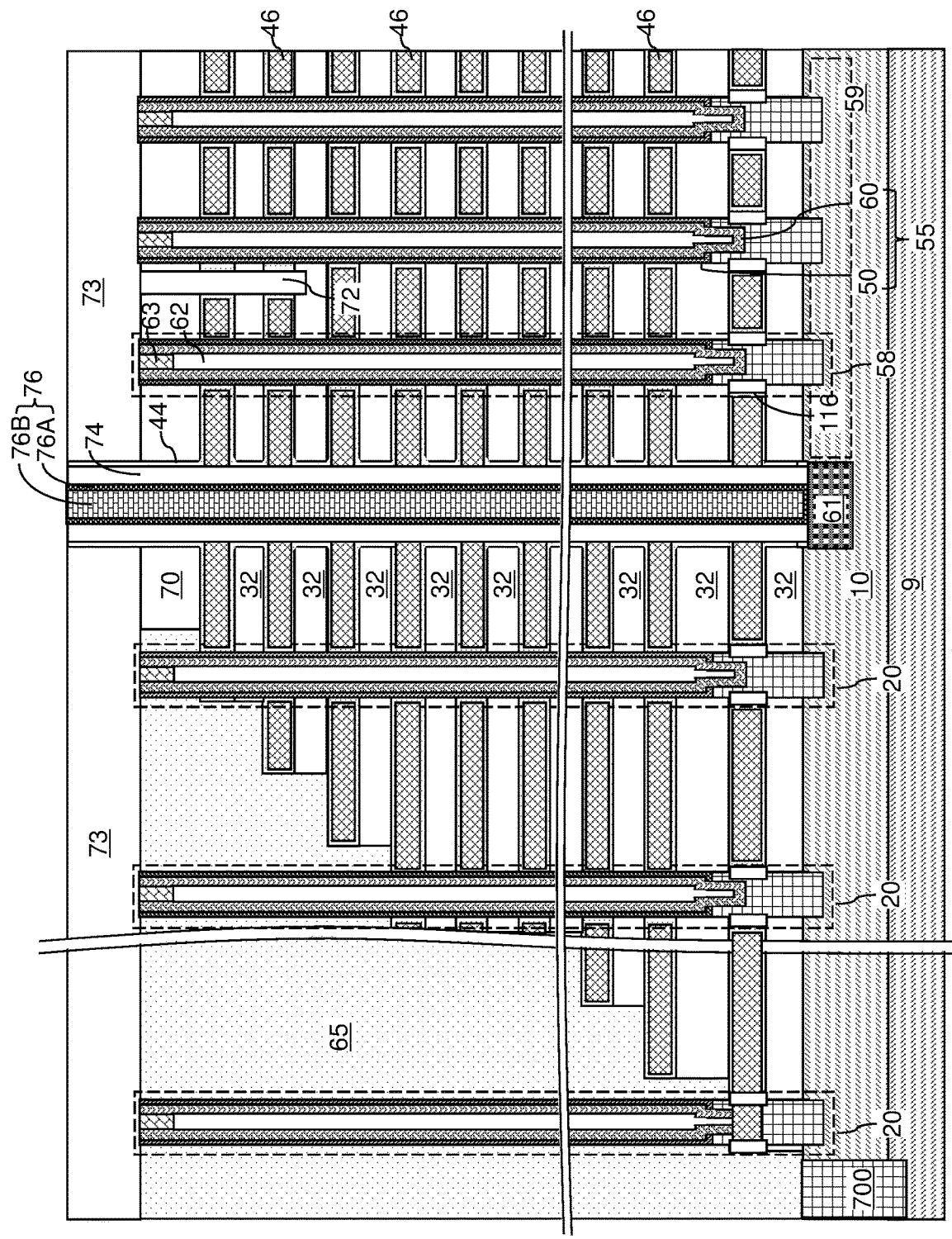
FIG. 12 is a schematic vertical cross-sectional view of the exemplary structure after formation of an insulating spacer and a backside contact structure according to an embodiment of the present disclosure.

Referring to FIG. 12, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 13A:
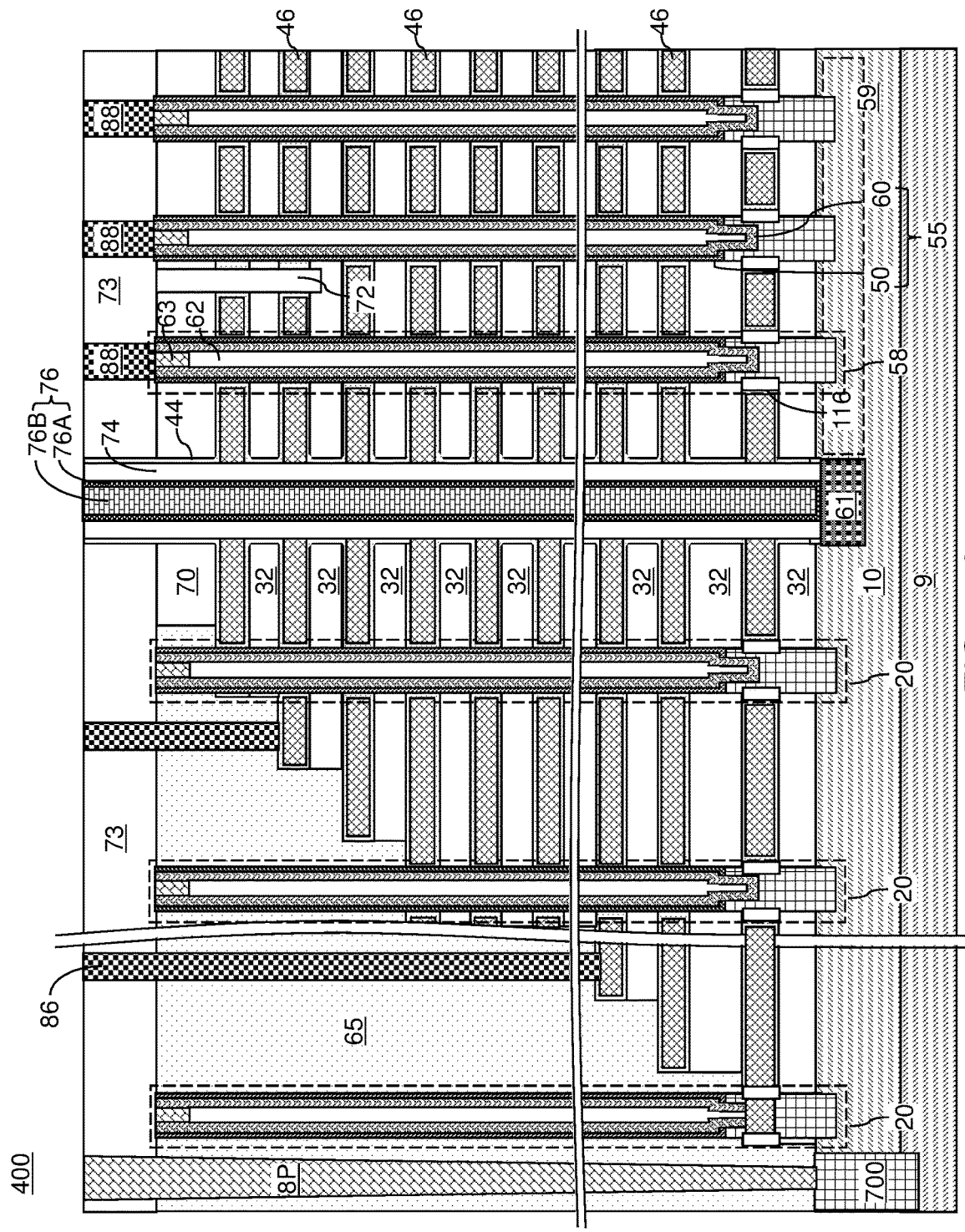
FIG. 13A is a schematic vertical cross-sectional view of the exemplary structure after formation of additional contact via structures according to an embodiment of the present disclosure.
Figure 13B:
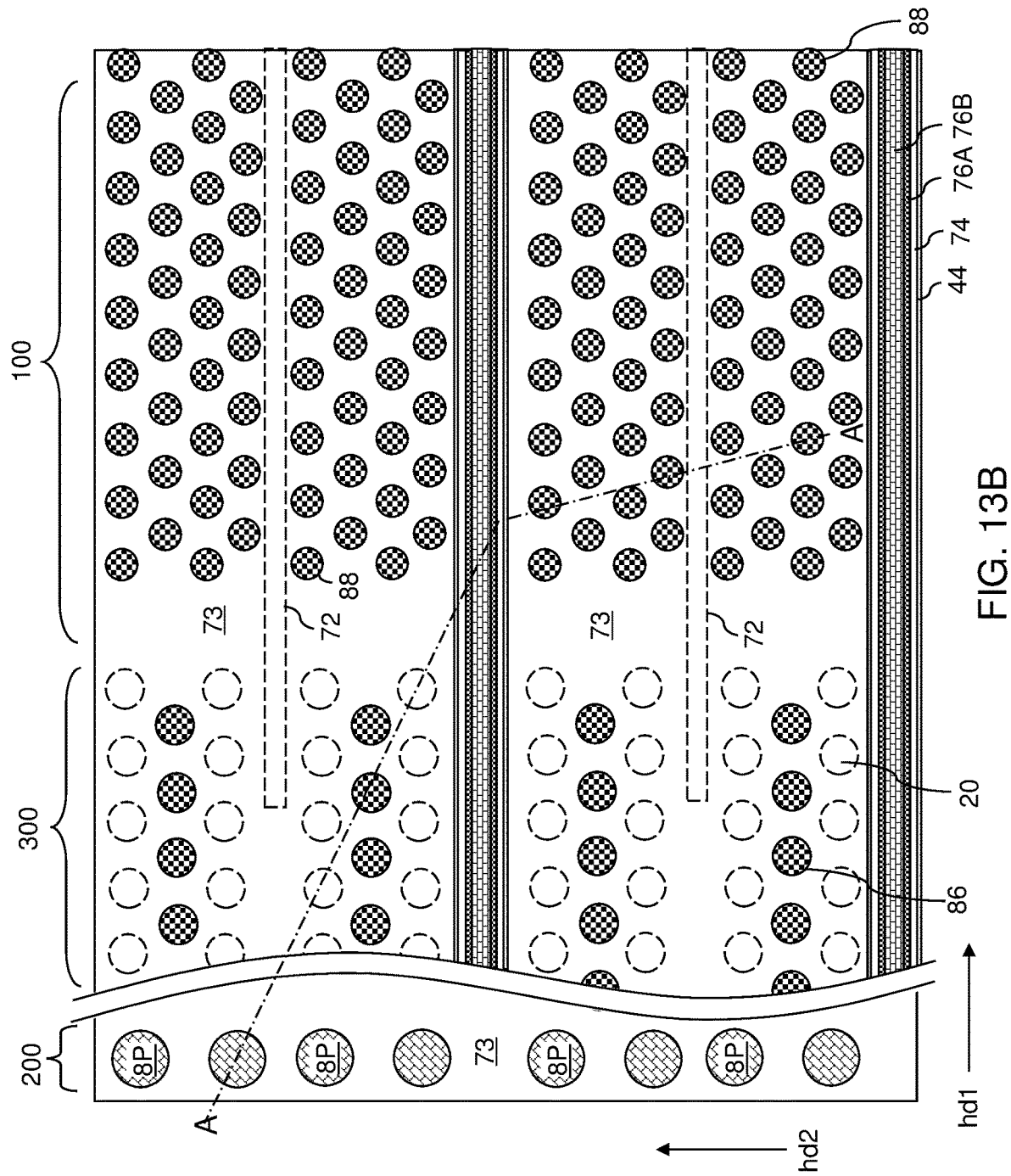
FIG. 13B is a top-down view of the exemplary structure of FIG. 13A. The vertical plane A-A' is the plane of the schematic vertical cross-sectional view of FIG. 13A.
Figure 13C:
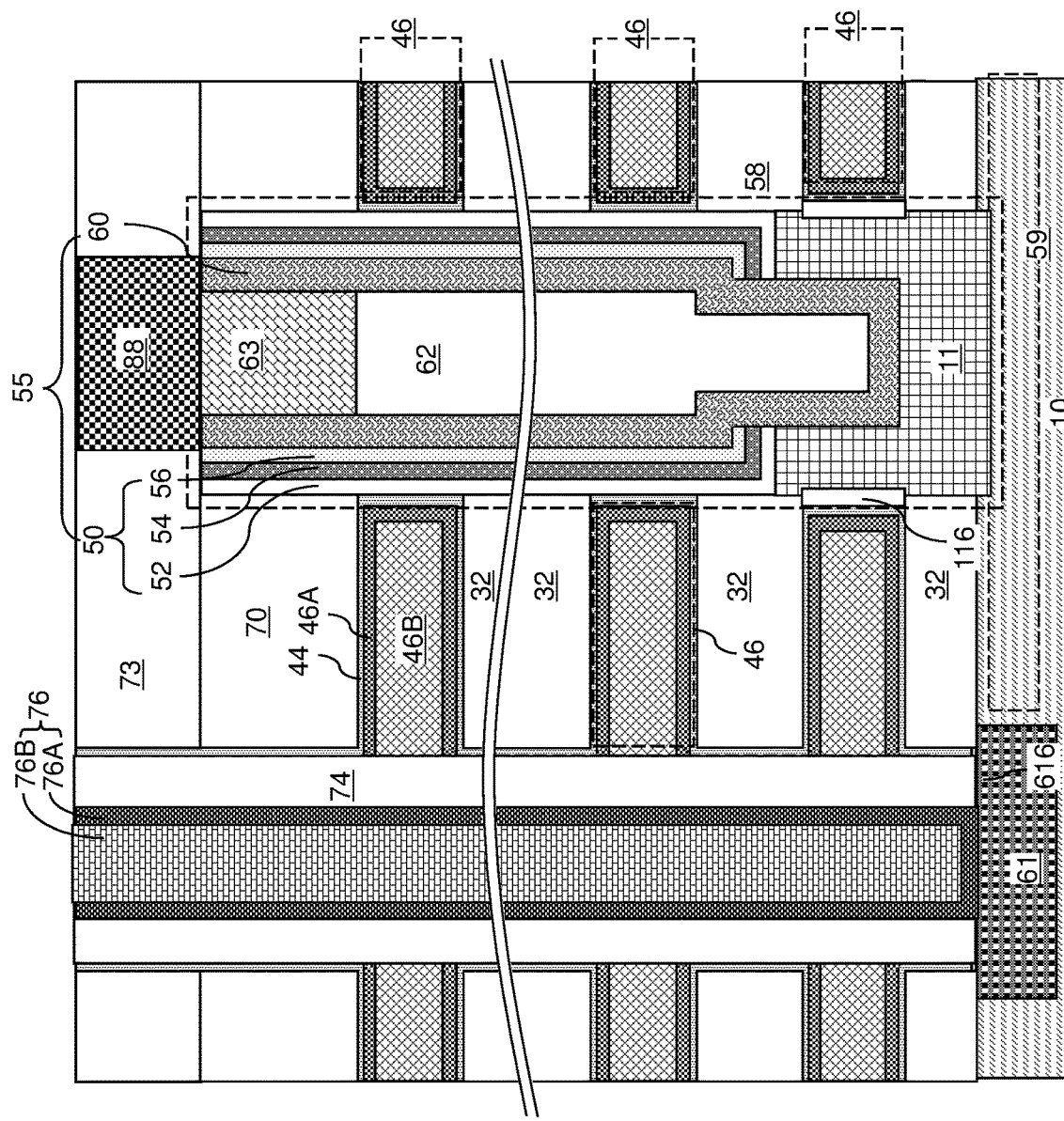
FIG. 13C is a magnified view of a region of the exemplary structure of FIG. 13A.
Figure 14A:
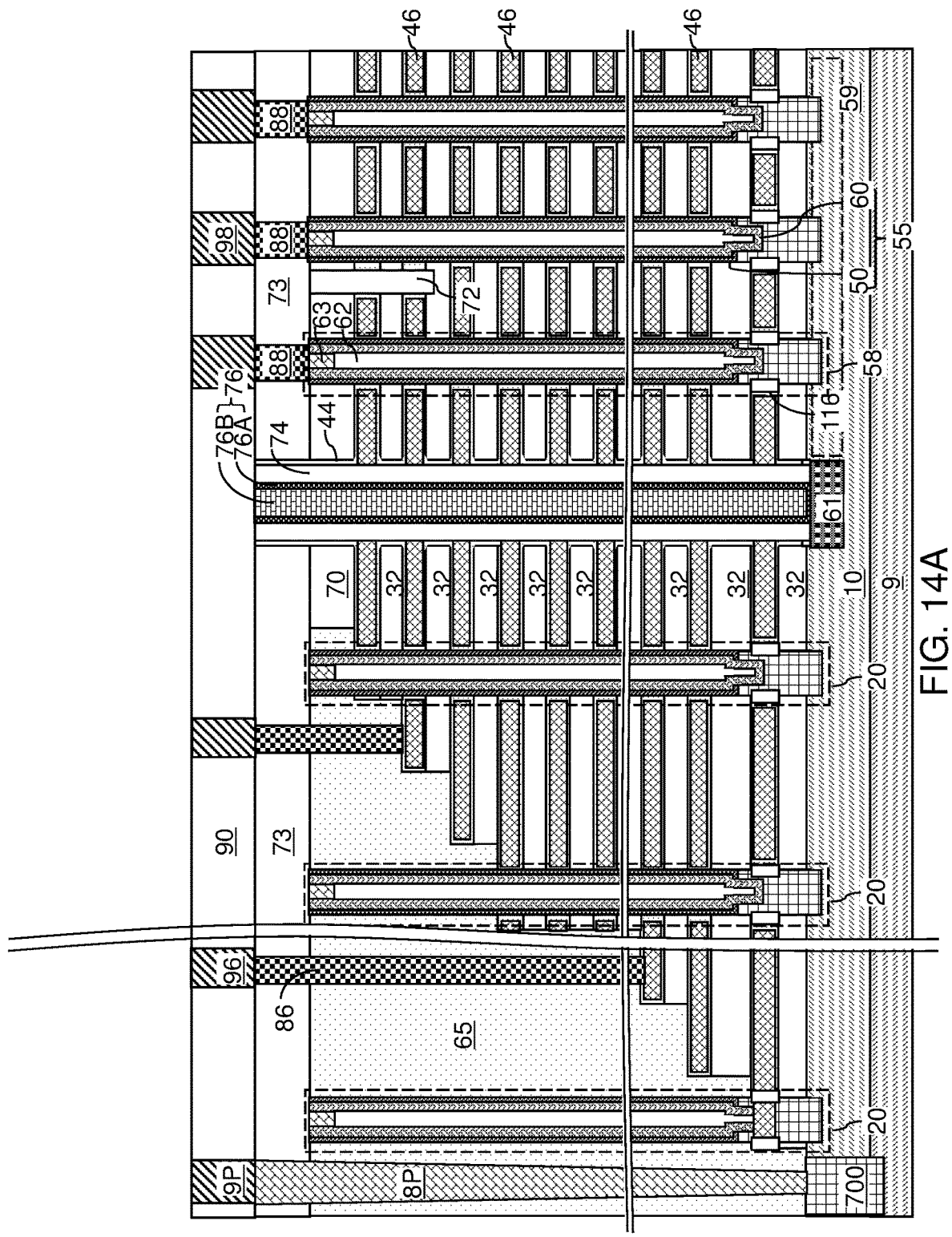
FIG. 14A is schematic vertical cross-sectional view of a first configuration of the exemplary structure after formation of a connection-level dielectric layer and connection-level via structures according to an embodiment of the present disclosure.
Figure 14B:
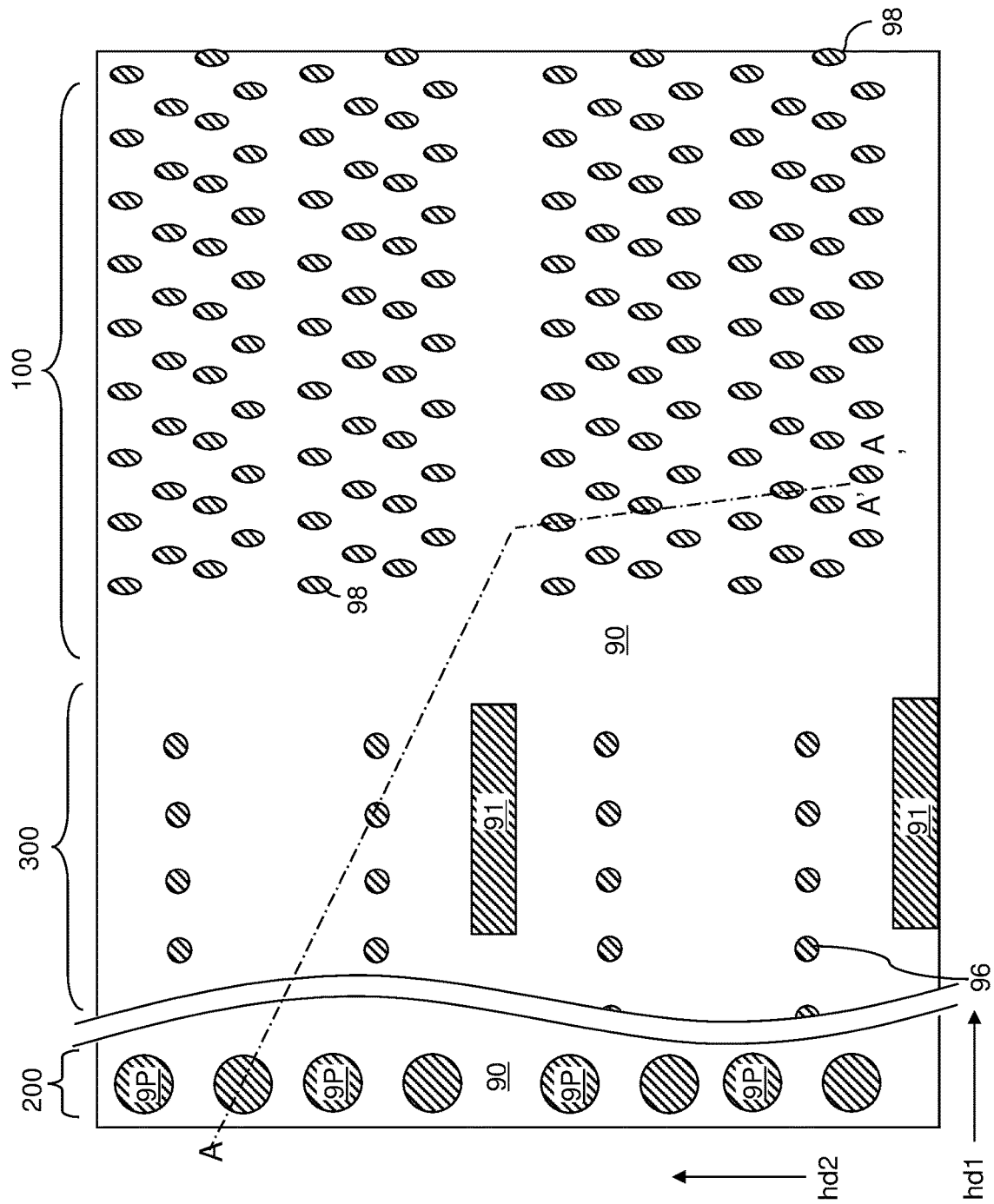
FIG. 14B is a top-down view of the first configuration of the exemplary structure of FIG. 14A. The vertical plane A-A' is the plane of the schematic vertical cross-sectional view of FIG. 14A.
Figure 14D:
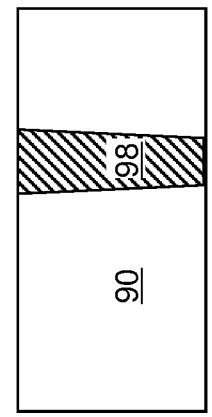
FIG. 14D is a vertical cross-sectional view of the first configuration of the exemplary structure along the vertical plane D-D' of FIG. 14C.
Figure 14C:
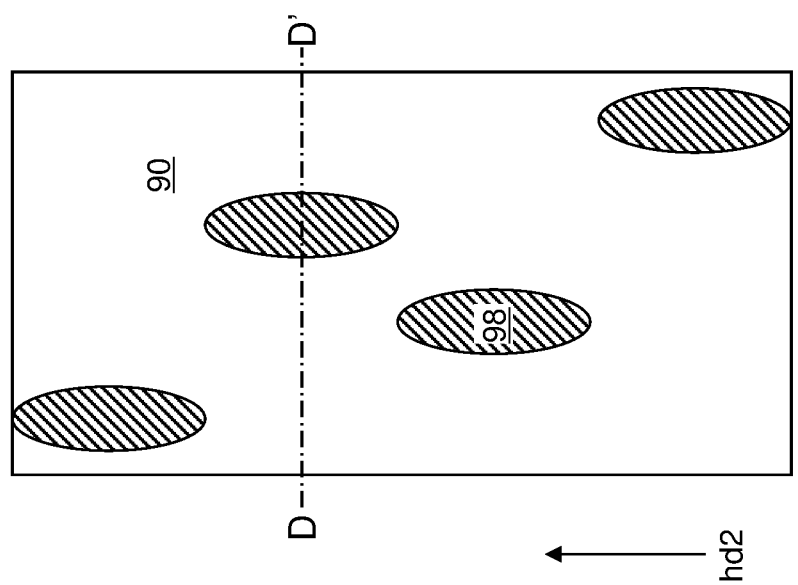
FIG. 14C is a top-down view of a region of the first configuration of the exemplary structure of FIG. 14A.

Referring to FIGS. 13A-13C, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Generally, a semiconductor device comprises a three-dimensional memory array 400 shown in FIG. 13A. The array 400 is formed over a substrate (9, 10) and includes an alternating stack of insulating layers 32 and electrically conductive layers 46 located over a substrate (9, 10); a two-dimensional array of memory openings 49 vertically extending through the alternating stack (32, 46); and a two-dimensional array of memory opening fill structures 58 located within the two-dimensional array of memory openings 49 and including a respective vertical semiconductor channel 60 and a respective vertical stack of memory elements (such as portions of the memory material layers 54 located at levels of the electrically conductive layers 46). The doped semiconductor material regions (such as the drain regions 63) are adjoined to a top end of a respective one of the vertical semiconductor channels 60. While the semiconductor device of the embodiment comprises a three-dimensional memory array, embodiments of the present disclosure can be practiced on any semiconductor structure including any suitable semiconductor device containing bit lines.

Referring to FIGS. 14A-14D, a connection-level dielectric layer 90 can be formed over the contact-level dielectric layer 73, or any underlying layer embedding contact via structures such as drain contact via structures 88 that contact the drain regions 63 (which are doped semiconductor regions). The connection-level dielectric layer 90 is a connection-level material layer comprised of at least one dielectric material. The connection-level dielectric layer 90 may include an interconnect-level dielectric material such as undoped silicate glass, a doped silicate glass, or organosilicate glass, or may include a sacrificial material (such as a semiconductor material or a carbon-based material) that is subsequently removed. The thickness of the connection-level dielectric layer 90 can be in a range from 100 nm to 1,000 nm, such as from 200 nm to 500 nm, although lesser and greater thicknesses may also be employed.

Connection via cavities can be formed through the connection-level dielectric layer 90 by depositing and lithographically patterning a photoresist layer over the connection-level dielectric layer 90, and transferring the pattern of openings in the photoresist layer through the connection-level dielectric layer 90 employing an anisotropic etch process. The photoresist layer can be subsequently removed, for example, by ashing.

At least one electrically conductive material can be deposited in the connection via cavities, and excess portions of the at least one electrically conductive material can be removed from above the horizontal plane including the top surface of the connection-level dielectric layer 90 by a planarization process, which may include a chemical mechanical planarization process and/or a recess etch process. Each remaining portion of the at least one electrically conductive material located within a respective one of the connection via cavities comprise connection-level via structures (98, 96, 9P). The connection-level via structures (98, 96, 9P) can comprise drain-side connection-level via structures 98 contacting a top surface of a respective one of the drain contact via structures 88, word-line-side connection-level via structures 96 contacting a top surface of a respective one of the word line contact via structures 86, source-side connection via structures 91 (shown in FIG. 14B) contacting the backside contact via structures 76, and peripheral-region connection via structures 9P contacting a top surface of a respective one of the peripheral device contact via structures 8P.

Generally, a combination of a connection-level material layer (such as the connection-level dielectric layer 90) and a two-dimensional array of connection via structures (such as the drain-side connection-level via structures 98) embedded in the connection-level material layer can be formed over the semiconductor device array. Each of the connection via structures within the two-dimensional array of connection via structures (such as the drain-side connection-level via structures 98) overlies, and is electrically connected to, a respective one of the doped semiconductor material regions (such as the drain regions 63). In one embodiment, the drain-side connection-level via structures 98 can be laterally elongated along a horizontal direction that is perpendicular to the lengthwise direction of the backside trenches 79. For example, the drain-side connection-level via structures 98 can be laterally elongated along the second horizontal direction (i.e., bit line direction) hd2, which is the lengthwise direction of bit lines to be subsequently formed.

Referring to FIGS. 15A-15D, a first configuration of the exemplary structure is illustrated after formation of bit lines 118. For example, a metallic material layer can be deposited over the connection-level dielectric layer 90. The metallic material layer includes, and/or consists essentially of, a high-conductivity metallic material such as tungsten, copper, molybdenum, cobalt, ruthenium, and combinations or alloys thereof. The metallic material layer may consist essentially of a single elemental metal or an intermetallic alloy. The metallic material layer can be deposited by physical vapor deposition, chemical vapor deposition, electroplating, electroless plating, or combinations thereof. The thickness of the metallic material layer may be in a range from 50 nm to 500 nm, such as from 100 nm to 250 nm, although lesser and greater thicknesses may also be employed. The metallic material of the metallic material layer may be deposited directly on the top surfaces of the connection-level via structures (98, 96, 9P) without use of any metallic barrier layer (such as a TiN layer, a TaN layer, or a WN layer). Alternatively, a metallic barrier layer (such as a TiN layer, a TaN layer, or a WN layer) may be formed on the top surfaces of the connection-level via structures (98, 96, 9P) followed by forming the metallic material layer (e.g., tungsten) on the metallic barrier layer.

A photoresist layer (not illustrated) can be applied over the metallic material layer, and can be lithographically patterned with a periodic line-and-space pattern with lines laterally extending along the second horizontal direction hd1. An anisotropic etch process can be performed to transfer the pattern in the photoresist layer through the metallic material layer. Remaining patterned portion of the metallic material layer comprise bit lines 118 that are formed in the memory array region 100 and additional via-level metal interconnect structures (111, 115, 11P) that are formed in the contact region 300 and in the peripheral device region 200. The additional via-level metal interconnect structures (111, 115, 11P) can include, for example, word-line-side connection line structures 115 contacting the word-line-side connection-level via structures 96, source-side connection line structures 111 contacting the source-side connection via structures 91, and peripheral connection line structures 11P contacting the peripheral-region connection via structures 9P.

In one embodiment, the bit lines 118 can be formed as a one-dimensional periodic array of bit lines 118 over the connection-level dielectric layer 90. In one embodiment, the sidewalls of the bit lines 118 can have a non-zero taper angle as measured from a vertical direction. The non-zero-taper angle may be in a range from 0.01 degree to 5 degrees, such as from 0.1 degree to 2 degrees. In one embodiment, each of the bit lines 118 can have a trapezoidal vertical cross-sectional shape within vertical planes that are parallel to the first horizontal direction hd1 and perpendicular to the second horizontal direction hd2. The trapezoidal vertical cross-sectional shape can be invariant along the second horizontal direction hd1. Inter-bit-line trenches 117 can be formed between each laterally-neighboring pair of bit lines 118.

In one embodiment shown in FIG. 15D, portions of the connection-level dielectric layer 90 are etched underneath the inter-bit-line trenches 117, which are the spaces between neighboring pairs of the bit lines 118. The anisotropic etch process can include a terminal etch step that etches the dielectric material of the connection-level dielectric layer 90. In this case, the bottom surfaces of the inter-bit-line trenches 117 can be formed below the horizontal plane including the topmost surfaces of the connection-level dielectric layer 90. The vertical recess distance between the recessed surfaces of the connection-level dielectric layer 90 (underlying the inter-bit-line trenches 117) and the horizontal plane including the topmost surfaces of the connection-level dielectric layer 90 can be in a range from 10 nm to 500 nm, such as from 50 nm to 250 nm, although lesser and greater vertical recess distances may also be employed. In one embodiment, unmasked portions of the drain-side connection-level via structures 98 may be collaterally etched during the anisotropic etch process.

The inter-bit-line trenches 117 may be relatively narrow, such that the bit lines 118 are relatively closely spaced. In one optional embodiment, the bit lines 118 comprise tungsten if the bit lines are spaced by a distance less than a distance required for form copper bit lines by a damascene process. Therefore, as will be described below, air gaps are formed in the inter-bit-line trenches 117 to reduce the bit line related resistance*capacitance (RC) delay. Specifically, if the bit line half-pitch becomes less than 18 nm, it becomes difficult to form copper bit lines by a damascene process because of the copper plating process difficulty. Tungsten may be used if the bit line half-pitch becomes less than 18 nm. However, tungsten has higher a resistivity than copper. Therefore, to reduce the RC delay, low capacitance air gaps may be formed between the bit lines.

A one-dimensional array of bit lines 118 is formed such that each of the bit lines 118 contacts top surfaces of a respective subset of the connection via structures 98. The connection-level dielectric layer 90 laterally surrounds a lower portion of each of the connection via structures 98. The connection-level dielectric layer 90 comprises topmost surfaces contacting a respective one of the bit lines 118 and recessed horizontal surfaces located below the horizontal plane including the bottom surfaces of the bit lines 118. The recessed horizontal surfaces of the connection-level dielectric layer 90 comprises bottom surfaces of the inter-bit-line trenches 117.

In one embodiment, the bit lines 118 are laterally spaced apart along the first horizontal direction (i.e., word line direction) hd1 and laterally extend along the second horizontal direction (i.e., bit line direction) hd2 that is perpendicular to the first horizontal direction hd1. In one embodiment, the bit lines 118 have a trapezoidal vertical cross-sectional shape within vertical planes that are perpendicular to the second horizontal direction hd2. The trapezoidal vertical cross-sectional shape has a lesser width at top than at bottom. However, other bit line shapes may be used.

In one embodiment shown in FIG. 15D, at least one of the connection via structures 98 (e.g., one or more than one structure 98) may have a respective vertical cross-sectional shape within a vertical plane that is perpendicular to the second horizontal direction hd2 in which: an upper portion 98U of the vertical cross-sectional shape has an upright trapezoidal profile in which a width of the upper portion of the vertical cross-sectional shape decreases with a vertical distance from the substrate (9, 10), and a lower portion 98L of the vertical cross-sectional shape has a reverse trapezoidal profile in which a width of the lower portion of the vertical cross-sectional shape increases with the vertical distance from the substrate (9, 10). In one embodiment, the sidewalls of the upper portion 98U of the vertical cross-sectional shape may be adjoined to sidewalls of the lower portion 98L of the vertical cross-sectional shape by at least one horizontally-extending recessed surfaces 98R the same connection via structures 98.

Referring to FIGS. 16A and 16B, a dielectric liner 108 comprising a dielectric material can be deposited over the bit lines and over recessed surfaces of the connection-level dielectric layer 90. The dielectric liner 108 includes a dielectric material that can provide higher etch resistivity than the material of the connection-level dielectric layer 90. In one embodiment, the connection-level dielectric layer 90 comprises, and/or consists essentially of, porous or non-porous organosilicate glass, and the dielectric liner 108 comprises, and/or consists essentially of, silicon oxide, silicon oxynitride, a nitrogen-doped non-porous organosilicate glass, or silicon nitride. In another embodiment, the connection-level dielectric layer 90 comprises, and/or consists essentially of, undoped silicate glass or a doped silicate glass, and the dielectric liner 108 comprises, and/or consists essentially of, silicon nitride, a nitrogen-doped non-porous organosilicate glass, or a dielectric metal oxide material. The dielectric liner 108 continuously extends over, and contacts, top surfaces and sidewalls of the bit lines and sidewalls and recessed horizontal surfaces of the connection-level dielectric layer, wherein top surfaces of horizontally-extending portions of the dielectric liner that overlie the recessed horizontal surfaces of the of the connection-level dielectric layer are located within the second horizontal plane. The dielectric liner 108 may be deposited by a conformal or a non-conformal deposition process, and the lateral thickness of the dielectric liner 108 on sidewalls of the bit lines 118 can be in a range from 1 nm to 30 nm, such as from 3 nm to 10 nm, although lesser and greater thicknesses may also be employed.

Figure 17B:
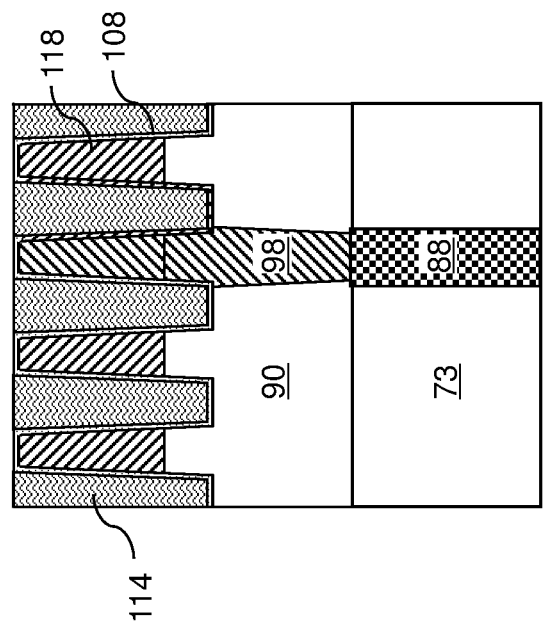
FIG. 17B is a vertical cross-sectional view of the first configuration of the exemplary structure according to the vertical plane B-B' of FIG. 17A.
Figure 17A:
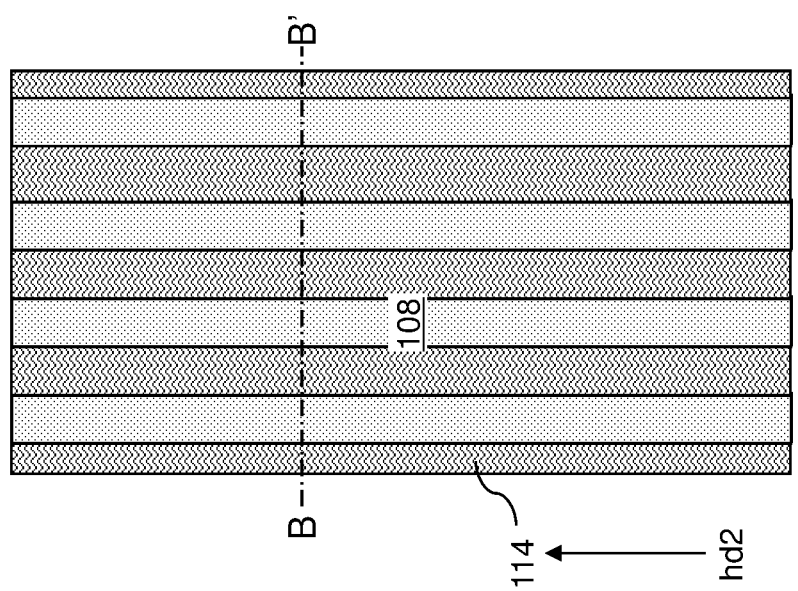
FIG. 17A is a top-down view of a region of the first configuration of the exemplary structure after formation of a bit-line-level sacrificial fill layer according to an embodiment of the present disclosure.

Referring to FIGS. 17A and 17B, a bit-line-level sacrificial fill layer 114 comprising a sacrificial fill material that can be removed selective to the material of the dielectric liner 108 can be deposited in the inter-bit-line trenches 117. The bit-line-level sacrificial fill layer 114 may include amorphous silicon, polysilicon, silicon-germanium, germanium, amorphous carbon, diamond-like carbon (DLC), or an organic or inorganic polymer material that may be subsequently removed selective to the material of the dielectric liner 108. The sacrificial fill material of the bit-line-level sacrificial fill layer 114 can be deposited, for example, by a chemical vapor deposition or spin coating. In required, then excess portions of the sacrificial fill material, such as amorphous silicon, can be removed from above the horizontal plane including the topmost surfaces of the dielectric liner 108 by a planarization process such as a chemical mechanical polishing process. The remaining portions of the sacrificial fill material filling the inter-bit-line trenches 117 constitutes the bit-line-level sacrificial fill layer 114.

Referring to FIGS. 18A and 18B, an interconnect-level dielectric material layer can be deposited over the bit-line-level sacrificial fill layer 114. The interconnect-level dielectric material layer is herein referred to as a via-level dielectric material layer 122. The via-level dielectric material layer 122 includes an interconnect-level dielectric (ILD) material such as undoped silicate glass (i.e., silicon oxide) or a doped silicate glass. Optionally, a dielectric liner (not illustrated) such as a silicon nitride liner or a dielectric metal oxide liner may be deposited prior to deposition of the via-level dielectric material layer 122. The thickness of the via-level dielectric material layer 122 can be in a range from 100 nm to 1,000 nm, such as from 200 nm to 500 nm, although lesser or greater thicknesses may also be employed.

A photoresist layer (not shown) can be applied over the via-level dielectric material layer 122, and can be lithographically patterned to form openings over the bit lines 118. In one embodiment, the openings may be cylindrical openings or elongated openings that laterally extend along the second horizontal direction hd2 over the areas of the bit lines 118. An anisotropic etch process can be performed to transfer the pattern of the openings in the photoresist layer through the via-level dielectric material layer 122 and the underlying dielectric liner 108. Connection via cavities 129 are formed in the via-level dielectric material layer 122. The connection via cavities 129 may have any suitable shape, such as a cylindrical shape or an elongated shape which laterally extends along the second horizontal direction hd2 over the areas of the bit lines 118. A top surface of a bit line 118 is physically exposed at the bottom of each connection via cavity 129. Top surfaces of segments of the dielectric liner 108 and surfaces of the bit-line-level sacrificial fill layer 114 can be physically exposed underneath one or more of the connection via cavities 129. The photoresist layer can be subsequently removed, for example, by ashing.

Figure 19B:
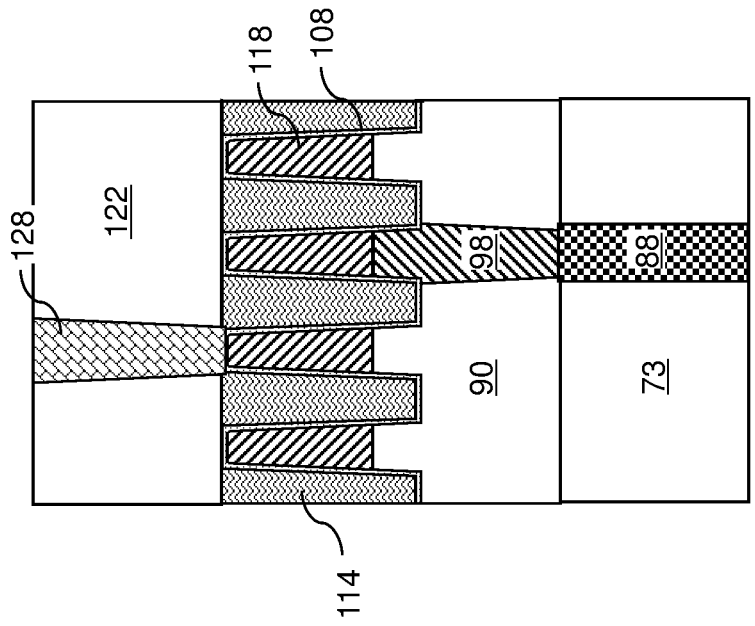
FIG. 19B is a vertical cross-sectional view of the first configuration of the exemplary structure according to the vertical plane B-B' of FIG. 19A.
Figure 19A:
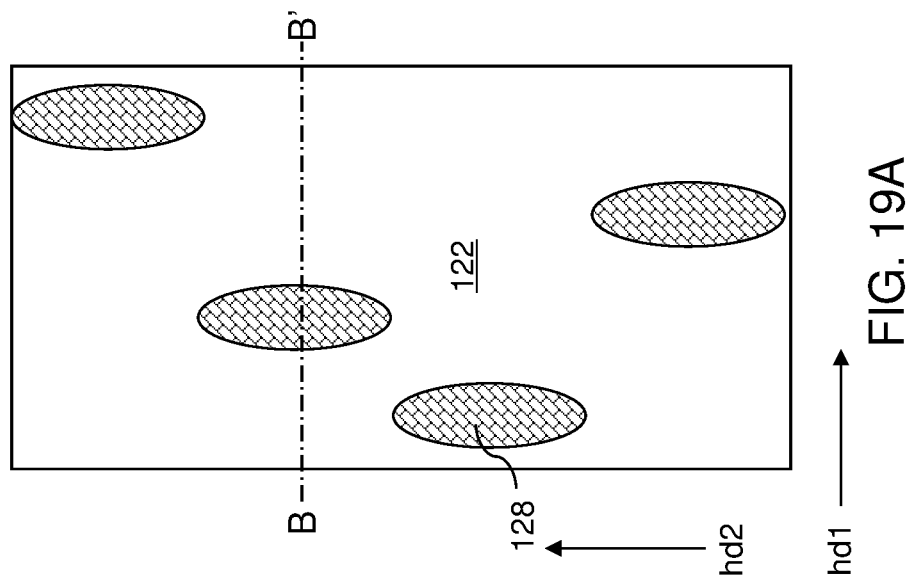
FIG. 19A is a top-down view of a region of the first configuration of the exemplary structure after formation of conductive via structures in the connection via cavities according to an embodiment of the present disclosure.

Referring to FIGS. 19A and 19B, at least one conductive material such as a combination of an optional metallic barrier liner and a metallic fill material layer can be deposited in the connection via cavities 129. The metallic barrier liner may comprise a metallic nitride material such as TiN, TaN, and/or WN. The metallic fill material layer may comprise a metallic fill material such as W, Cu, Mo, Ru, Ti, Ta, Co, etc. Excess portions of the at least one conductive material can be removed from above the horizontal plane including the top surface of the via-level dielectric material layer 122 by a planarization process such as a chemical mechanical polishing process. Each remaining portion of the at least one conductive material (which may be at least one metallic material) constitutes a conductive via structure 128, which may be a metallic via structure. Each conductive via structure 128 can contact a top surface of a respective one of the bit lines 118. Each conductive via structure 128 can have any suitable shape, such as a cylindrical shape (including a tapered cylindrical shape) or an elongated shape which laterally extends along the second horizontal direction hd2 over the areas of the bit lines 118.

Figure 20B:
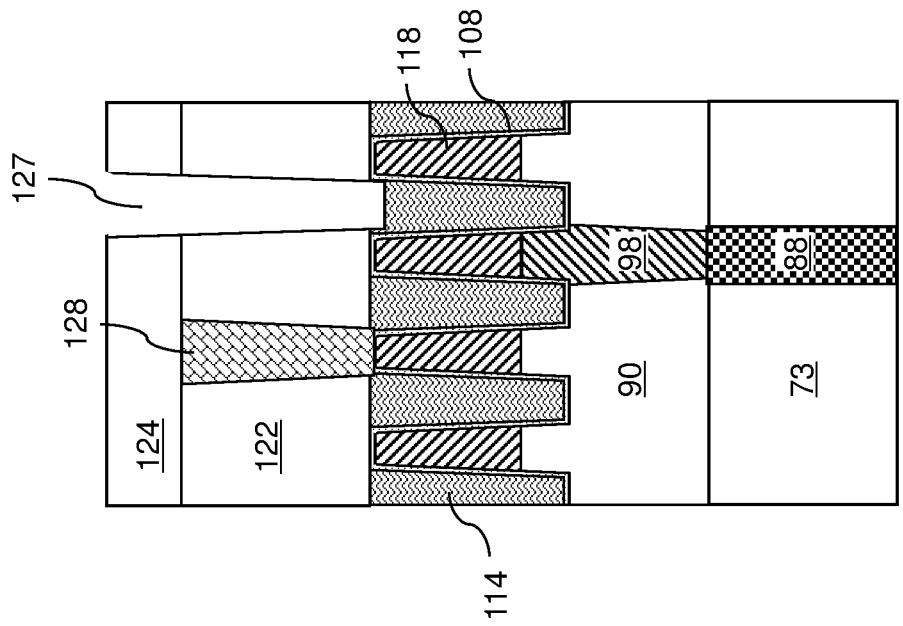
FIG. 20B is a vertical cross-sectional view of the first configuration of the exemplary structure according to the vertical plane B-B' of FIG. 20A.
Figure 20A:
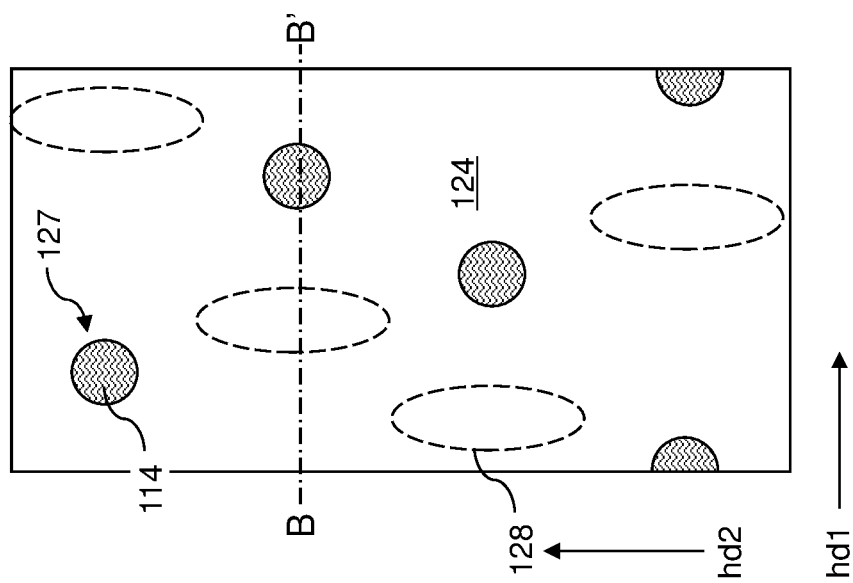
FIG. 20A is a top-down view of a region of the first configuration of the exemplary structure after formation of an upper-level material layer and openings vertically extending through the upper-level material layer and the via-level dielectric material layer according to an embodiment of the present disclosure.

Referring to FIGS. 20A and 20B, an additional interconnect-level dielectric material layer can be optionally deposited over the via-level dielectric material layer 122. The additional interconnect-level dielectric material layer is herein referred to as an upper-level material layer 124. The upper-level material layer 124 may include a dielectric material such as silicon oxide, silicon oxynitride, silicon nitride, a nitrogen-doped organosilicate glass, or a dielectric metal oxide. Alternatively, the upper-level material layer 124 may include a sacrificial material (such as amorphous silicon, polysilicon, a silicon-germanium alloy, germanium, amorphous carbon, diamond-like carbon (DLC), etc.) that can be subsequently removed, for example, by etching or ashing. The thickness of the upper-level material layer 124 may be in a range from 20 nm to 1,000 nm, such as from 100 nm to 500 nm, although lesser or greater thicknesses may also be employed. In one embodiment, the upper-level material layer 124 may be a line-level dielectric material layer in which metal lines (not shown) may be subsequently formed.

A photoresist layer (not shown) can be applied over the upper-level material layer 124, and can be lithographically patterned to form openings in areas that overlie the sacrificial fill material of the bit-line-level sacrificial fill layer 114. An anisotropic etch process can be performed to transfer the pattern of the openings in the photoresist layer through the upper-level material layer 124. Openings 127 vertically extending through the upper-level material layer 124 and the via-level dielectric material layer 122 down to a top surface of a respective portion of the bit-line-level sacrificial fill layer 114. The openings 127 vertically extending through the upper-level material layer 124 and the via-level dielectric material layer 122 are subsequently employed as conduits for an isotropic etchant during a subsequently isotropic etch process, and thus, is herein referred to as conduit openings. In one embodiment, the conduit openings 127 can have straight sidewalls vertically extending from the top surface of the upper-level material layer 124 (or from the top surface of the via-level dielectric material layer 122 in case the upper-level material layer 124 is not employed) to a top surface of a respective physically exposed portion of the bit-line-level sacrificial fill layer 114. The photoresist layer may be subsequently removed, for example, by ashing.

Figure 21B:
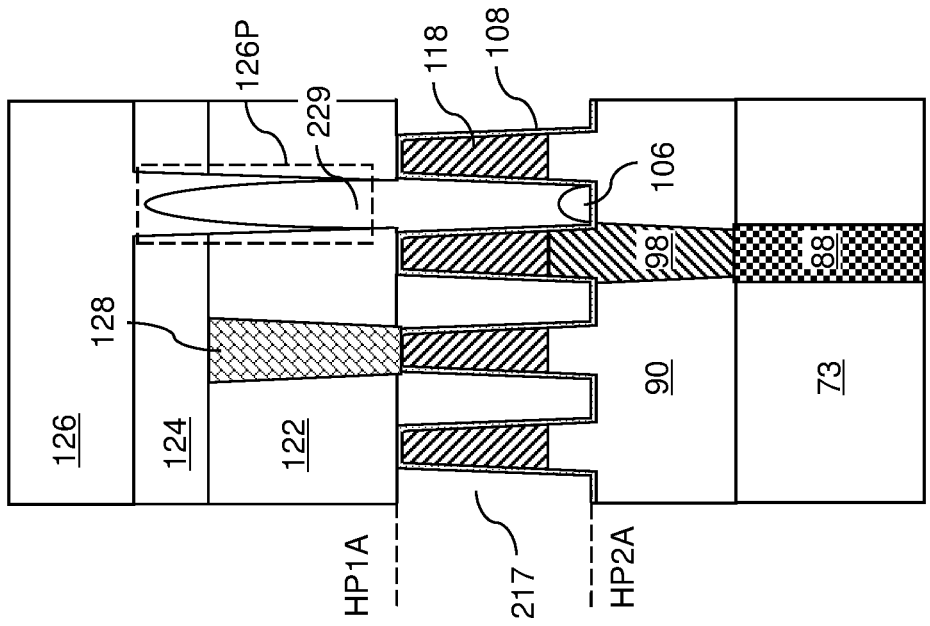
FIG. 21B is a vertical cross-sectional view of the first configuration of the exemplary structure according to the vertical plane B-B' of FIG. 21A.
Figure 21A:
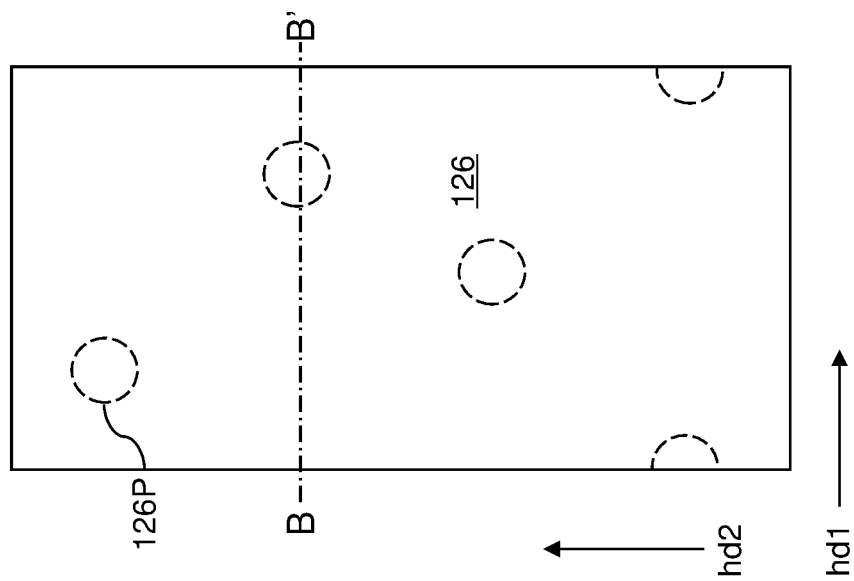
FIG. 21A is a top-down view of a region of the first configuration of the exemplary structure after formation of a multi-level via cavity and a capping-level dielectric layer according to an embodiment of the present disclosure.

Referring to FIGS. 21A and 21B, the sacrificial fill material of the bit-line-level sacrificial fill layer 114 can be removed selective to the materials of the dielectric liner 108, the via-level dielectric material layer 122, and the upper-level material layer 124 by performing an isotropic etch process through the conduit openings 127. The isotropic etch process may employ a wet etch process or an ashing process. For example, if the sacrificial fill material of the bit-line-level sacrificial fill layer 114 comprises a semiconductor material, such as amorphous silicon, such as a wet etch process employing hot trimethyl-2 hydroxyethyl ammonium hydroxide ("hot TMY"), tetramethyl ammonium hydroxide (TMAH), potassium hydroxide (KOH), or a combination of dilute hydrofluoric acid and hydrogen peroxide (in case the semiconductor material comprises germanium) may be performed. If the sacrificial fill material of the bit-line-level sacrificial fill layer 114 comprises amorphous carbon or diamond-like carbon (DLC), an ashing process employing oxygen ambient may be performed to remove the sacrificial fill material of the bit-line-level sacrificial fill layer 114. The remaining dielectric liner 108 protects the sidewalls of the bit lines 118 from the etchant.

Generally, the bit-line-level sacrificial fill layer 114 can be removed by introducing an isotropic etchant or an anisotropic reactant (such as oxygen gas) that removes the sacrificial fill material through the openings 127 in the via-level dielectric material layer 122. A multi-level cavity 217 is formed, which vertically extends from a first horizontal plane HP1A including, or located above, top surfaces of the bit lines 118 to a second horizontal plane HP2A located below a horizontal plane including bottom surfaces of the bit lines 118. The multi-level cavity 217 laterally surrounds each of the bit lines 118 and may optionally laterally surround at least an upper portion 98U of each of the connection via structures 98. In one embodiment, the first horizontal plane HP1A may be located above the top surfaces of the bit lines 118 in case topmost horizontal portions of the dielectric liner 108 is interposed between the bit lines and the via-level dielectric material layer 122. In another embodiment, the topmost horizontal portions of the dielectric liner 108 may be removed during the chemical mechanical polishing process of FIGS. 17A and 17B, and the first horizontal plane HP1A may be located within the horizontal plane including the top surfaces of the bit lines 118.

In one embodiment, the isotropic etchant etches the sacrificial fill material selective to a material of the dielectric liner 108, and the multi-level cavity 217 is laterally bounded by vertically-extending portions of the dielectric liner 108. The multi-level cavity 217 vertically extends more than the thickness of the level of the bit lines 118, i.e., has a greater vertical extent than the vertical extent of the bit lines 118. Specifically, the multi-level cavity 217 vertically extends through the entire height range of the bit lines 118, and vertically extends downward partly into an upper region of the level of the connection-level dielectric layer 90.

A capping-level material layer 126 can be formed over the via-level dielectric material layer 122 (and over the upper-level material layer 124 if present) by anisotropically depositing a dielectric material or a semiconductor material, for example, employing plasma-enhanced chemical vapor deposition. The dielectric material of the capping-level material layer 126 may include silicon oxide, silicon nitride, organosilicate glass, and/or combinations thereof or derivatives therefrom. The semiconductor material of the capping-level material layer 126 may include amorphous silicon deposited using p-SiH$_4$. The dielectric or semiconductor material is anisotropically deposited on sidewalls of the conduit openings 127 through the via-level dielectric material layer 122 (and the upper-level material layer 124) to seal off each of the conduit openings 127. More material is deposited in the upper region of each conduit opening 127 than in the lower region of each conduit opening 127 due to the anisotropic nature of the deposition process employed to deposit the material. Each conduit openings 127 includes a respective unfilled volume, i.e., a cavity (e.g., air gap). Thus, each conduit opening 127 may also be referred to as a "cavity-containing opening" 127. Thus, the capping-level material layer 126 comprises downward-protruding portions 126P that extend into peripheral regions of the conduit openings (i.e., the cavity-containing openings) 127. In other words, the portions of the capping-level material layer 126 which extend into and are located on the sidewalls of the conduit opening 127 comprise the downward-protruding portions 126P. The thickness of the downward-protruding portions 126P becomes thinner toward their bottom sides. The thickness of a horizontally-extending portion of the capping-level material layer 126 overlying the top surface of the upper-level material layer 124 may be in a range from 200 nm to 1,000 nm, although lesser and greater thicknesses may also be employed.

In one embodiment, each volume of the cavity-containing openings that is not filled with a respective downward-protruding portion 126P of the capping-level material layer 126 comprises a respective via-level cavity (i.e., air gap) 229 that is adjoined to a top portion of the multi-level cavity (i.e., air gap) 217 and is free of any solid phase material. In other words, the conduit opening 127 is joined with the multi-level cavity 217 to form a continuous air gap. In FIG. 21B, the top end of the continuous air gap (e.g., the top end of the via-level cavity 229) does not extend above the bottom surface of capping-level material layer 126 (i.e., above the top surface of layer 124). However, in an alternative embodiment, the top end of the continuous air gap (e.g., the top end of the via-level cavity 229) may extend above the bottom surface of capping-level material layer 126 (i.e., above the top surface of layer 124) depending on the material of layer 126 and the shape of the air gap.

Each volume of the cavity-containing openings that is not filled with a respective downward-protruding portion 126P of the capping-level material layer 126 comprises a respective via-level cavity 229 (i.e., an upper air gap comprising an unfilled volume of a conduit opening) that is adjoined to a top portion of the multi-level cavity (i.e., a lower air gap) 217. In one embodiment, each via-level cavity 229 has a variable horizontal cross-sectional area that increases with a vertical distance from a horizontal plane including a planar bottom surface of the capping-level material layer 126. In one embodiment, a periphery of a horizontal cross-sectional shape of each via-level cavity 229 coincides with a periphery of a respective one of the cavity-containing openings (i.e., the conduit opening 127) within a horizontal plane including a bottom surface of the via-level dielectric material layer 122. In other words, the bottommost portions of the downward-protruding portion 126P may be located at or above the horizontal plane including the bottom surface of the via-level dielectric material layer 122. Alternatively, a small amount of the downward-protruding portions 126P may also be deposited on the sidewalls of the bit lines 118. In this case, the bottommost portions of the downward-protruding portion 126P may be located below the horizontal plane including the bottom surface of the via-level dielectric material layer 122.

In one embodiment, the capping-level material layer 126 comprises a horizontally-extending portion that overlies a top surface of the via-level dielectric material layer 122 and having a same material composition as the downward-protruding portions 126P of the capping-level material layer 126. Portions of the material that pass through the conduit openings 127 in the via-level dielectric material layer 122 may be deposited in underlying surfaces of the dielectric liner 108. In this case, an array of discrete dielectric material portions 106 having a same material composition as the capping-level material layer 126 can be located below the conduit openings 127. The discrete dielectric material portions 106 can have a respective bottom surface within the second horizontal plane HP2A, and can have a variable thickness that decreases radially from a geometrical center thereof.

The connection-level dielectric layer 90 can laterally surround a lower portion 90L of each of the connection via structures 98. The connection-level dielectric layer 90 comprises topmost surfaces contacting a respective one of the bit lines 118 and recessed horizontal surfaces located below the horizontal plane including the bottom surfaces of the bit lines 118.

In one embodiment, a dielectric liner 108 comprising a dielectric material can continuously extend over, and can contact, top surfaces and sidewalls of the bit lines 118 and sidewalls and recessed horizontal surfaces of the connection-level dielectric layer 90. In one embodiment, top surfaces of horizontally-extending portions of the dielectric liner 108 that overlie the recessed horizontal surfaces of the of the connection-level dielectric layer 90 are located within the second horizontal plane HP2A.

Figure 15A:
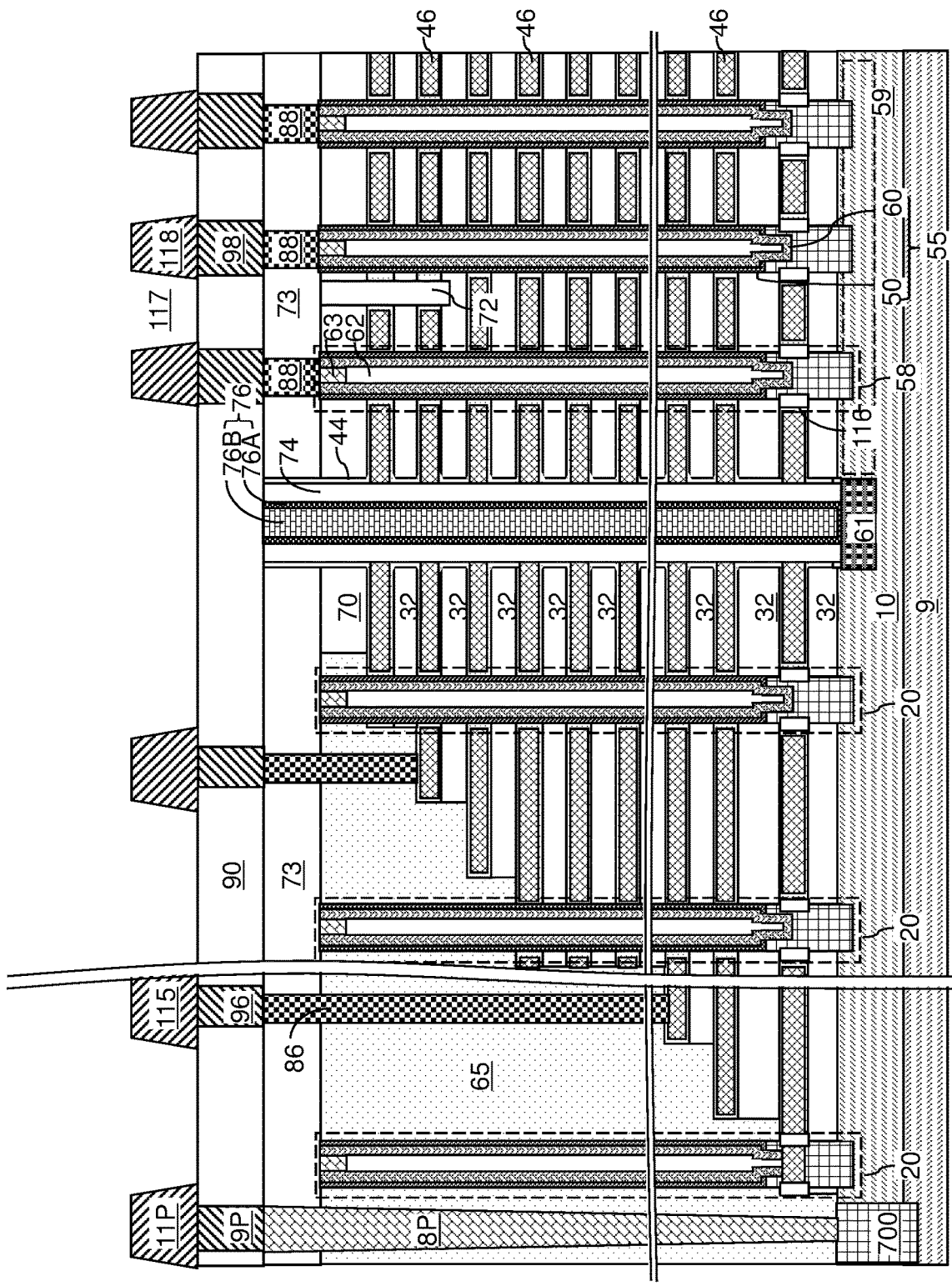
FIG. 15A is schematic vertical cross-sectional view of a first configuration of the exemplary structure after formation of bit lines according to an embodiment of the present disclosure.
Figure 15B:
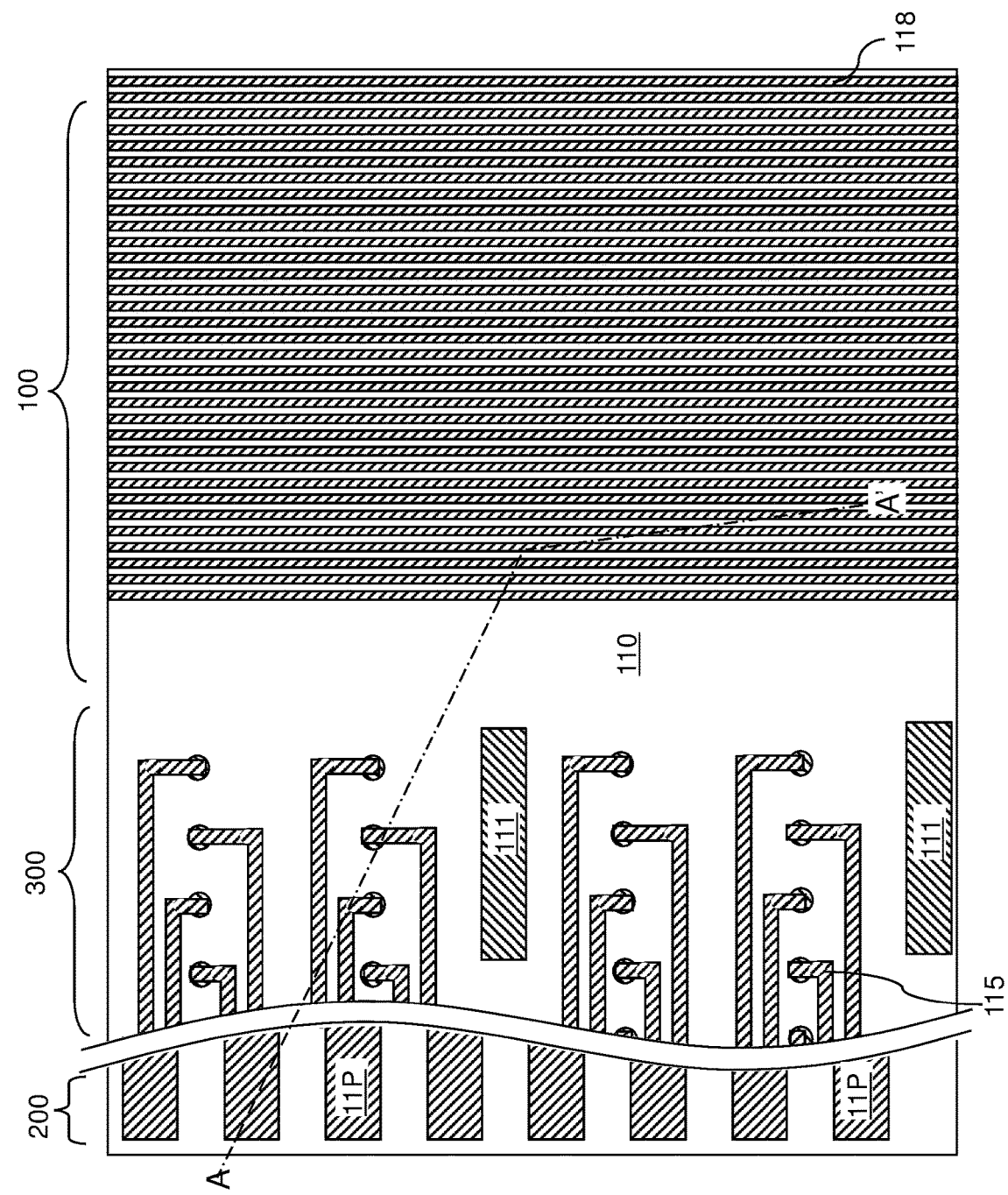
FIG. 15B is a top-down view of the first configuration of the exemplary structure of FIG. 15A. The vertical plane A-A' is the plane of the schematic vertical cross-sectional view of FIG. 15A.
Figure 22B:
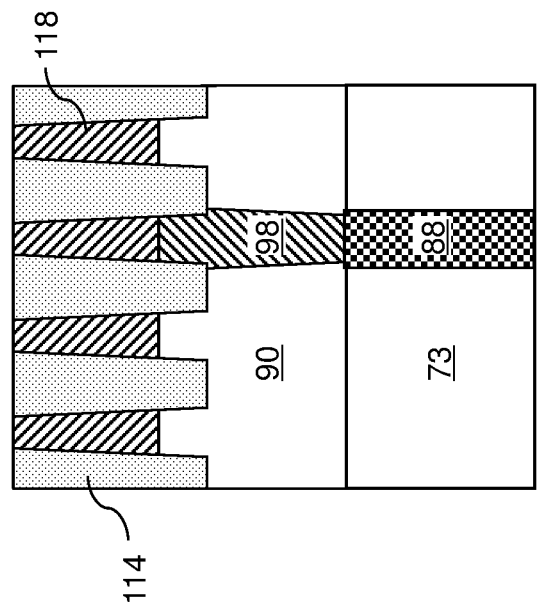
FIG. 22B is a vertical cross-sectional view of the second configuration of the exemplary structure according to the vertical plane B-B' of FIG. 22A.
Figure 22A:
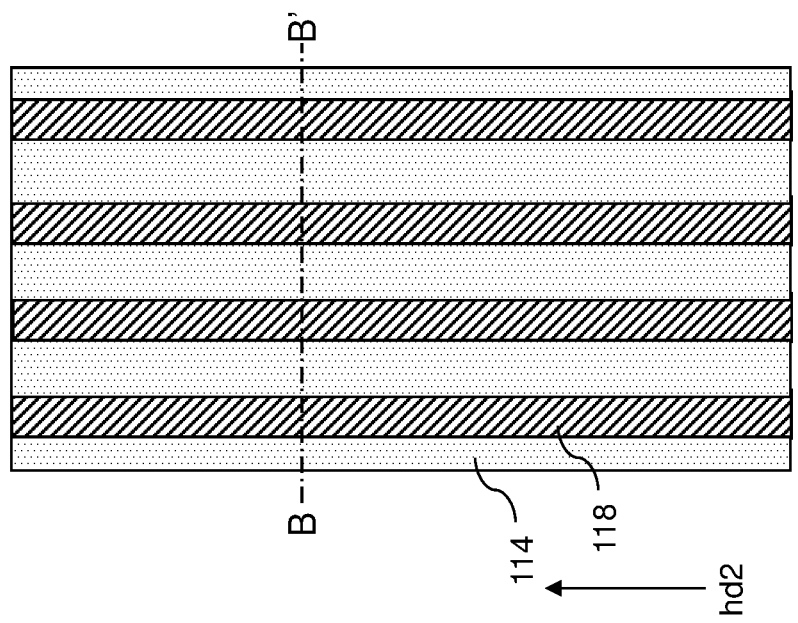
FIG. 22A is a top-down view of a region of a second configuration of the exemplary structure after formation of a bit-line-level sacrificial fill layer according to an embodiment of the present disclosure.

Referring to FIGS. 22A and 22B, a region of a second configuration of the exemplary structure is illustrated, which can be derived from the first configuration of the exemplary structure illustrated in FIGS. 15A and 15B by forming a bit-line-level sacrificial fill layer 114 directly on the physically exposed surfaces of the connection-level dielectric layer 90 and the bit lines 118. In other words, the processing steps of FIGS. 16A and 16B which form the dielectric liner 108 can be omitted, and the processing steps of FIGS. 17A and 17B can be performed. In this embodiment, the a bit-line-level sacrificial fill layer 114 may comprise a carbon-based material described above. If a chemical mechanical planarization process that planarizes the sacrificial fill material of the bit-line-level sacrificial fill layer 114 is required, then the top surfaces of the bit lines 118 can be employed as stopping surfaces for the chemical mechanical planarization process. The top surface of the bit-line-level sacrificial fill layer 114 can be formed within a same horizontal plane as the top surfaces of the bit lines 118.

Referring to FIGS. 23A and 23B, the processing steps of FIGS. 18A and 18B and FIGS. 19A and 19B can be performed to form a via-level dielectric material layer 122 and conductive via structures 128 contacting a respective one of the bit lines 118. An optional hard mask, such as an amorphous silicon hard mask, may be formed over the via-level dielectric material layer 122 during the patterning of this layer. The hard mask is subsequently removed.

Figure 24B:
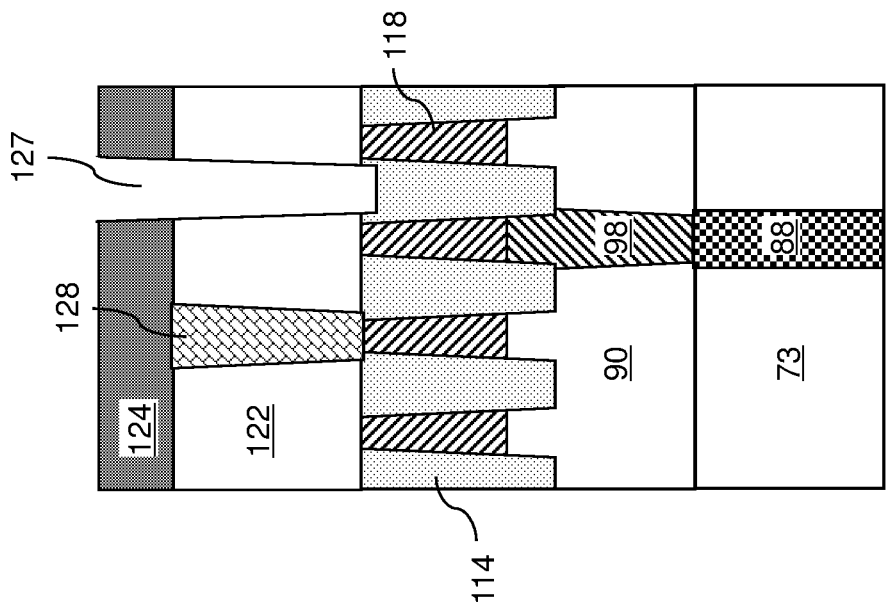
FIG. 24B is a vertical cross-sectional view of the second configuration of the exemplary structure according to the vertical plane B-B' of FIG. 24A.
Figure 24A:
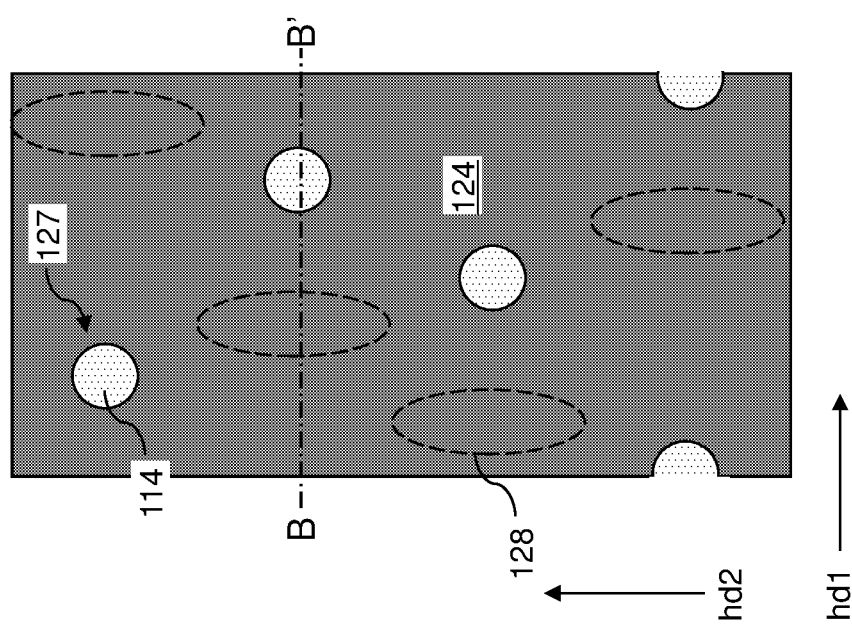
FIG. 24A is a top-down view of a region of the second configuration of the exemplary structure after formation of an upper-level material layer and openings through the upper-level material layer according to an embodiment of the present disclosure.

Referring to FIGS. 24A and 24B, the processing steps of FIGS. 20A and 20B can be performed to optionally form an upper-level material layer 124. The upper-level material layer 124 may include a dielectric material such as silicon oxide, silicon oxynitride, silicon nitride, a nitrogen-doped organosilicate glass, or a dielectric metal oxide. Alternatively, the upper-level material layer 124 may include a sacrificial material (such as amorphous silicon, polysilicon, a silicon-germanium alloy, germanium, amorphous carbon, diamond-like carbon (DLC), etc.) that can be subsequently removed, for example, by CMP, etching or ashing. The thickness of the upper-level material layer 124 may be in a range from 20 nm to 1,000 nm, such as from 100 nm to 500 nm, although lesser or greater thicknesses may also be employed.

A photoresist layer (not shown) can be applied over the upper-level material layer 124, and can be lithographically patterned to form openings in areas that overlie the sacrificial fill material of the bit-line-level sacrificial fill layer 114. An anisotropic etch process can be performed to transfer the pattern of the openings in the photoresist layer through the upper-level material layer 124 and the via-level dielectric material layer 122. Conduit openings 127 vertically extend through the upper-level material layer 124 and the via-level dielectric material layer 122 down to a top surface of a respective portion of the bit-line-level sacrificial fill layer 114. The photoresist layer may be subsequently removed, for example, by ashing.

Referring to FIGS. 25A and 25B, in case the upper-level material layer 124 includes a sacrificial material, then the upper-level material layer 124 may be removed selective to the via-level dielectric material layer 122. Subsequently, the sacrificial fill material of the bit-line-level sacrificial fill layer 114 can be removed selective to the materials of the dielectric liner 108, the via-level dielectric material layer 122, and the upper-level material layer 124 by performing an isotropic etch process through the conduit openings 127. The isotropic etch process of FIGS. 21A and 21B may be employed.

Generally, the bit-line-level sacrificial fill layer 114 can be removed by introducing an isotropic etchant or an anisotropic reactant (such as oxygen gas) that removes the sacrificial fill material through the conduit openings 127 through the via-level dielectric material layer 122. A multi-level cavity 217 is formed, which vertically extends from a first horizontal plane HP1B including top surfaces of the bit lines 118 to a second horizontal plane HP2B located below a horizontal plane including bottom surfaces of the bit lines 118 and laterally surrounds each of the bit lines 118 and laterally surrounds at least an upper portion of each of the connection via structures 98.

The multi-level cavity 217 vertically extends more than the thickness of the level of the bit lines 118, i.e., has a greater vertical extent than the vertical extent of the bit lines 118. Specifically, the multi-level cavity 217 vertically extends through the entire height range of the bit lines 118, and may vertically extends downward partly into an upper region of the level of the connection-level dielectric layer 90.

Figure 26B:
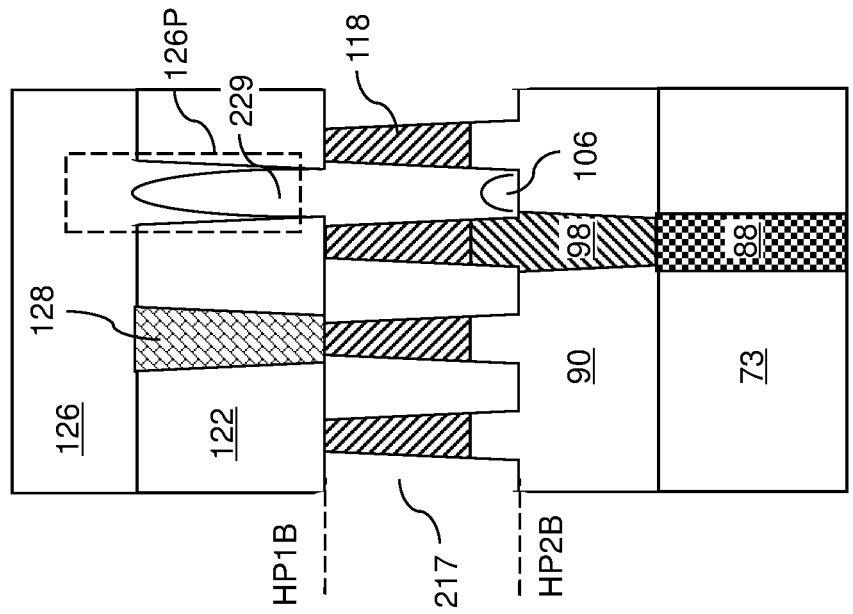
FIG. 26B is a vertical cross-sectional view of the second configuration of the exemplary structure according to the vertical plane B-B' of FIG. 26A.
Figure 26A:
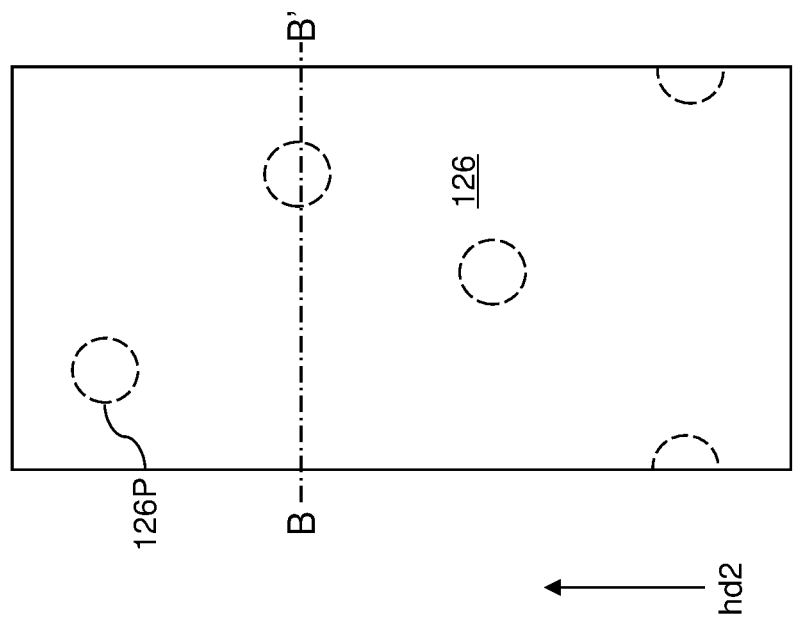
FIG. 26A is a top-down view of a region of the second configuration of the exemplary structure after formation of a capping-level dielectric layer according to an embodiment of the present disclosure.

Referring to FIGS. 26A and 26B, the capping-level material layer 126 can be formed over the via-level dielectric material layer 122 (and over the upper-level material layer 124 if present) by anisotropically depositing a dielectric or semiconductor material, as described above with respect to FIGS. 21A and 21B. The capping-level material layer 126 comprises downward-protruding portions 126P that are located on the sidewalls of the conduit openings 127 (i.e., extend into peripheral regions of the cavity-containing openings 127). As described above, a continuous air gap is formed in conduit opening 127 and the cavity 217. In FIG. 26B, the top end of the continuous air gap (e.g., the top end of the via-level cavity 229) does not extend above the bottom surface of capping-level material layer 126 (i.e., above the top surface of layer 122). However, in an alternative embodiment, the top end of the continuous air gap (e.g., the top end of the via-level cavity 229) may extend above the bottom surface of capping-level material layer 126 (i.e., above the top surface of layer 122) depending on the material of layer 126 and the shape of the air gap.

Figure 27B:
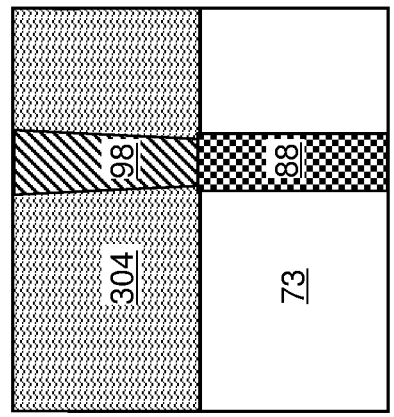
FIG. 27B is a vertical cross-sectional view of the third configuration of the exemplary structure after a planarization step.
Figure 27A:
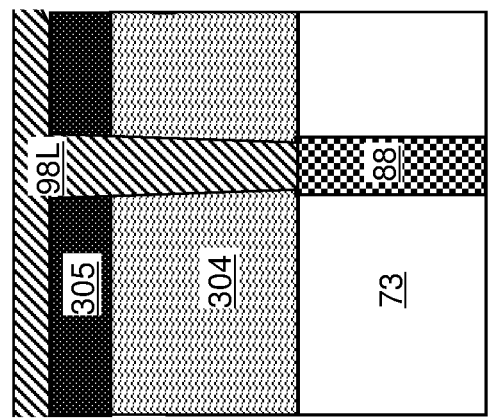
FIG. 27A is a vertical cross-sectional view of a region of a third configuration of the exemplary structure after formation of a sacrificial connection-level material layer and connection-level via structures according to an embodiment of the present disclosure.

Referring to FIG. 27A, a third configuration of the exemplary structure can be derived from the exemplary structure of FIGS. 13A-13C by depositing a sacrificial connection-level material layer 304 and an optional etch stop material layer 305, and by forming connection-level via structures 98 extending through the sacrificial connection-level material layer 304 directly on a respective one of the drain contact via structures 88. The sacrificial connection-level material layer 304 comprises a sacrificial material such as amorphous silicon, polysilicon, a silicon-germanium alloy, germanium, porous or non-porous organosilicate glass, amorphous carbon, diamond-like carbon, or a polymer material that can be removed selective to the material of the contact-level dielectric layer 73. In one embodiment, the sacrificial connection-level material layer 304 comprises amorphous carbon or diamond-like carbon. The optional etch stop material layer 305, if present, includes an etch stop material such as a semiconductor material (e.g., amorphous silicon). The thickness of the sacrificial connection-level material layer 304 can be in a range from 100 nm to 1,000 nm, such as from 200 nm to 500 nm, although lesser and greater thicknesses may also be employed. The thickness of the etch stop material layer 305 can be in a range from 10 nm to 100 nm, such as from 20 nm to 50 nm, although lesser and greater thicknesses may also be employed.

Connection via cavities can be formed through the optional etch stop material layer 305 and the sacrificial connection-level material layer 304 by depositing and lithographically patterning a photoresist layer over the optional etch stop material layer 305 and the sacrificial connection-level material layer 304, and transferring the pattern of openings in the photoresist layer through the optional etch stop material layer 305 and the sacrificial connection-level material layer 304 employing an anisotropic etch process. The photoresist layer can be subsequently removed, for example, by ashing. If the sacrificial connection-level material layer 304 comprises a carbon based material, then the photoresist layer is removed after forming the connection via cavities in the etch stop material layer 305 but before forming the connection via cavities in sacrificial connection-level material layer 304 to avoid removing both the photoresist and the carbon based layer 304 during the ashing step. After removal of the photoresist layer, the etching is continued using the etch stop material layer 305 as a mask to etch the connection via cavities in the sacrificial connection-level material layer 304. At least one electrically conductive material 98L can be deposited in the connection via cavities.

Referring to FIG. 27B, excess portions of the at least one electrically conductive material can be removed from above the horizontal plane including the top surface of the sacrificial connection-level material layer 304 by a planarization process, which may include a chemical mechanical planarization process and/or a recess etch process. The optional etch stop material layer 305 may also be removed during the planarization process. The at least one electrically conductive material may be recessed approximately down to the level of the top of the sacrificial connection-level material layer 304. Each remaining portion of the at least one electrically conductive material located within a respective one of the connection via cavities comprise connection-level via structures (98, 96, 9P). The connection-level via structures (98, 96, 9P) can comprise drain-side connection-level via structures 98 contacting a top surface of a respective one of the drain contact via structures 88, word-line-side connection-level via structures 96 (see FIGS. 14A-14D) contacting a top surface of a respective one of the word line contact via structures 86, source-side connection via structures 91 (see FIG. 14B) contacting the backside contact via structures 76, and peripheral-region connection via structures 9P (see FIGS. 14A-14D) contacting a top surface of a respective one of the peripheral device contact via structures 8P.

Generally, a combination of a connection-level material layer (such as the sacrificial connection-level material layer 304) and a two-dimensional array of connection via structures (such as the drain-side connection-level via structures 98) embedded in the connection-level material layer can be formed over the semiconductor device array. Each of the connection via structures within the two-dimensional array of connection via structures (such as the drain-side connection-level via structures 98) overlies, and is electrically connected to, a respective one of the doped semiconductor material regions (such as the drain regions 63). In one embodiment, the drain-side connection-level via structures 98 can be laterally elongated along a horizontal direction that is perpendicular to the lengthwise direction of the backside trenches 79. For example, the drain-side connection-level via structures 98 can be laterally elongated along the second horizontal direction hd2, which is the lengthwise direction of bit lines to be subsequently formed.

Figure 28B:
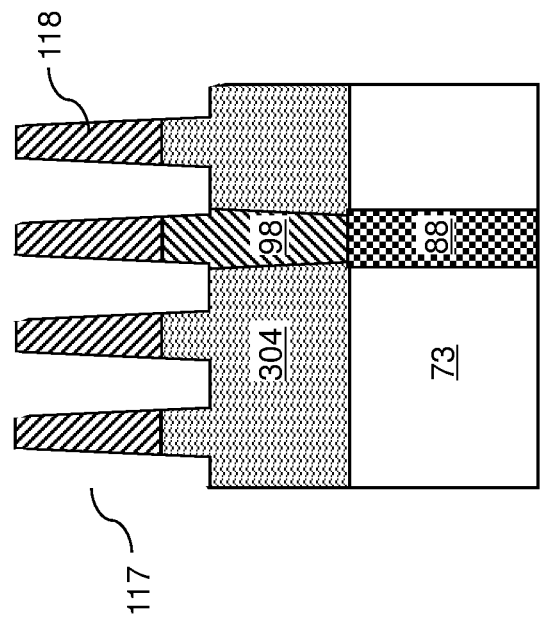
FIG. 28B is a vertical cross-sectional view of the third configuration of the exemplary structure along the vertical plane B-B' of FIG. 28A.
Figure 28A:
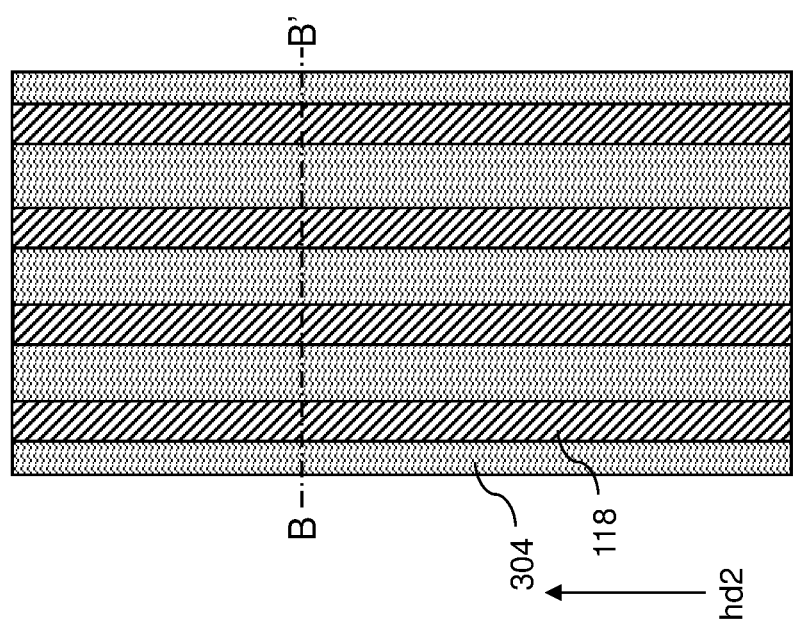
FIG. 28A is a top-down view of a region of the third configuration of the exemplary structure after formation of bit lines according to an embodiment of the present disclosure.

Referring to FIGS. 28A and 28B, the optional etch stop material layer 305, if present, may be removed, for example, employing a wet etch process that removes the material of the etch stop material layer 305 selective to the material of the sacrificial connection-level material layer 304. For example, a wet etch process employing hot trimethyl-2 hydroxyethyl ammonium hydroxide ("hot TMY"), tetramethyl ammonium hydroxide (TMAH), potassium hydroxide (KOH), or a combination of dilute hydrofluoric acid and hydrogen peroxide (in case the semiconductor material comprises germanium) may be performed. Subsequently, the processing steps of FIGS. 15A-15D can be performed to form a one-dimensional periodic array of bit lines 118 that laterally extend along the second horizontal direction hd2.

Referring to FIGS. 29A and 29B, the processing steps of FIGS. 17A and 17B can be performed to form a bit-line-level sacrificial fill layer 114. The bit-line-level sacrificial fill layer 114 includes a sacrificial fill material, which may be any material that can be employed for the material of the sacrificial connection-level material layer 304. The sacrificial fill material of the bit-line-level sacrificial fill layer 114 may be the same as, or may be different from, the sacrificial material of the sacrificial connection-level material layer 304. The top surface of the bit-line-level sacrificial fill layer 114 may be formed in the horizontal plane including the top surfaces of the bit lines 118.

Referring to FIGS. 30A and 30B, the processing steps of FIGS. 18A and 18B and FIGS. 19A and 19B can be performed to form a via-level dielectric material layer 122 and conductive via structures 128 contacting a respective one of the bit lines 118. An optional sacrificial hard mask, such as an amorphous silicon hard mask may be used during these steps and then removed afterwards.

Figure 31B:
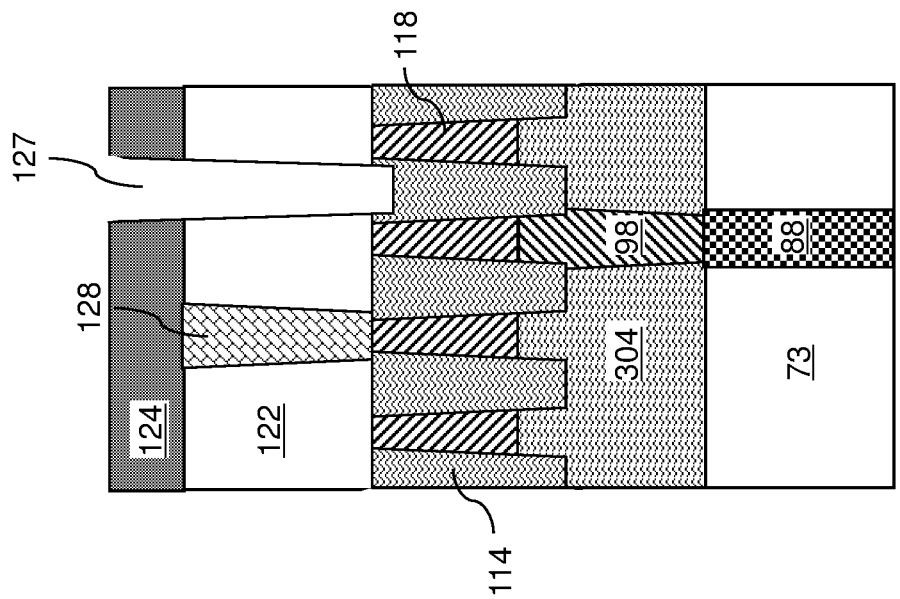
FIG. 31B is a vertical cross-sectional view of the third configuration of the exemplary structure according to the vertical plane B-B' of FIG. 31A.
Figure 31A:
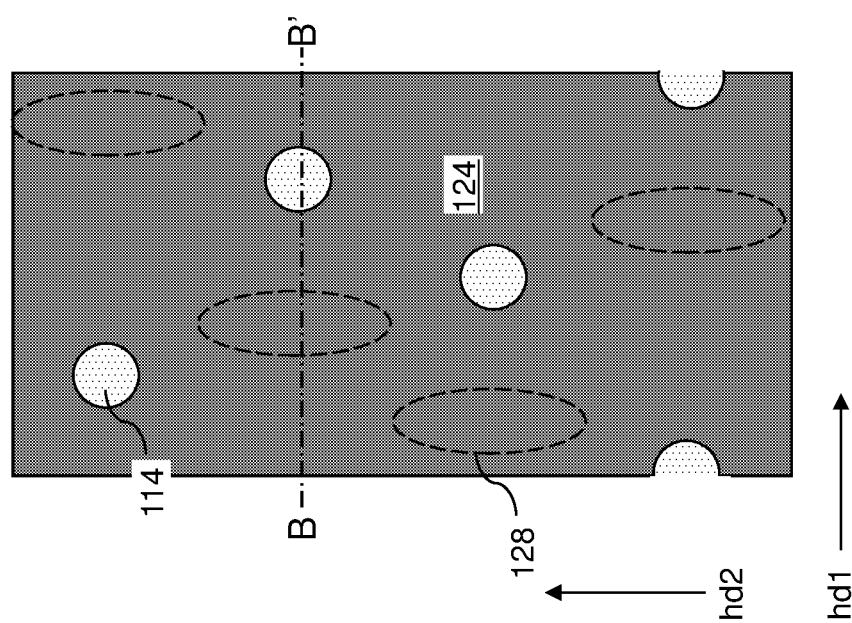
FIG. 31A is a top-down view of a region of the third configuration of the exemplary structure after formation of an optional sacrificial etch stop layer and openings through the optional sacrificial etch stop layer and the via-level dielectric material layer according to an embodiment of the present disclosure.

Referring to FIGS. 31A and 31B, an upper-level material layer 124 may be formed over the via-level dielectric material layer 128. The upper-level material layer 124 may include a sacrificial material (such as amorphous silicon, polysilicon, a silicon-germanium alloy, germanium, amorphous carbon, diamond-like carbon (DLC), etc.) that can be subsequently removed, for example, by CMP, etching or ashing. Alternatively, the upper-level material layer 124 may include a dielectric material such as silicon oxide, silicon oxynitride, silicon nitride, a nitrogen-doped organosilicate glass, or a dielectric metal oxide, and is not subsequently removed. The thickness of the upper-level material layer 124 may be in a range from 20 nm to 1,000 nm, such as from 50 nm to 200 nm, although lesser or greater thicknesses may also be employed. Conduit openings 127 may be formed to vertically extend through the upper-level material layer 224 and the via-level dielectric material layer 122 down to a top surface of a respective portion of the bit-line-level sacrificial fill layer 114, as described above.

Figure 32B:
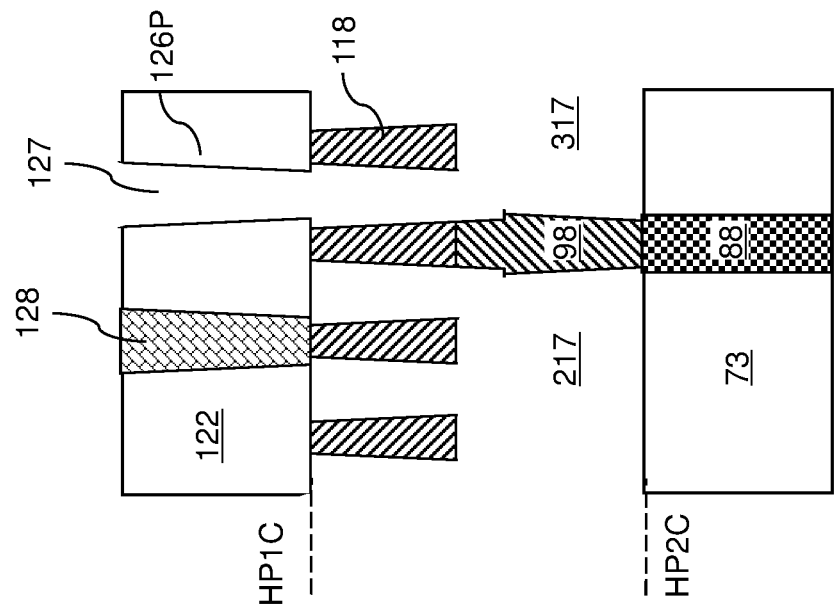
FIG. 32B is a vertical cross-sectional view of the third configuration of the exemplary structure according to the vertical plane B-B' of FIG. 32A.
Figure 32A:
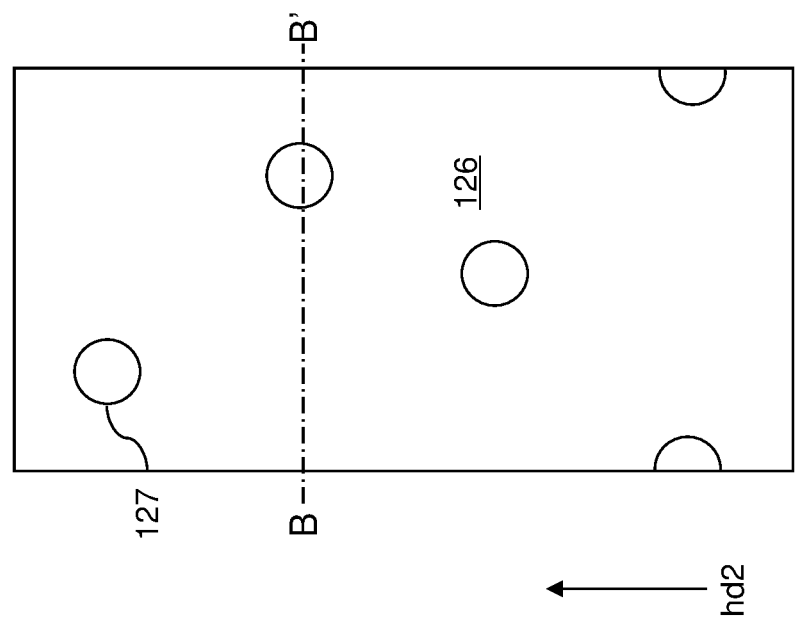
FIG. 32A is a top-down view of a region of the third configuration of the exemplary structure after formation of a multi-level cavity according to an embodiment of the present disclosure.

Referring to FIGS. 32A and 32B, in case the upper-level material layer 124 includes a sacrificial material, the upper-level material layer 124 may be removed selective to the via-level dielectric material layer 122. Subsequently, the sacrificial fill material of the bit-line-level sacrificial fill layer 114 and the sacrificial material of the sacrificial connection-level material layer 304 can be removed selective to the materials of the contact-level dielectric layer 73, the via-level dielectric material layer 122, the upper-level material layer 124, and the various metal interconnect structures (88, 98, 118, 128) by performing an isotropic etch process through the conduit openings 127.

Generally, the bit-line-level sacrificial fill layer 114 and the sacrificial connection-level material layer 304 can be removed by introducing at least one isotropic etchant and/or at least one anisotropic reactant (such as oxygen gas) that removes the sacrificial fill material of the bit-line-level sacrificial fill layer 114 and the sacrificial material of the sacrificial connection-level material layer 304 through the conduit openings 127 in the via-level dielectric material layer 122. A multi-level cavity 217 is formed, which vertically extends from a first horizontal plane HP1C including top surfaces of the bit lines 118 to a second horizontal plane HP2C located below a horizontal plane including bottom surfaces of the bit lines 118 and laterally surrounds each of the bit lines 118 and laterally surrounds at least an upper portion of each of the connection via structures 98, such as the entirety of each of the connection via structures 98.

Generally, the sacrificial connection-level material layer 304 may be removed concurrently with, or after, removal of the bit-line-level sacrificial fill layer 114. The multi-level cavity 217 has a bottom surface within a horizontal plane including bottom surfaces of the connection via structures 98. The multi-level cavity 217 vertically extends more than the thickness of the level of the bit lines 118, i.e., has a greater vertical extent than the vertical extent of the bit lines 118. Specifically, the multi-level cavity 217 vertically extends through the entire height range of the bit lines 118 and vertically extends through the entirety of the level of the connection-level dielectric layer 90.

Figure 33B:
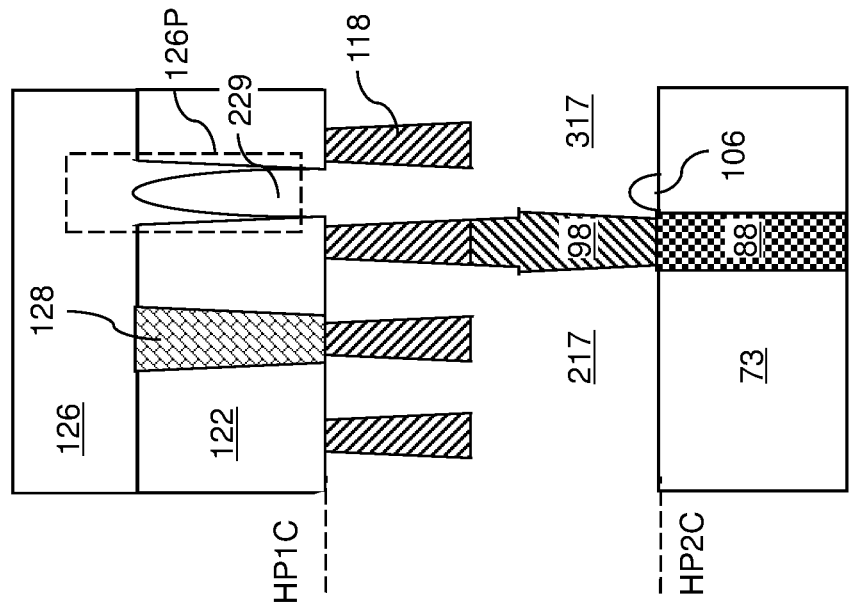
FIG. 33B is a vertical cross-sectional view of the third configuration of the exemplary structure according to the vertical plane B-B' of FIG. 33A.
Figure 33A:
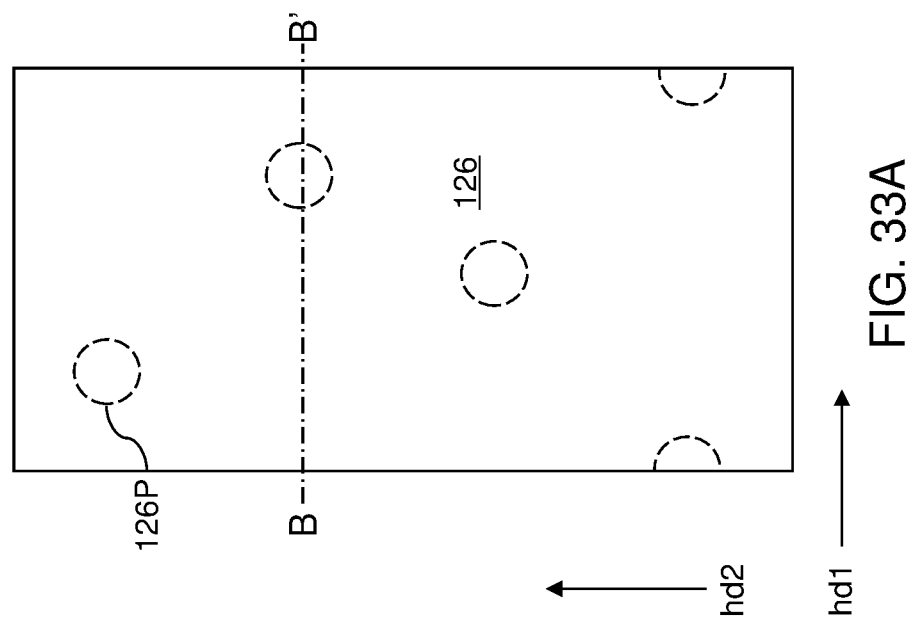
FIG. 33A is a top-down view of a region of the third configuration of the exemplary structure after formation of a capping-level dielectric layer according to an embodiment of the present disclosure.

Referring to FIGS. 33A and 33B, a capping-level material layer 126 can be formed over the via-level dielectric material layer 122 (and over the upper-level material layer 124 if present) as described above. The capping-level material layer 126 comprises downward-protruding portions 126P that extend into peripheral regions of the cavity-containing openings. In one embodiment, each volume of the cavity-containing openings that is not filled with a respective downward-protruding portion 126P of the capping-level material layer 126 comprises a respective via-level cavity 229 that is adjoined to a top portion of the multi-level cavity (i.e., air gap) 217 and is free of any solid phase material. In FIG. 33B, the top end of the continuous air gap (e.g., the top end of the via-level cavity 229) does not extend above the bottom surface of capping-level material layer 126 (i.e., above the top surface of layer 122). However, in an alternative embodiment, the top end of the continuous air gap (e.g., the top end of the via-level cavity 229) may extend above the bottom surface of capping-level material layer 126 (i.e., above the top surface of layer 122) depending on the material of layer 126 and the shape of the air gap.

By forming the bit-line-level sacrificial fill layer 114 between the bit lines 118, the coupling between connection via cavities 129 and the air gaps 217 can be avoided. In other words, without the bit-line-level sacrificial fill layer 114, if a connection via cavity 129 width is larger than the width of the underlying bit line 118 and/or if the connection via cavity 129 is partially misaligned with the underlying bit line 118, then the connection via cavity 129 exposes the underlying air gap 217. Then in the following step (e.g., shown in FIGS. 19A and 19B), the conductive via structure 128 would fill both the connection via cavity 129 and the underlying air gap 217. In this case, the conductive via structure 128 filling the air gap 217 would short adjacent bit lines 118 and/or the underlying connection via structures 98. However, the bit-line-level sacrificial fill layer 114 prevents the such short circuits by preventing the conductive via structure 128 from filling the air gap 217. Thus, the device reliability and functionality is improved.

Referring to all drawings and according to various embodiments of the present disclosure, a semiconductor structure includes a semiconductor device 400, bit lines 118 electrically connected to the semiconductor device 400, air gaps 217 located between the bit lines 118, a capping-level material layer 126, a via-level dielectric material layer 122 located between the bit lines 118 and the capping-level material layer 126, and conductive via structures 128 extending through the via-level dielectric material layer 122 and contacting a top surface of a respective one of the bit lines 118. The capping-level material layer 126 contains cavity-containing openings 127 exposing the air gaps 217. The capping-level material layer 126 contains protruding portions 126P that extend into peripheral regions of the cavity-containing openings 127.

In one embodiment, the capping-level material layer 126 comprises a dielectric material. In another embodiment, the capping-level material layer 126 comprises a semiconductor material.

In one embodiment, the semiconductor device 400 includes doped semiconductor material regions (such as drain regions) 63 and located over a substrate (9, 10), the connection via structures 98 overlie and are electrically connected to a respective one of the doped semiconductor material regions 63, each of the bit lines 118 contacts top surfaces of a respective subset of the connection via structures 98, the air gaps 217 comprises multi-level cavities vertically extending from a first horizontal plane (HP1A, HP1B, or HP1C) including or located above top surfaces of the bit lines 118 to a second horizontal plane (HP2A, HP2B, or HP2C) located below a horizontal plane including bottom surfaces of the bit lines 118 and laterally surrounding each of the bit lines 118 and laterally surrounding at least an upper portion of each of the connection via structures 98, the via-level dielectric material layer 122 overlies the bit lines 118, the capping-level material layer 126 overlies the via-level dielectric material layer 122, and the protruding portions 126P comprise downward-protruding portions 126P that extend into peripheral regions of the cavity-containing openings 127.

In one embodiment, each volume of the cavity-containing openings 127 that is not filled with a respective downward-protruding portion 126P of the capping-level material layer 126 comprises a respective via-level cavity 229 that is adjoined to a top portion of the multi-level cavity 217. In one embodiment, each via-level cavity 229 has a variable horizontal cross-sectional area that increases with a vertical distance (as measured downward) from a horizontal plane including a bottom surface of the capping-level material layer 126. In one embodiment, a periphery of a horizontal cross-sectional shape of each via-level cavity 229 coincides with a periphery of a respective one of the cavity-containing openings within a horizontal plane including a bottom surface of the via-level dielectric material layer 122.

In one embodiment, the capping-level material layer 126 comprises a horizontally-extending portion that overlies a top surface of the via-level dielectric material layer 122 and has a same material composition as the downward-protruding portions 126P of the capping-level material layer 126.

In one embodiment, the semiconductor structure also comprises discrete dielectric material portions 106 having a same material composition as the capping-level material layer 126, located below the cavity-containing openings 127, and having a variable thickness that decreases radially from a geometrical center thereof.

In one embodiment, the semiconductor structure comprises a connection-level dielectric layer 90 laterally surrounding a lower portion of each of the connection via structures 98, wherein the connection-level dielectric layer 90 comprises topmost surfaces contacting a respective one of the bit lines 118 and recessed horizontal surfaces located below the horizontal plane including the bottom surfaces of the bit lines 118.

In one embodiment, the semiconductor structure comprises a dielectric liner 108 continuously extending over and contacting top surfaces and sidewalls of the bit lines 118 and sidewalls and recessed horizontal surfaces of the connection-level dielectric layer 90, wherein top surfaces of horizontally-extending portions of the dielectric liner 108 that overlie the recessed horizontal surfaces of the of the connection-level dielectric layer are located within the second horizontal plane HP2A.

In one embodiment, the bit lines 118 are laterally spaced apart along a first horizontal direction hd1 and laterally extend along a second horizontal direction hd2 that is perpendicular to the first horizontal direction hd1, the recessed horizontal surfaces of the connection-level dielectric layer 90 are located below the horizontal plane including the bottom surfaces of the bit lines 118, and sidewalls of the connection-level dielectric layer 90 that laterally extend along the second horizontal direction hd2 are physically exposed to the multi-level cavities 217.

In one embodiment, the semiconductor structure also comprises a contact-level dielectric layer 73 embedding contact via structures (such as drain contact via structures) 88. Each of the contact via structures (such as the drain contact via structures) 88 contacts a top surface of a respective one of the doped semiconductor material regions (such as the drain regions) 63 and contacts a bottom surface of a respective one of the connection via structures 98. Top surfaces of the contact via structures are located within a same horizontal plane as a top surface of the contact-level dielectric layer 73. In one embodiment, the top surface of the contact-level dielectric layer 73 is located within the second horizontal plane HP2C and is physically exposed to the multi-level cavity 217.

In one embodiment, the bit lines 118 are laterally spaced apart along a first horizontal direction hd1 and laterally extend along a second horizontal direction hd2 that is perpendicular to the first horizontal direction hd1, the bit lines 118 have a trapezoidal vertical cross-sectional shape within vertical planes that are perpendicular to the second horizontal direction hd2. and the trapezoidal vertical cross-sectional shape has a lesser width at top than at bottom.

In one embodiment shown in FIG. 15D, at least one of the connection via structures 98 has a vertical cross-sectional shape within a vertical plane that is perpendicular to the second horizontal direction hd2 in which an upper portion 98U of the vertical cross-sectional shape has an upright trapezoidal profile in which a width of the upper portion 98U of the vertical cross-sectional shape decreases with a vertical distance from the substrate (9, 10), and a lower portion 98L of the vertical cross-sectional shape has a reverse trapezoidal profile in which a width of the lower portion 98L of the vertical cross-sectional shape increases with the vertical distance from the substrate (9, 10).

In one embodiment, the semiconductor device 400 comprises a three-dimensional memory array that includes: an alternating stack of insulating layers 32 and electrically conductive layers 46 located over a substrate (9, 10); a two-dimensional array of memory openings 49 vertically extending through the alternating stack (32, 46); and a two-dimensional array of memory opening fill structures 58 located within the two-dimensional array of memory openings 49 and including a respective vertical semiconductor channel 60 and a respective vertical stack of memory elements (comprising portions of memory material layers 54 located at levels of the electrically conductive layers 46) The doped semiconductor material regions (such as the drain regions) 63 are adjoined to a top end of a respective one of the vertical semiconductor channels 60.

The exemplary structures can include a three-dimensional memory device. In one embodiment, the three-dimensional memory device comprises a three-dimensional NAND memory device. The electrically conductive layers 46 can comprise, or can be electrically connected to, a respective word line of the three-dimensional NAND memory device. The substrate (9, 10) can comprise a silicon substrate. The vertical NAND memory device can comprise an array of three-dimensional NAND strings over the silicon substrate. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of three-dimensional NAND strings can comprise: a plurality of semiconductor channels (59, 11, 60); and a plurality of charge storage elements (comprising portions of the memory films 50, i.e., portions of the memory material layers 54). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A semiconductor structure, comprising:
   a semiconductor device;

bit lines electrically connected to the semiconductor device;
air gaps located between the bit lines;
a capping-level material layer;
a via-level dielectric material layer located between the bit lines and the capping-level material layer; and
conductive via structures extending through the via-level dielectric material layer and contacting a top surface of a respective one of the bit lines;
wherein:
the capping-level material layer comprises cavity-containing openings exposing the air gaps; and
the capping-level material layer comprises protruding portions that extend into peripheral regions of the cavity-containing openings.

2. The semiconductor structure of claim 1, wherein the capping-level material layer comprises a dielectric material.

3. The semiconductor structure of claim 1, wherein the capping-level material layer comprises a semiconductor material.

4. The semiconductor structure of claim 1, wherein:
the semiconductor device comprises doped semiconductor material regions located over a substrate;
connection via structures overlie and are electrically connected to a respective one of the doped semiconductor material regions;
each of the bit lines contacts top surfaces of a respective subset of the connection via structures;
the air gaps comprise multi-level cavities vertically extending from a first horizontal plane including or located above top surfaces of the bit lines to a second horizontal plane located below a horizontal plane including bottom surfaces of the bit lines and laterally surrounding each of the bit lines and laterally surrounding at least an upper portion of each of the connection via structures;
the via-level dielectric material layer overlies the bit lines;
the capping-level material layer overlies the via-level dielectric material layer;
the protruding portions comprise downward-protruding portions that extend into peripheral regions of the cavity-containing openings.

5. The semiconductor structure of claim 4, wherein:
each volume of the cavity-containing openings that is not filled with a respective downward-protruding portion of the capping-level material layer comprises a respective via-level cavity that is adjoined to a top portion of the multi-level cavity;
each via-level cavity has a variable horizontal cross-sectional area that increases with a vertical distance from a horizontal plane including a bottom surface of the capping-level material layer; and
a periphery of a horizontal cross-sectional shape of each via-level cavity coincides with a periphery of a respective one of the cavity-containing openings within a horizontal plane including a bottom surface of the via-level dielectric material layer.

6. The semiconductor structure of claim 4, wherein the capping-level material layer comprises a horizontally-extending portion that overlies a top surface of the via-level dielectric material layer and has a same material composition as the downward-protruding portions of the capping-level material layer.

7. The semiconductor structure of claim 4, further comprising discrete dielectric material portions having a same material composition as the capping-level material layer, located below the cavity-containing openings, and having a variable thickness that decreases radially from a geometrical center thereof.

8. The semiconductor structure of claim 4, further comprising a connection-level dielectric layer laterally surrounding a lower portion of each of the connection via structures, wherein the connection-level dielectric layer comprises topmost surfaces contacting a respective one of the bit lines and recessed horizontal surfaces located below the horizontal plane including the bottom surfaces of the bit lines.

9. The semiconductor structure of claim 8, further comprising a dielectric liner continuously extending over and contacting top surfaces and sidewalls of the bit lines and sidewalls and recessed horizontal surfaces of the connection-level dielectric layer, wherein top surfaces of horizontally-extending portions of the dielectric liner that overlie the recessed horizontal surfaces of the of the connection-level dielectric layer are located within the second horizontal plane.

10. The semiconductor structure of claim 8, wherein:
the bit lines are laterally spaced apart along a first horizontal direction and laterally extend along a second horizontal direction that is perpendicular to the first horizontal direction;
the recessed horizontal surfaces of the connection-level dielectric layer are located below the horizontal plane including the bottom surfaces of the bit lines; and
sidewalls of the connection-level dielectric layer that laterally extend along the second horizontal direction are physically exposed to the multi-level cavities.

11. The semiconductor structure of claim 4, further comprising a contact-level dielectric layer embedding contact via structures, wherein:
each of the contact via structures contacts a top surface of a respective one of the doped semiconductor material regions and contacts a bottom surface of a respective one of the connection via structures;
top surfaces of the contact via structures are located within a same horizontal plane as a top surface of the contact-level dielectric layer; and
the top surface of the contact-level dielectric layer is located within the second horizontal plane and is physically exposed to the multi-level cavity.

12. The semiconductor structure of claim 1, wherein:
the bit lines are laterally spaced apart along a first horizontal direction and laterally extend along a second horizontal direction that is perpendicular to the first horizontal direction;
the bit lines have a trapezoidal vertical cross-sectional shape within vertical planes that are perpendicular to the second horizontal direction; and
the trapezoidal vertical cross-sectional shape has a lesser width at top than at bottom.

13. The semiconductor structure of claim 12, wherein at least one of the connection via structures has a vertical cross-sectional shape within a vertical plane that is perpendicular to the second horizontal direction in which:
an upper portion of the vertical cross-sectional shape has an upright trapezoidal profile in which a width of the upper portion of the vertical cross-sectional shape decreases with a vertical distance from a substrate; and
a lower portion of the vertical cross-sectional shape has a reverse trapezoidal profile in which a width of the lower portion of the vertical cross-sectional shape increases with the vertical distance from the substrate.

14. The semiconductor structure of claim 1, wherein the semiconductor device comprises a three-dimensional memory array that includes:
- an alternating stack of insulating layers and electrically conductive layers located over a substrate;
- a two-dimensional array of memory openings vertically extending through the alternating stack; and
- a two-dimensional array of memory opening fill structures located within the two-dimensional array of memory openings and including a respective vertical semiconductor channel and a respective vertical stack of memory elements.

15. A method of forming a semiconductor structure, comprising:
- forming a semiconductor device over substrate;
- forming bit lines over the semiconductor device;
- forming a bit-line-level sacrificial fill layer between the bit lines;
- forming a via-level dielectric material layer over the bit lines and the bit-line-level sacrificial fill layer;
- forming conductive via structures through the via-level dielectric material layer directly on a top surface of a respective one of the bit lines;
- forming openings through the via-level dielectric material layer such that surfaces of the bit-line-level sacrificial fill layer are physically exposed underneath the openings; and
- removing the bit-line-level sacrificial fill layer by introducing an etchant through the openings that removes the sacrificial fill material to form air gaps between the bit lines.

16. The method of claim 15, further comprising forming a dielectric or semiconductor capping-level material layer over the via-level dielectric material layer by anisotropically depositing a dielectric material, wherein the capping-level material layer comprises downward-protruding portions that extend into peripheral regions of the cavity-containing openings.

17. The method of claim 16, wherein each volume of the cavity-containing openings that is not filled with a respective downward-protruding portion of the capping-level material layer comprises a respective via-level cavity that is adjoined to a top portion of one of the respective air gaps.

18. The method of claim 15, further comprising:
- forming a connection-level material layer over the semiconductor device; and
- forming connection via structures extending through the connection-level material layer, wherein each of the connection via structures overlies and is electrically connected to the semiconductor device.

19. The method of claim 18, wherein:
- the semiconductor device comprises a three-dimensional memory array;
- the bit lines are formed over the connection-level material layer by depositing and anisotropically etching a metallic material;
- portions of the connection-level material layer are etched underneath spaces between neighboring pairs of the bit lines;
- the connection-level material layer comprises a dielectric material;
- the etchant etches the sacrificial fill material selective to the dielectric material of the connection-level material layer; and
- the air gaps are bounded by a subset of surfaces of the connection-level material layer.

20. The method of claim 18, further comprising removing the connection-level material layer concurrently with or after removal of the bit-line-level sacrificial fill layer.

* * * * *